United States Patent
Chen et al.

(10) Patent No.: US 12,513,937 B2
(45) Date of Patent: Dec. 30, 2025

(54) SEMICONDUCTOR DEVICES AND METHODS OF FABRICATION THEREOF

(71) Applicant: TAIWAN SEMICONDUCTOR MANUFACTURING COMPANY, LTD., Hsinchu (TW)

(72) Inventors: Shih-Cheng Chen, New Taipei (TW); Zhi-Chang Lin, Hsinchu County (TW); Jung-Hung Chang, Changhua County (TW); Lo-Heng Chang, Hsinchu (TW); Chien-Ning Yao, Hsinchu (TW); Kuo-Cheng Chiang, Hsinchu County (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 696 days.

(21) Appl. No.: 17/871,928

(22) Filed: Jul. 23, 2022

(65) Prior Publication Data
US 2022/0359744 A1 Nov. 10, 2022

Related U.S. Application Data

(62) Division of application No. 17/025,903, filed on Sep. 18, 2020, now Pat. No. 11,469,326.

(51) Int. Cl.
*H01L 29/78* (2006.01)
*H10D 30/01* (2025.01)
*H10D 30/62* (2025.01)
*H10D 84/01* (2025.01)
*H10D 84/03* (2025.01)

(52) U.S. Cl.
CPC ......... *H10D 30/62* (2025.01); *H10D 30/0243* (2025.01); *H10D 30/6219* (2025.01); *H10D 84/0158* (2025.01); *H10D 84/038* (2025.01)

(58) Field of Classification Search
CPC .............. H10D 30/62; H10D 30/0243; H10D 30/6219; H10D 84/0158; H10D 84/038; H10D 30/6757; H10D 30/6735; H10D 62/116; H10D 62/124; H10D 62/151; H10D 84/013; H10D 84/0151; H10D 84/834; H10D 84/83
See application file for complete search history.

(56) References Cited

U.S. PATENT DOCUMENTS

| 8,129,777 B2 | 3/2012 | Kim et al. |
| 9,209,247 B2 | 12/2015 | Colinge et al. |
| 9,224,866 B2 | 12/2015 | Basu et al. |

(Continued)

*Primary Examiner* — Cuong B Nguyen
(74) *Attorney, Agent, or Firm* — NZ Carr Law Office PLLC

(57) ABSTRACT

Embodiments of the present disclosure relate to an un-doped or low-doped epitaxial layer formed below the source/drain features. The un-doped or low-doped epitaxial layer protects the source/drain features from damage during replacement gate processes, and also prevent leakage currents in the mesa device. A semiconductor device is disclosed. The semiconductor device includes an epitaxial feature having a dopant of a first concentration, and a source/drain feature in contact with the epitaxial feature. The source/drain feature comprises the dopant of a second concentration, and the second concentration is higher than the first concentration.

20 Claims, 63 Drawing Sheets

(56) References Cited

U.S. PATENT DOCUMENTS

| | | |
|---|---|---|
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,008,583 B1 | 6/2018 | Rodder et al. |
| 10,121,870 B1 | 11/2018 | Chiang et al. |
| 2013/0277752 A1 | 10/2013 | Glass |
| 2015/0372143 A1 | 12/2015 | Bae |
| 2017/0162694 A1 | 6/2017 | Basker |
| 2017/0221893 A1 | 8/2017 | Tak |
| 2018/0130890 A1 | 5/2018 | Lee |
| 2018/0294331 A1* | 10/2018 | Cho ............ H10D 62/102 |
| 2019/0221640 A1 | 7/2019 | Reznicek |
| 2019/0355811 A1 | 11/2019 | Mehandru |
| 2020/0044087 A1 | 2/2020 | Guha |
| 2020/0075727 A1 | 3/2020 | Basu |
| 2020/0091287 A1 | 3/2020 | Glass |
| 2020/0168742 A1 | 5/2020 | Wang |
| 2020/0303521 A1* | 9/2020 | Son ............ H10D 62/121 |
| 2020/0365687 A1 | 11/2020 | Kie |
| 2020/0381546 A1 | 12/2020 | Cho |
| 2020/0381547 A1 | 12/2020 | Song |
| 2020/0395446 A1 | 12/2020 | Yi et al. |
| 2020/0395482 A1 | 12/2020 | Song |
| 2021/0098625 A1 | 4/2021 | Tsai |
| 2021/0376101 A1 | 12/2021 | Wang |

* cited by examiner

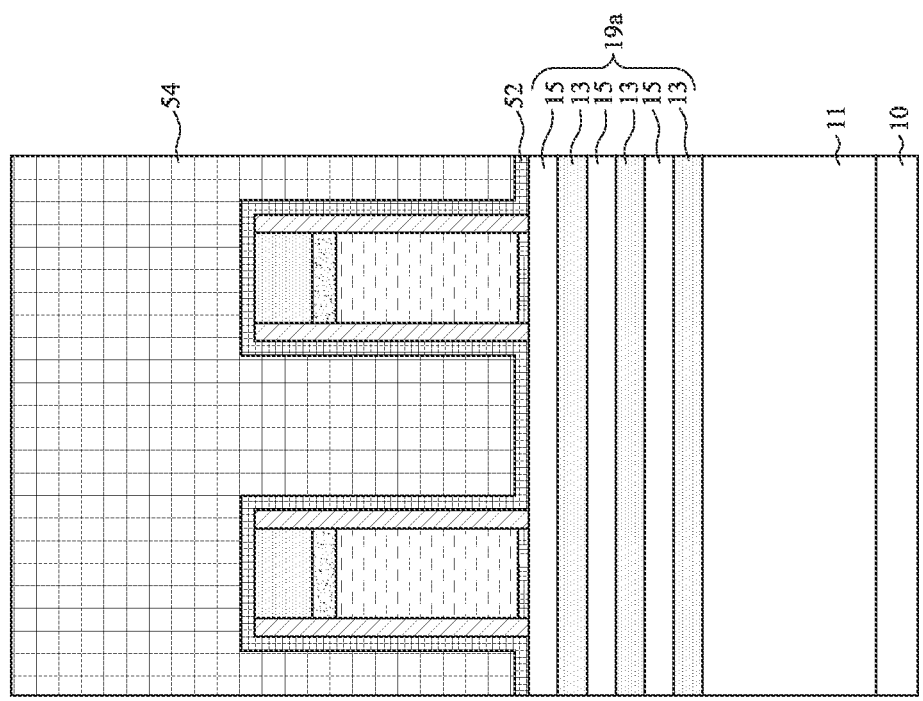
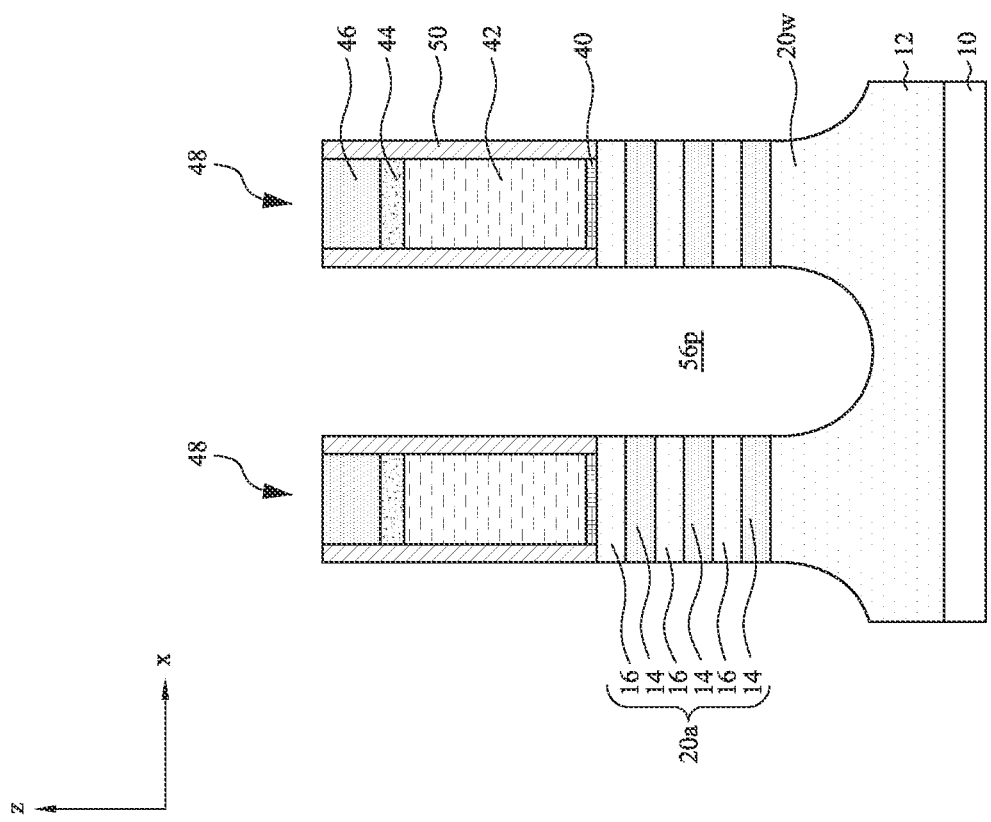
Fig. 12B
Fig. 12A

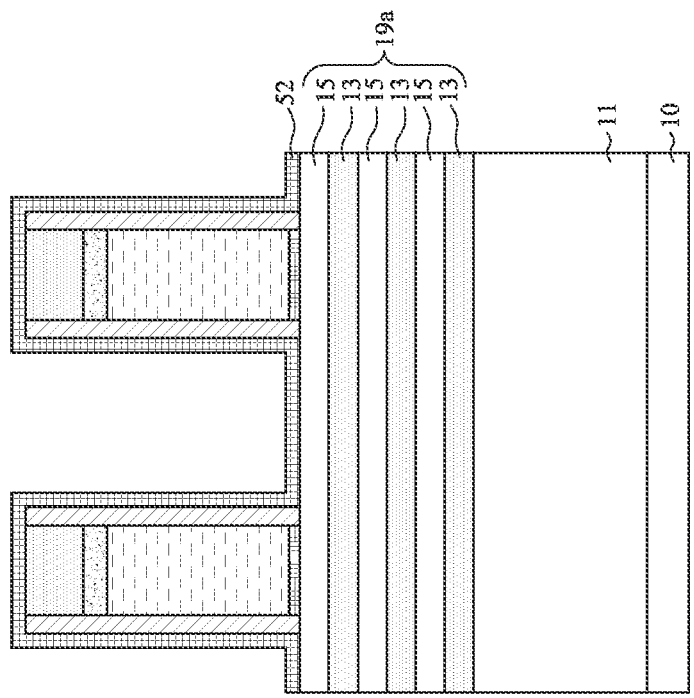
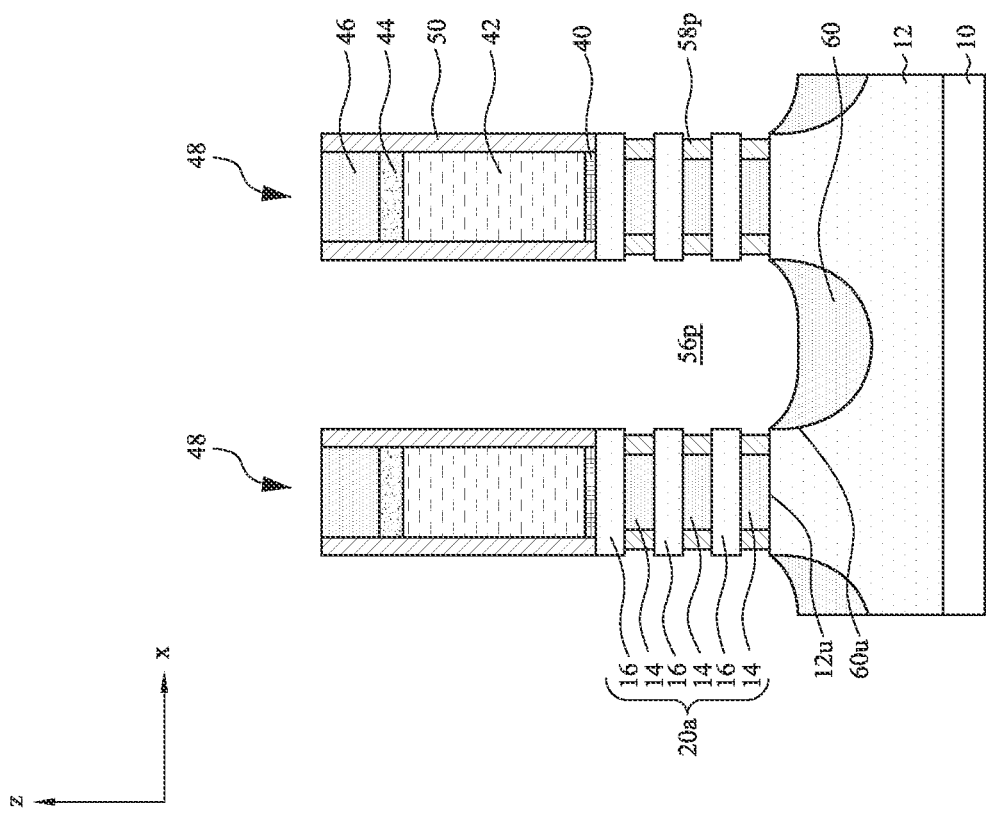
Fig. 15B
Fig. 15A

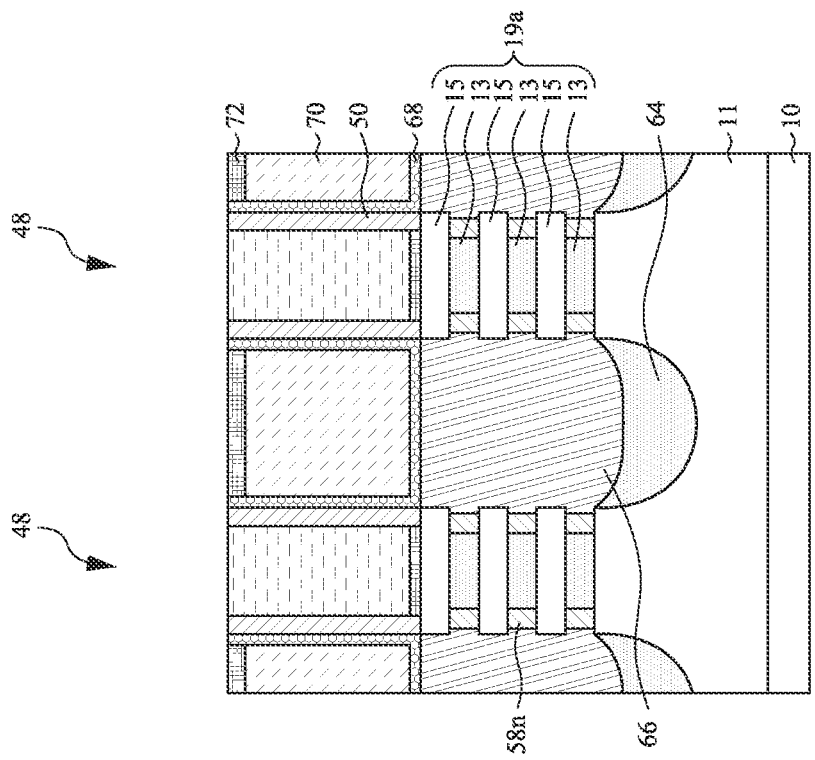
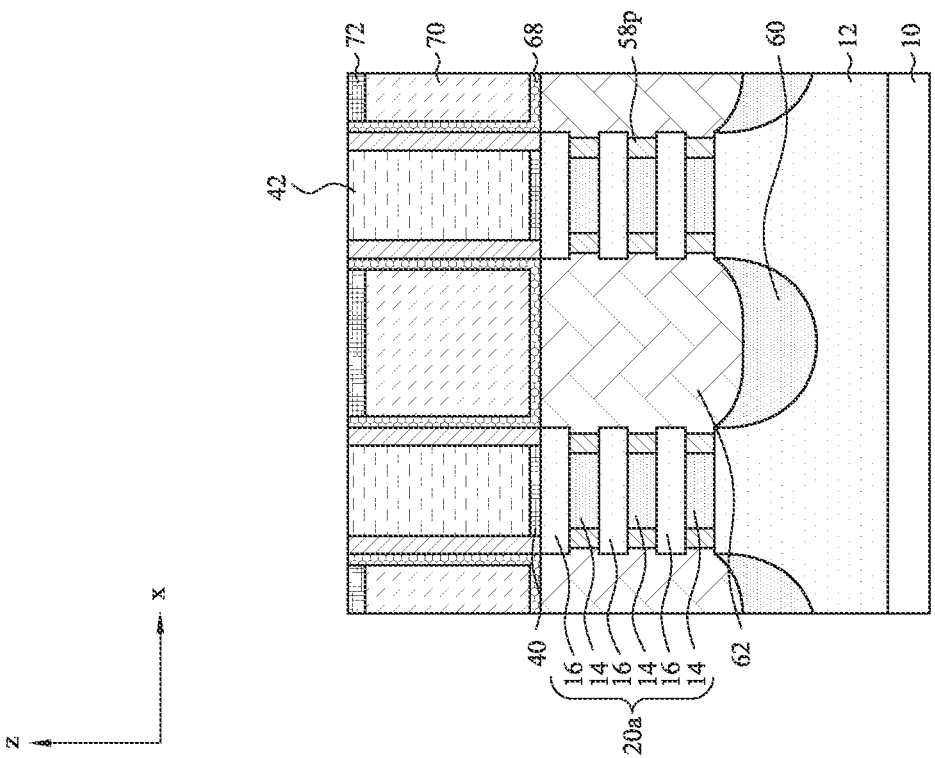
Fig. 24A
Fig. 24B

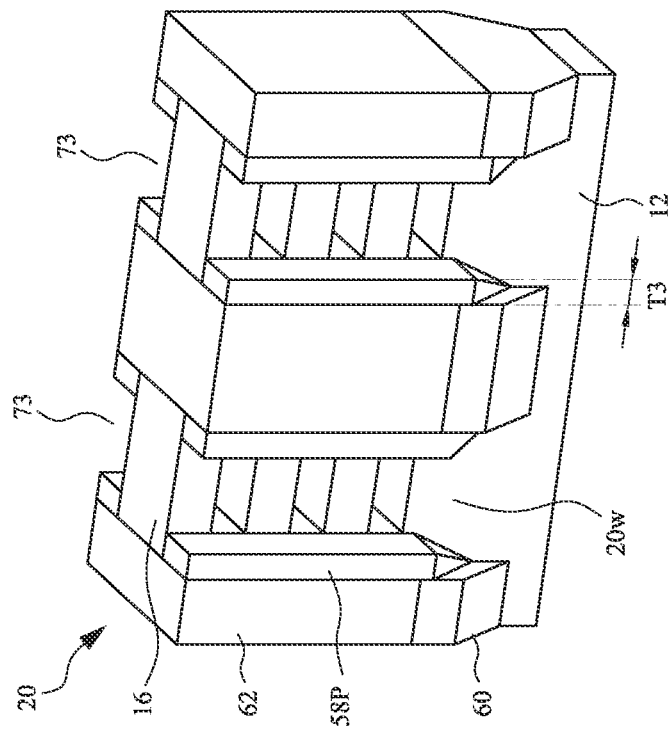
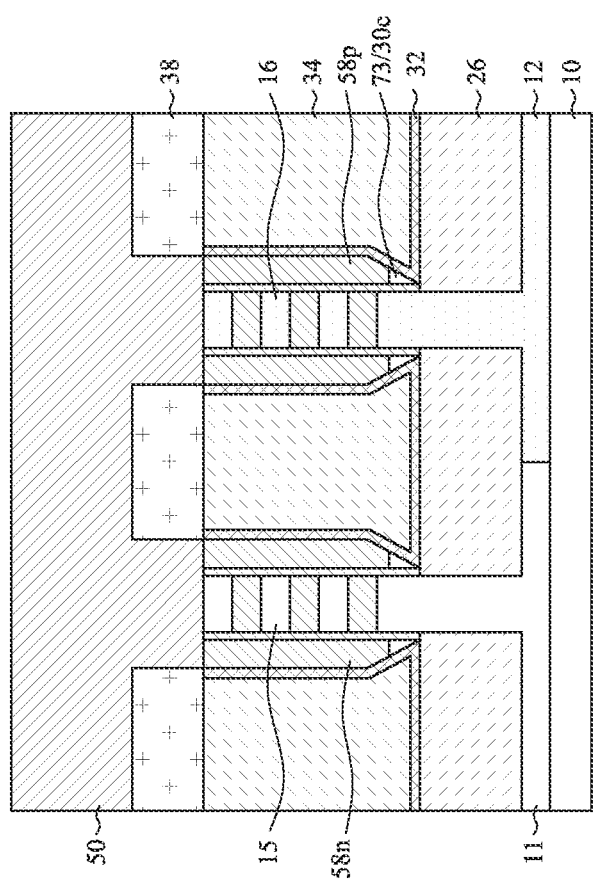
Fig. 25E
Fig. 25F

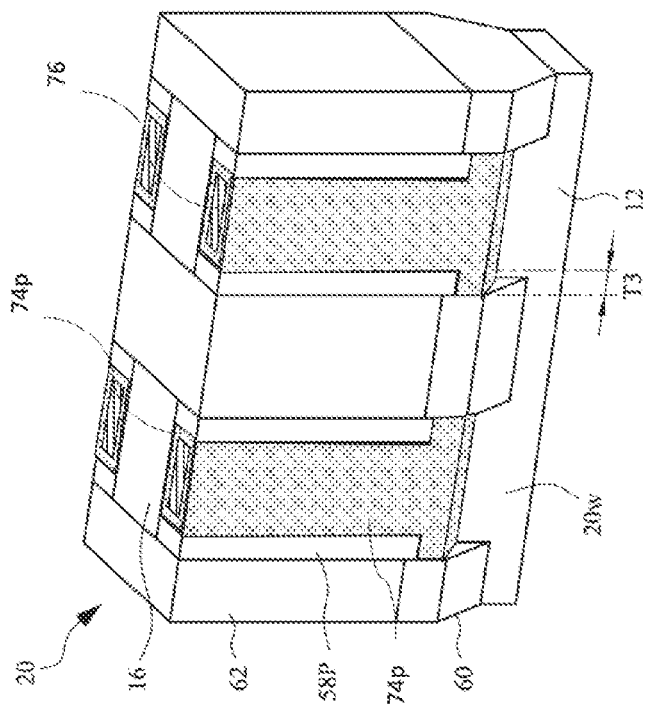
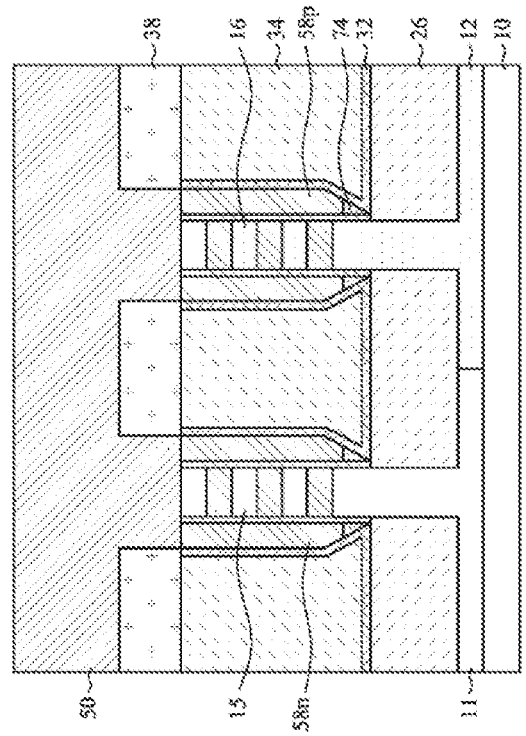
Fig. 26E
Fig. 26F

SEMICONDUCTOR DEVICES AND METHODS OF FABRICATION THEREOF

CROSS-REFERENCE TO RELATED APPLICATIONS

This application is a divisional application of U.S. patent application Ser. No. 17/025,903 filed Sep. 18, 2020, which is incorporated by reference in its entirety.

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, epitaxial source/drain features may suffer damages during replacement gate operations. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 11, FIGS. 12A-F to FIGS. 13A-F, FIGS. 14A-E to FIGS. 24A-E, FIGS. 25A-F, FIGS. 26A-F, FIG. 27A-E, and FIGS. 28A-E schematically illustrate various stages of manufacturing a semiconductor device according to embodiments of the present disclosure.

DETAILED DESCRIPTION

Figure 1:
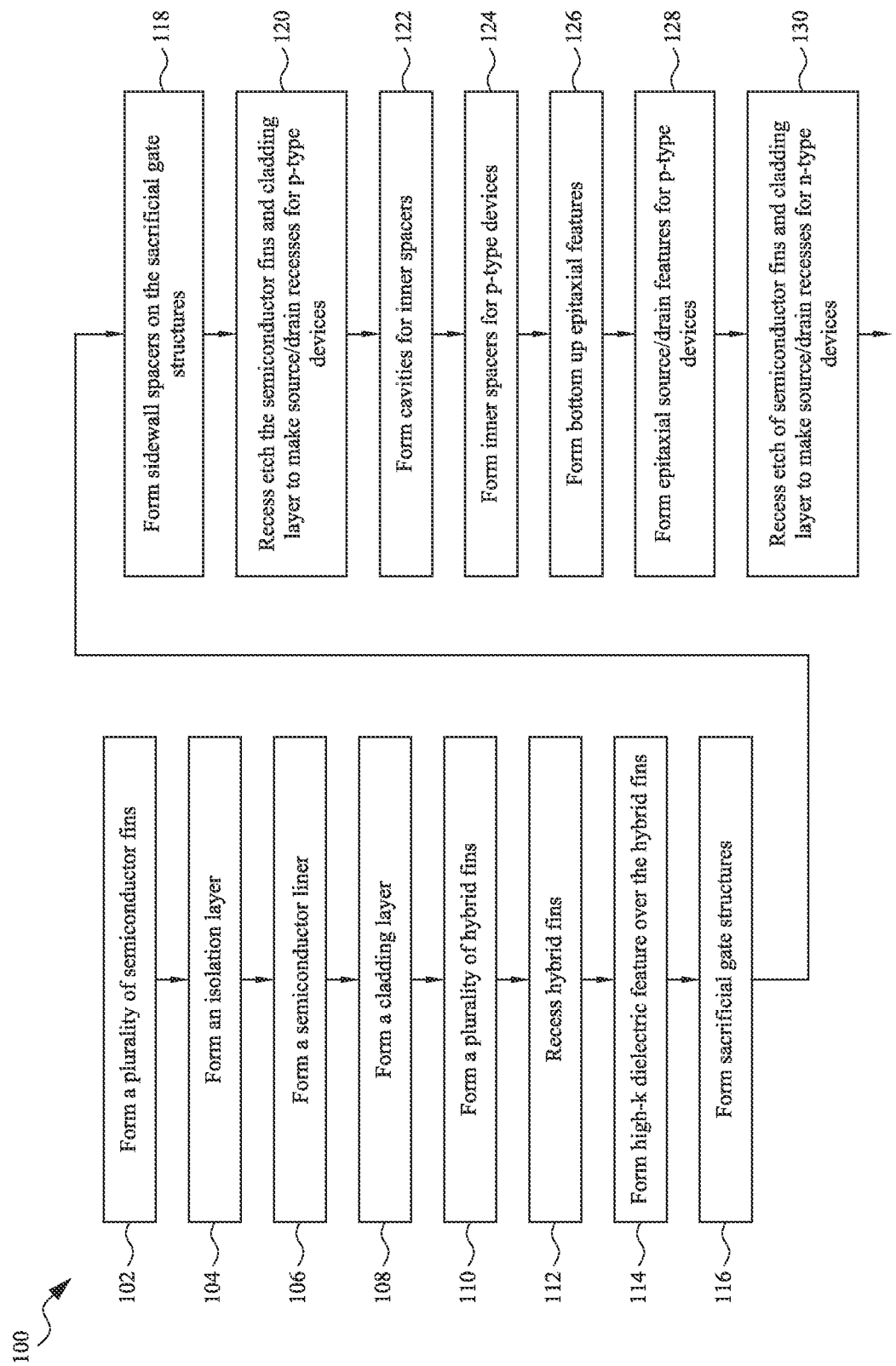
FIG. 1 is a flow chart of a method for manufacturing of a semiconductor device according to embodiments of the present disclosure.
Figure 1:
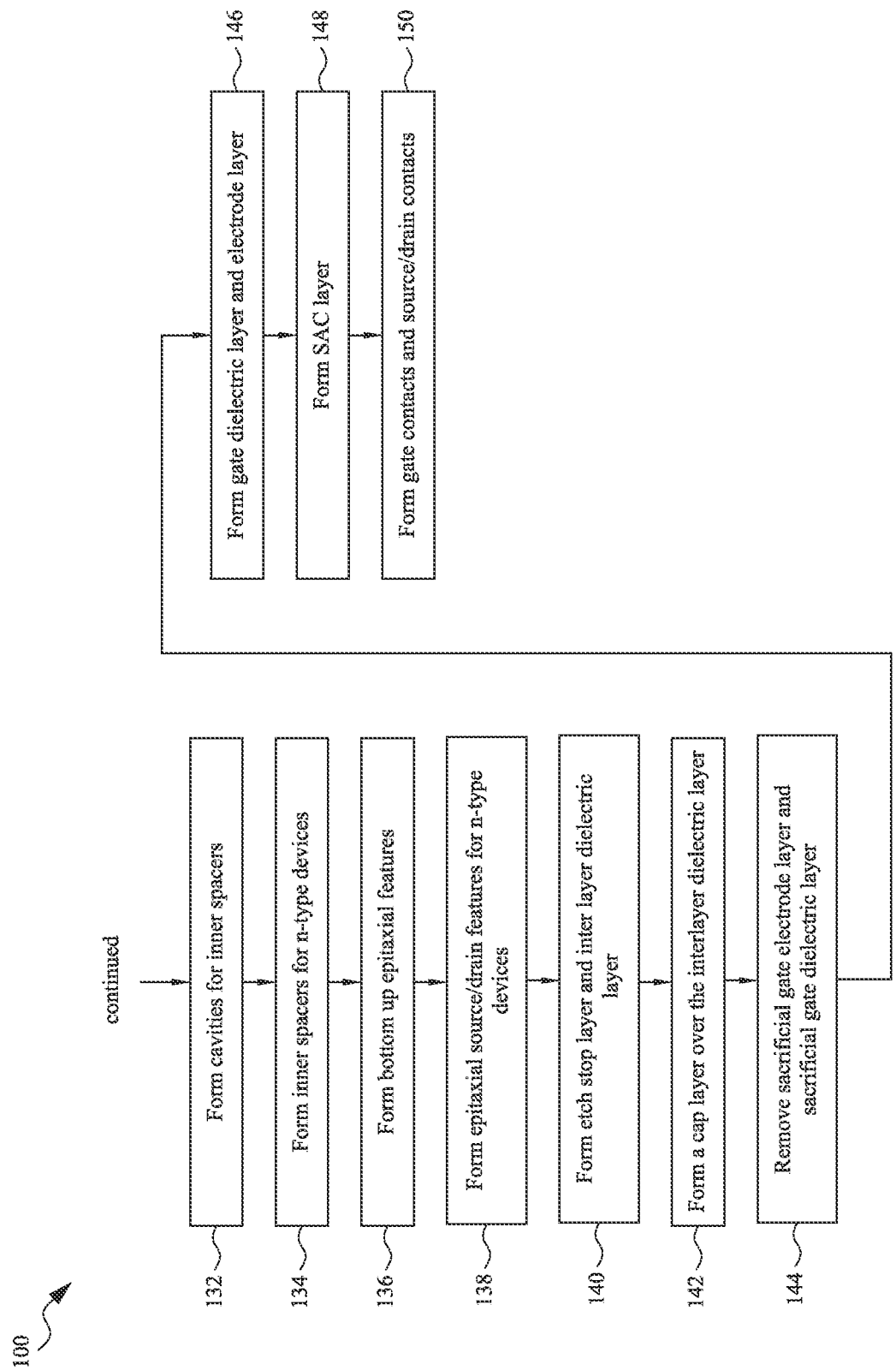

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

During formation of GAA transistors, such as nanosheet FETs, a cladding layer, which is a thin layer of semiconductor materials, such as SiGe, is formed on both sides of semiconductor fins as part of the process. The cladding layer, eventually removed, occupies the space needed for a portion of the source/drain feature, a portion of the inner spacers, and a portion of the replacement gate structure. Conventionally, source/drain features are formed in recess volumes formed by etching the semiconductor fin and cladding layer beyond the depth of the cladding layer. As a result, the source/drain features extend beyond the inner spacers formed in the space after removing the cladding layer. In some instances, regions of the cladding layer may not be evenly removed because of reduced thickness in local regions resulting in regions of the inner spacer with reduced thickness. In some instance, the inner spacers with regions of reduced thickness may not cover the source/drain feature during replacement gate processes, causing damage to the source/drain features. In other instances, regions of the inner spacer with reduced thickness may also include leakage current in the mesa device. According to embodiments of the present disclosure, an un-doped or low-doped epitaxial layer is formed before forming the source/drain features. The un-doped or low-doped epitaxial layer protects the source/drain features from damage during replacement gate process, and also prevents leakage current in the mesa device.

FIG. 1 is a flow chart of a method 100 for manufacturing of a semiconductor substrate according to embodiments of the present disclosure. FIGS. 2 to 11, FIGS. 12A-E to FIGS. 28A-E schematically illustrate various stages of manufacturing a semiconductor device according to the method 100. Additional operations can be provided before, during, and after operations/processes in the method 100, and some of the operations described below can be replaced or eliminated, for additional embodiments of the method. The order of the operations/processes may be interchangeable.

Figure 2:
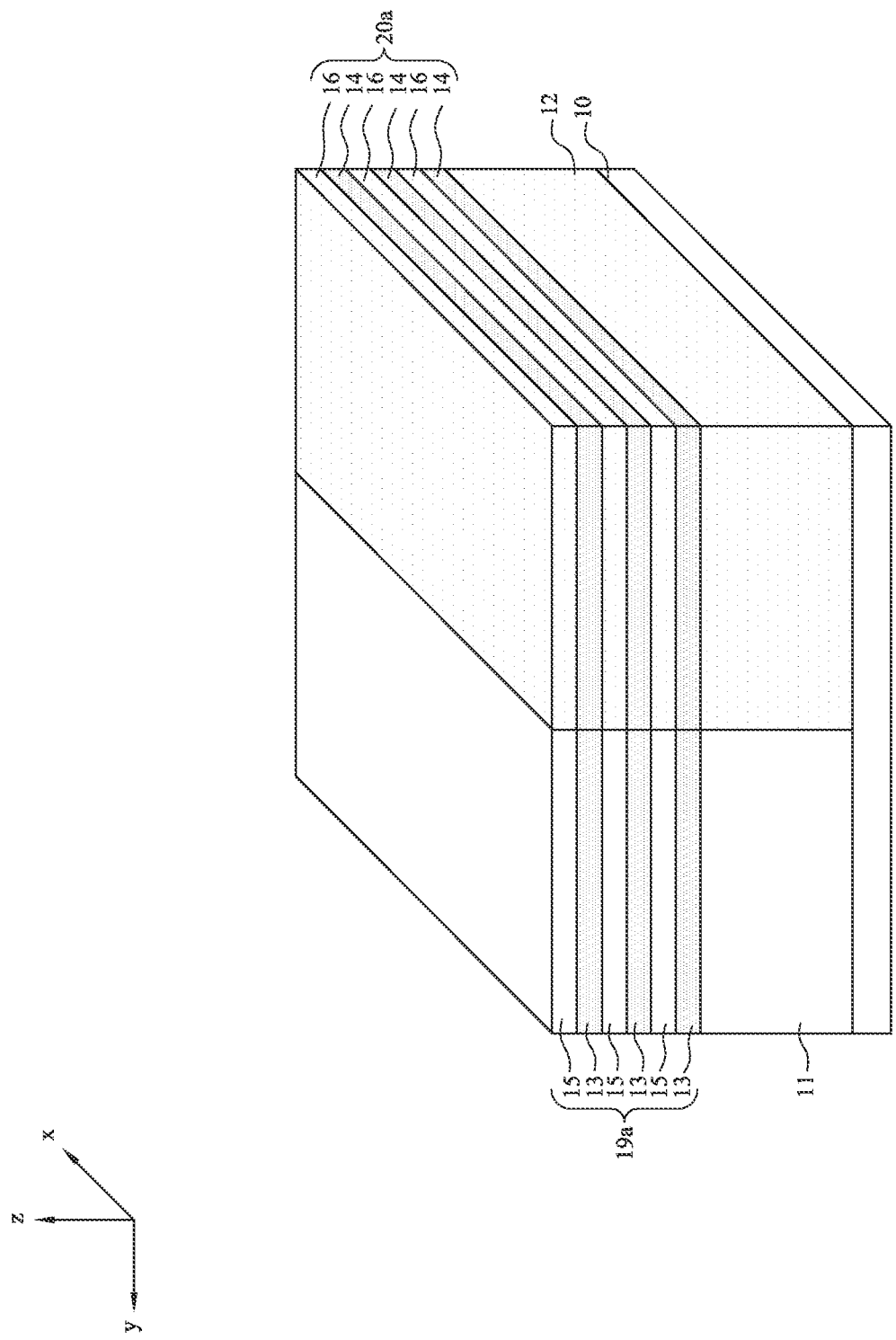
Figure 3:
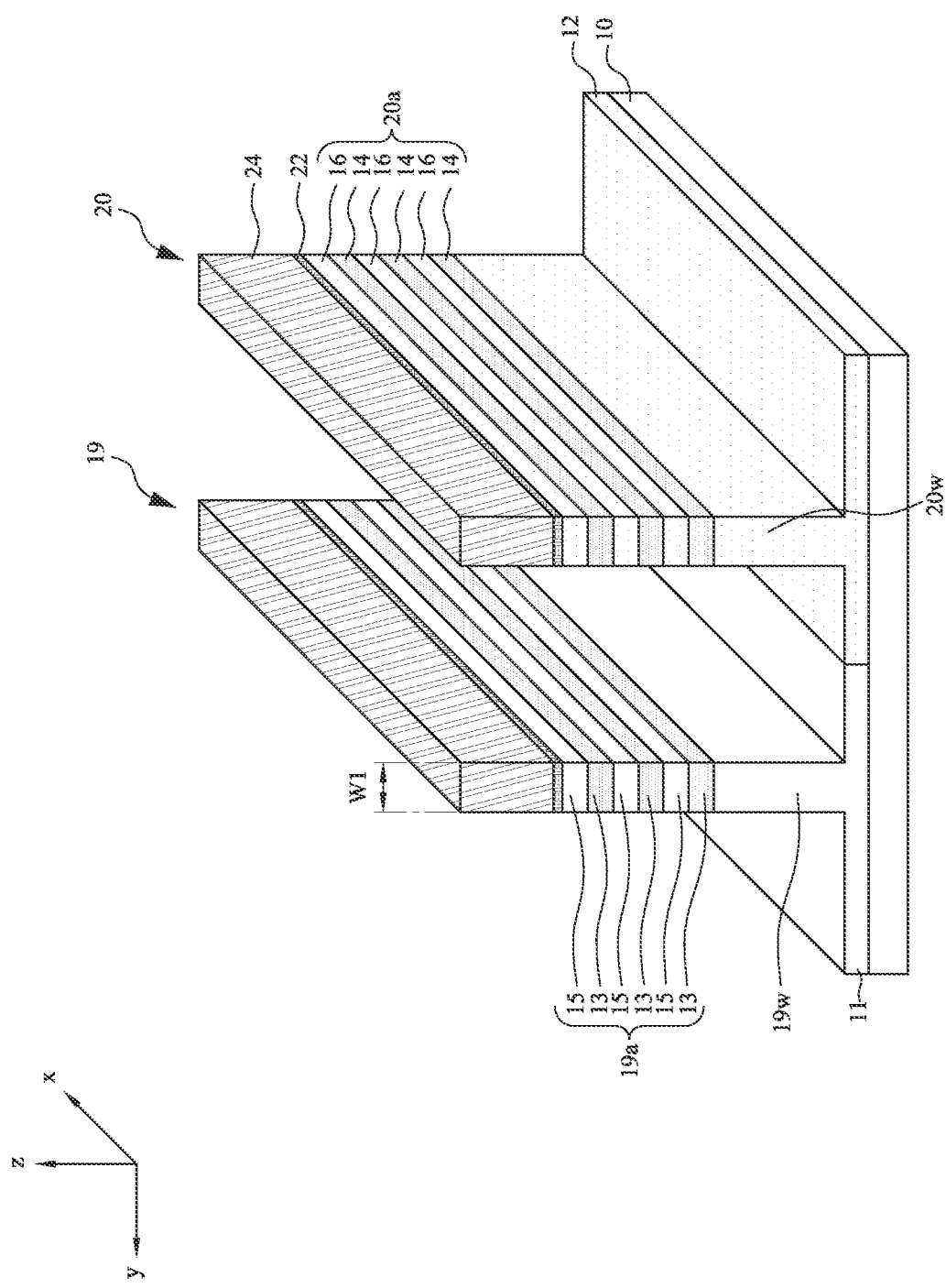

The method 100 begins at operation 102 where a plurality of semiconductor fins 20 are formed over a substrate 10, as shown in FIGS. 2 and 3 are schematic perspective views of the substrate 10 during operation 102.

In FIG. 2, the substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as n-type field effect transistors (NFET), and p-type field effect transistors (PFET). In some embodiments, the substrate 10 may be a silicon-on-insulator (SOI) substrate including an insulator structure (not shown) for enhancement.

In the embodiment shown in FIG. 2, the substrate 10 includes a p-doped region or p-well 11 and an n-doped region or n-well 12. One or more n-type devices, such as nFETs, are to be formed over and/or within p-well 11. One or more p-type devices, such as pFETs, are to be formed over and/or within n-well 12. FIG. 2 shows that the n-well 12 and the p-well 11 are formed adjacent to one another, which is not limiting. In other embodiments, the p-well 11 and the n-well 12 may be separated by one or more insulation bodies, e.g., shallow trench insulation ("STI"). The p-well 11 and n-well 12 in FIG. 2 are formed using a dual-tub process, in which both p-well 11 and n-well 12 are formed in the substrate 10. Other processes, like a p-well process in an n-type substrate or an n-well process in a p-type substrate are also possible and included in the disclosure. That is one of the p-well 11 and n-well 12 is in a doped local region and the other is in the doped substrate. It is also possible that both p-well 11 and n-well 12 are intrinsic or intrinsically doped, e.g., unintentionally doped.

The p-well 11 includes one or more p-type dopants, such as boron (B). In some embodiments, the p-well 11 has a dopant concentration in a range from about $1E18$ atoms/cm$^3$ to about $6E18$ atoms/cm$^3$. The n-well 12 includes one more n-type dopants, such as phosphorus (P), arsenic (As), etc. In some embodiments, the n-well 12 has a dopant concentration in a range from about $1E18$ atoms/cm$^3$ to about $6E18$ atoms/cm$^3$.

A semiconductor stack 17 is formed over the p-well 11. The semiconductor stack 17 includes alternating semiconductor layers made of different materials to facilitate formation of nanosheet channels in a multi-gate n-type device, such as nanosheet channel nFETs. In some embodiments, the semiconductor stack 17 includes first semiconductor layers 13 interposed by second semiconductor layers 15. The first semiconductor layers 13 and second semiconductor layers 15 have different compositions. In some embodiments, the two semiconductor layers 13 and 15 provide for different oxidation rates and/or different etch selectivity. In later fabrication stages, portions of the second semiconductor layers 15 form nanosheet channels in a multi-gate device. Three first semiconductor layers 13 and three second semiconductor layers 15 are alternately arranged as illustrated in FIG. 2 as an example. More or less semiconductor layers 13 and 15 may be included in the semiconductor stack 17 depending on the desired number of channels in the semiconductor device to be formed. In some embodiments, the number of semiconductor layers 13 and 15 is between 1 and 10.

In some embodiments, the first semiconductor layer 13 may include silicon germanium (SiGe). The first semiconductor layer 13 may be a SiGe layer including more than 25% Ge in molar ratio. For example, the first semiconductor layer 13 may be a SiGe layer including Ge in a molar ration in a range between 25% and 50%.

The second semiconductor layer 15 may include silicon (Si). In some embodiments, the second semiconductor layer 15 may include n-type dopants, such as phosphorus (P), arsenic (As), etc. In some embodiments, the second semiconductor layer 15 has a dopant concentration in a range from about $5E16$ atoms/cm$^3$ to about $5E17$ atoms/cm$^3$. In other embodiments, the second semiconductor layer 15 is a undoped or substantially dopant-free (i.e., having an extrinsic dopant concentration from about 0 atoms/cm$^3$ to about $1E17$ atoms/cm$^3$) silicon layer.

A semiconductor stack 18 is formed over the n-well 12. The semiconductor stack 18 includes alternating semiconductor layers made of different materials to facilitate formation of nanosheet channels in a multi-gate n-type device, such as nanosheet channel pFETs. In some embodiments, the semiconductor stack 18 includes third semiconductor layers 14 interposed by fourth semiconductor layers 16. The first semiconductor layers 13 and second semiconductor layers 15 have different compositions. In some embodiments, the two semiconductor layers 14 and 16 provide for different oxidation rates and/or different etch selectivity. In later fabrication stages, portions of the fourth semiconductor layers 16 form nanosheet channels in a multi-gate device. Three third semiconductor layers 14 and three fourth semiconductor layers 16 are alternately arranged as illustrated in FIG. 2 as an example. More or less semiconductor layers 14 and 16 may be included in the semiconductor stack 18 depending on the desired number of channels in the semiconductor device to be formed. In some embodiments, the number of semiconductor layers 14 and 16 is between 1 and 10.

In some embodiments, the third semiconductor layer 14 may include silicon germanium (SiGe). The third semiconductor layer 14 may be a SiGe layer including more than 25% Ge in molar ratio. For example, the third semiconductor layer 14 may be a SiGe layer including Ge in a molar ration in a range between 25% and 50%. In some embodiments, the third semiconductor layer 14 and the first semiconductor layer 13 have substantially the same composition.

The fourth semiconductor layer 16 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the fourth semiconductor layer 16 may be a Ge layer. The fourth semiconductor layer 16 may include p-type dopants, boron etc. In some embodiments, the fourth semiconductor layer 16 has a dopant concentration in a range from about $5E16$ atoms/cm$^3$ to about $5E17$ atoms/cm$^3$.

The semiconductor layers 13, 15, 14, 16 may be formed by a molecular beam epitaxy (MBE) process, a metalorganic chemical vapor deposition (MOCVD) process, and/or other suitable epitaxial growth processes.

In some embodiments, each semiconductor layer 15, 16 has a thickness in a range between about 5 nm and about 30 nm. In other embodiments, each second semiconductor layer 15, 16 has a thickness in a range between about 10 nm and about 20 nm. In some embodiments, each semiconductor layer 15, 16 has a thickness in a range between about 6 nm and about 12 nm. In some embodiments, the semiconductor layers 15 in the semiconductor stack 17 and the semiconductor layers 16 in the semiconductor stack 18 are uniform in thickness.

The semiconductor layers 13, 14 may eventually be removed and serve to define a vertical distance between adjacent channel regions for a subsequently formed multi-gate device. In some embodiments, the thickness of the semiconductor layer 13, 14 is equal to or greater than the thickness of the semiconductor layer 15, 16. In some embodiments, each semiconductor layer 13, 14 has a thickness in a range between about 5 nm and about 50 nm. In other embodiments, each semiconductor layer 13, 14 has a thickness in a range between about 10 nm and about 30 nm.

The semiconductor stacks 17, 18 may be formed separately. For example, the semiconductor stack 17 is first formed over the entire substrate, i.e. over both the n-well 12 and the p-well 11 then recesses are formed in the semiconductor stacks 17 in areas over the n-well 12 to expose the n-well 12, and the semiconductor stack 18 is then formed in the recesses over the n-well 12 while the semiconductor stack 17 is covered by a mask layer.

In FIG. 3, the semiconductor fins 19, 20 are formed from the semiconductor stacks 17, 18, and a portion of the p-well 11, the n-well 12 underneath respectively. The semiconductor fin 19 may be formed by patterning a pad layer 22 and a hard mask 24 formed on the semiconductor stacks 17, 18 and one or more etching processes. Each semiconductor fin 19, 20 has an active portion 19a, 20a formed from the semiconductor layers 13/15, 14/16, and a well portion 19w, 20w formed in the p-well 11 and the n-well 12, respectively. In FIG. 3, the semiconductor fins 19, 20 are formed along the X direction. A width W1 of the semiconductor fins 19, 20 along the Y direction is in a range between about 3 nm and about 44 nm. In some embodiments, the width W1 of the semiconductor fins 19, 20 along the Y direction is in a range between about 20 nm and about 30 nm.

Figure 4:
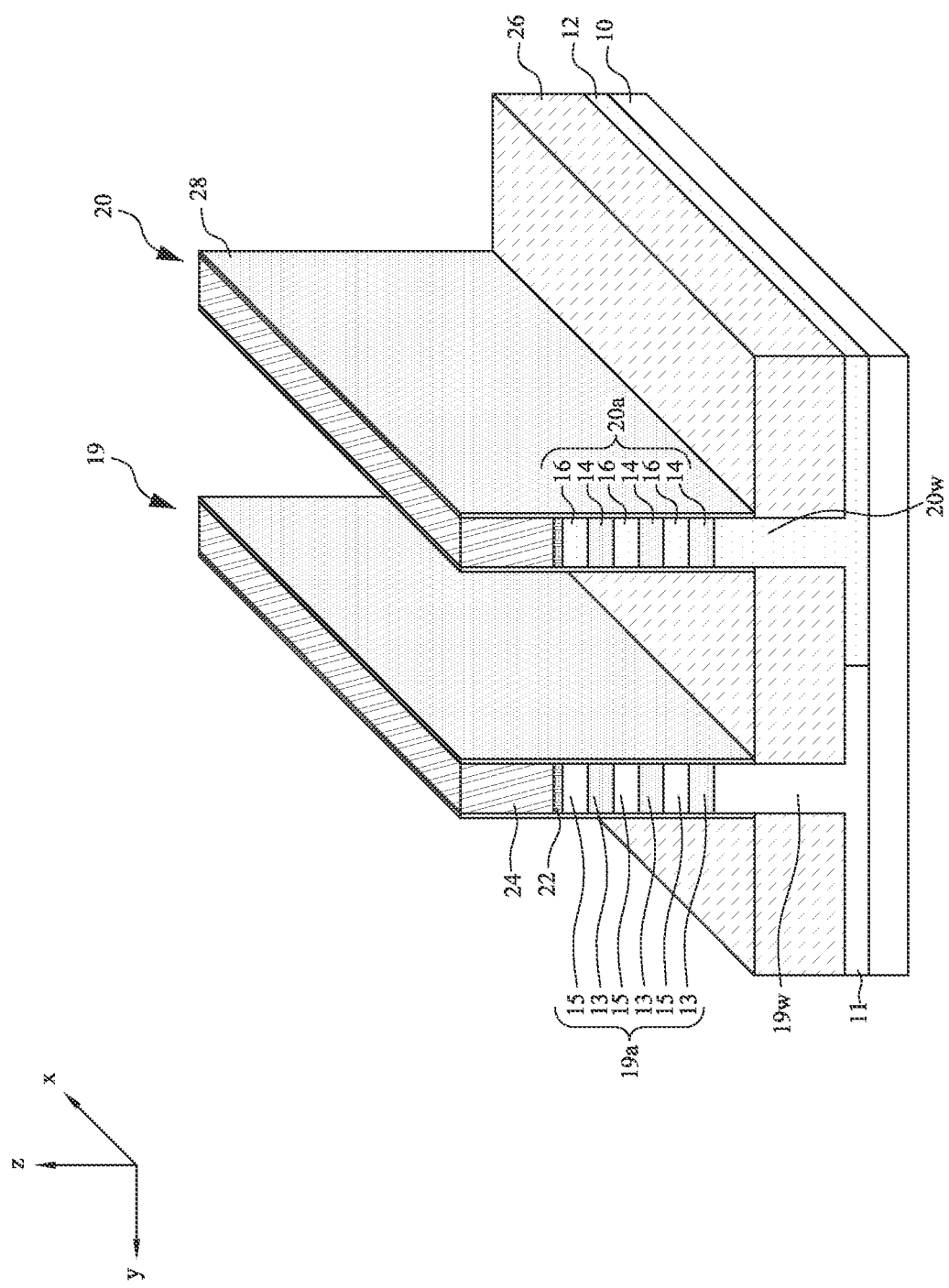

In operation 104, an isolation layer 26 is formed in the trenches between the semiconductor fins 19, 20, as shown in FIG. 4. The isolation layer 26 is formed over the substrate 10 to cover at least a part of the well portions 19w, 20w of the semiconductor fins 19, 20. The isolation layer 26 may be formed by a high density plasma chemical vapor deposition (HDP-CVD), a flowable CVD (FCVD), or other suitable deposition process. In some embodiments, the isolation layer 26 may include silicon oxide, silicon nitride, silicon oxynitride, fluorine-doped silicate glass (FSG), a low-k dielectric, combinations thereof. In some embodiments, the isolation layer 26 is formed to cover the semiconductor fins 19, 20 by a suitable deposition process to fill the trenches between the semiconductor fins 19, 20, and then recess etched using a suitable anisotropic etching process to expose the active portions 19a, 20a of the semiconductor fins 19, 20. In some embodiments, the isolation layer 26 is etched to expose a portion of the well portions 19w, 20w in the semiconductor fins 19, 20.

In operation 106, after the isolation layer 26 is recess etched to expose the active portions 19a, 20a of the semiconductor fins 19, 20, a semiconductor liner 28 is formed on sidewalls of the exposed sidewalls of the semiconductor fins 19, 20, as shown in FIG. 4. The semiconductor liner 28 may be first formed conformally over the exposed surfaces on the substrate 10. The semiconductor liner 28 may be formed by a conformal process, such as an atomic layer deposition (ALD) process. An anisotropic etch process may be performed to remove the semiconductor liner 28 from horizontal surfaces. In some embodiments, the semiconductor liner 28 includes silicon.

Figure 5:
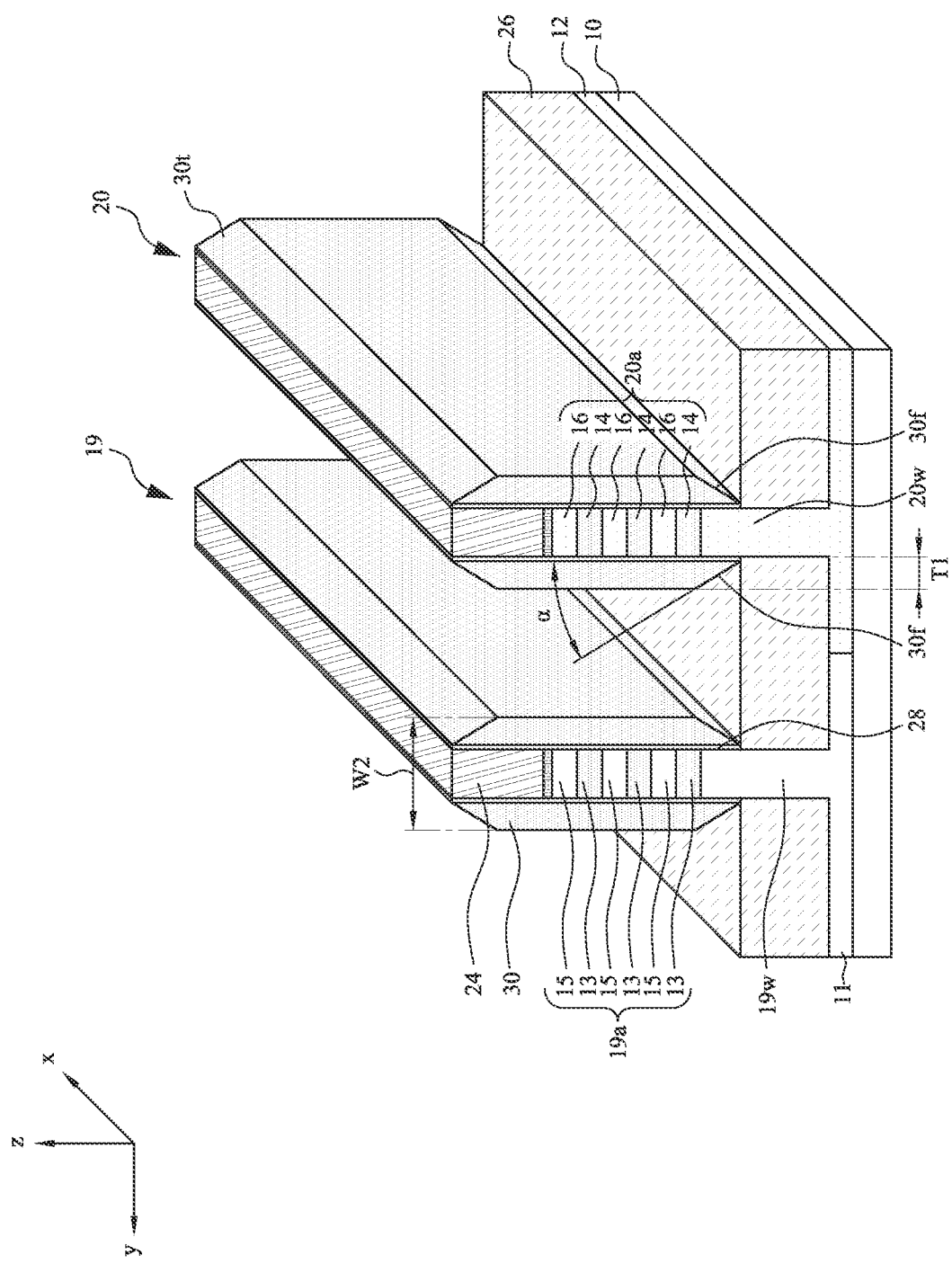

In operation 108, a cladding layer 30 is formed by an epitaxial process from the semiconductor liner 28, as shown in FIG. 5. In some embodiments, the cladding layer 30 includes a semiconductor material, for example SiGe. In some embodiments, the cladding layer 30 may have a composition similar to the composition of the first semiconductor layer 13 and the third semiconductor layer 14, thus may be selectively removed from the second semiconductor layer 15 and the fourth semiconductor layer 16. In an alternative embodiment, the semiconductor liner 28 may be omitted and the cladding layer 30 be epitaxially grown from the exposed surfaces of the semiconductor layers 13, 14, 15, and 16.

In some embodiments, the cladding layer 30 on sidewalls of the active portions 19a, 20a of the semiconductor fins 19, 20 functions as a sacrificial gate electrode layer on the sidewalls of the semiconductor fins 19, 20. The thickness T1 of the cladding layer 30 formed on the sidewalls of the semiconductor fins 19, 20 is selected to define the space suitable for a gate stack around the channels of the multi-channel FinFET devices, such as a nanosheet FinFET device, to be formed. In some embodiments, the thickness T1 may be in a range between about 0.5 nm and about 10 nm. If the thickness T1 of the cladding layer 30 is less than 0.5 nm, the space created by the subsequent removal of the cladding layer 30 may be too small to form the gate electrode layer. On the other hand, if the thickness of the cladding layer 30 is greater than 10 nm, the manufacturing cost is increased without significant advantage.

In some embodiments, the combined width W2 of the semiconductor fins 19, 20 and the cladding layer 30 on each sidewall may be in a range between about 4 nm and about 44 nm. The W2 is selected according to desired width of source/drain regions in the device to be formed.

As shown in FIG. 5, the cladding layer 30 has a sloped sidewall 30f near the well portions 19w, 20w of the semiconductor fins 19, 20. A sloped sidewall 30t may also form on an upper end of the cladding layer 30. The sloped sidewall 30f has an angle α relative to the Z-X plane. The sloped sidewall 30f is a result of natural crystalline facet of the epitaxially grown semiconductor material. Depending on the composition of the cladding layer, the angle α may be in a range between 5 degree and 89 degree. In some embodiments, the angle α may be in a range between 45 degree and 65 degree. Because of the sloped sidewall 30f, the thickness of the cladding layer 30 gradually reduces along the Z direction near the well portions 19w, 20w of the semiconductor fins 19, 20. The gradually reduced thickness may affect the etch rate during removal of the cladding layer 30 for formation of inner spacers in later stage, which may result in inner spacers with reduced thickness near the well portions 19w, 20w.

Figure 6:
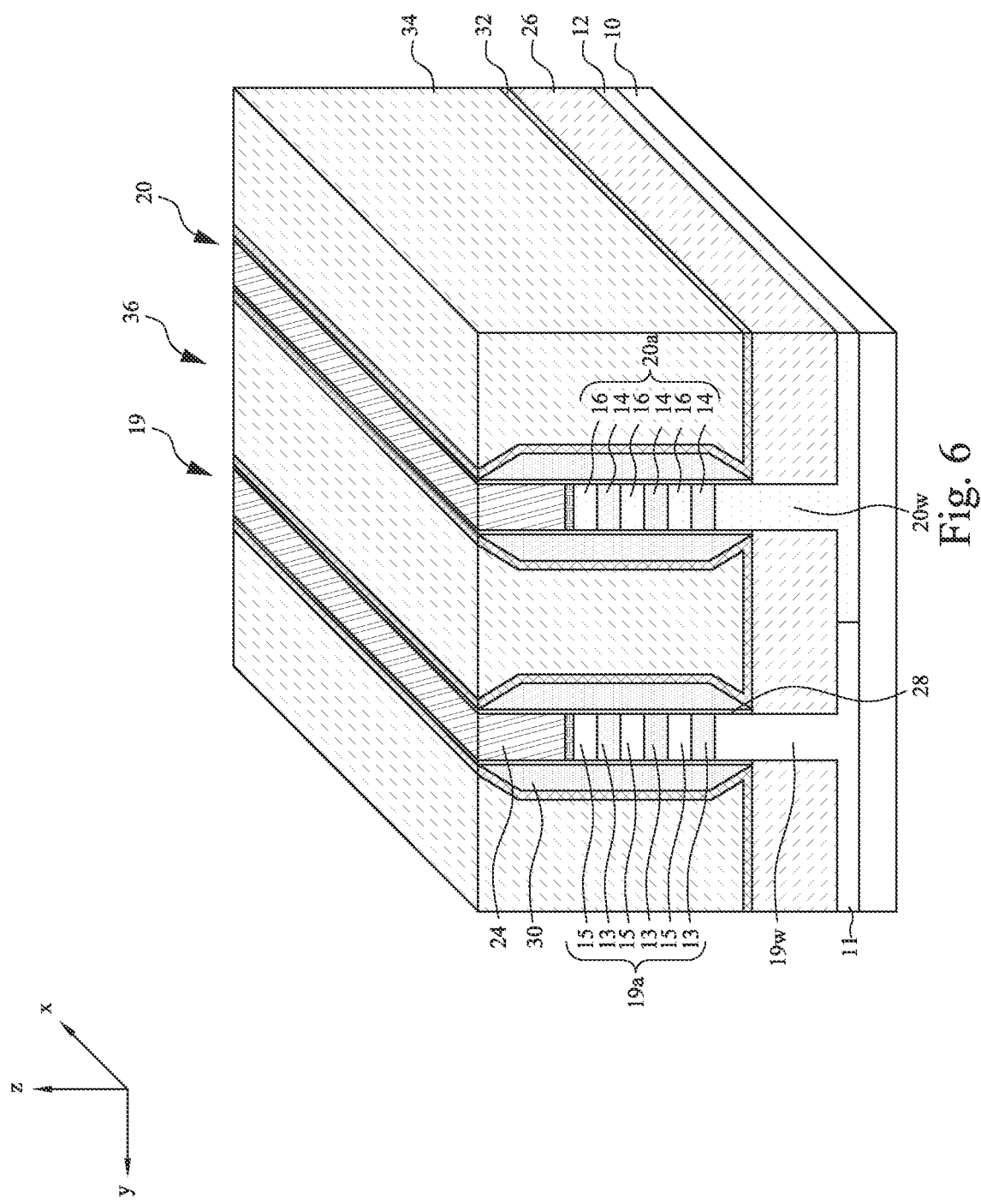

In operation 110, hybrid fins 36 are formed in the trenches between the neighboring semiconductor fins 19, 20 after formation of the cladding layer 30, as shown in FIG. 6. The hybrid fins 36, also referred to as dummy fins or dielectric fins, include a high-k dielectric material layer, a low-k dielectric material layer, or a bi-layer dielectric material including high-k upper part and a low-k lower part. In some embodiments, the hybrid fins 36 include a high-k metal oxide, such as $HfO_2$, $ZrO_2$, HfAlOx, HfSiOx, $Al_2O_3$, and the like, a low-k material such as SiONC, SiCN, SiOC, or other dielectric material. In the example of FIG. 6, the hybrid fin 36 is a bi-layer structure including a dielectric liner layer 32 and a dielectric filling layer 34. In some embodiments, the dielectric liner layer 32 may include a low-k material, such as SiONC, SiCN, SiOC, or other dielectric material, that provide etch resistance during replacement gate processes. The dielectric filling layer 34 may be a low-k dielectric material, such as silicon oxide. After formation of the dielectric filling layer 34, a planarization process is performed to expose the hard mask 24.

Figure 7:
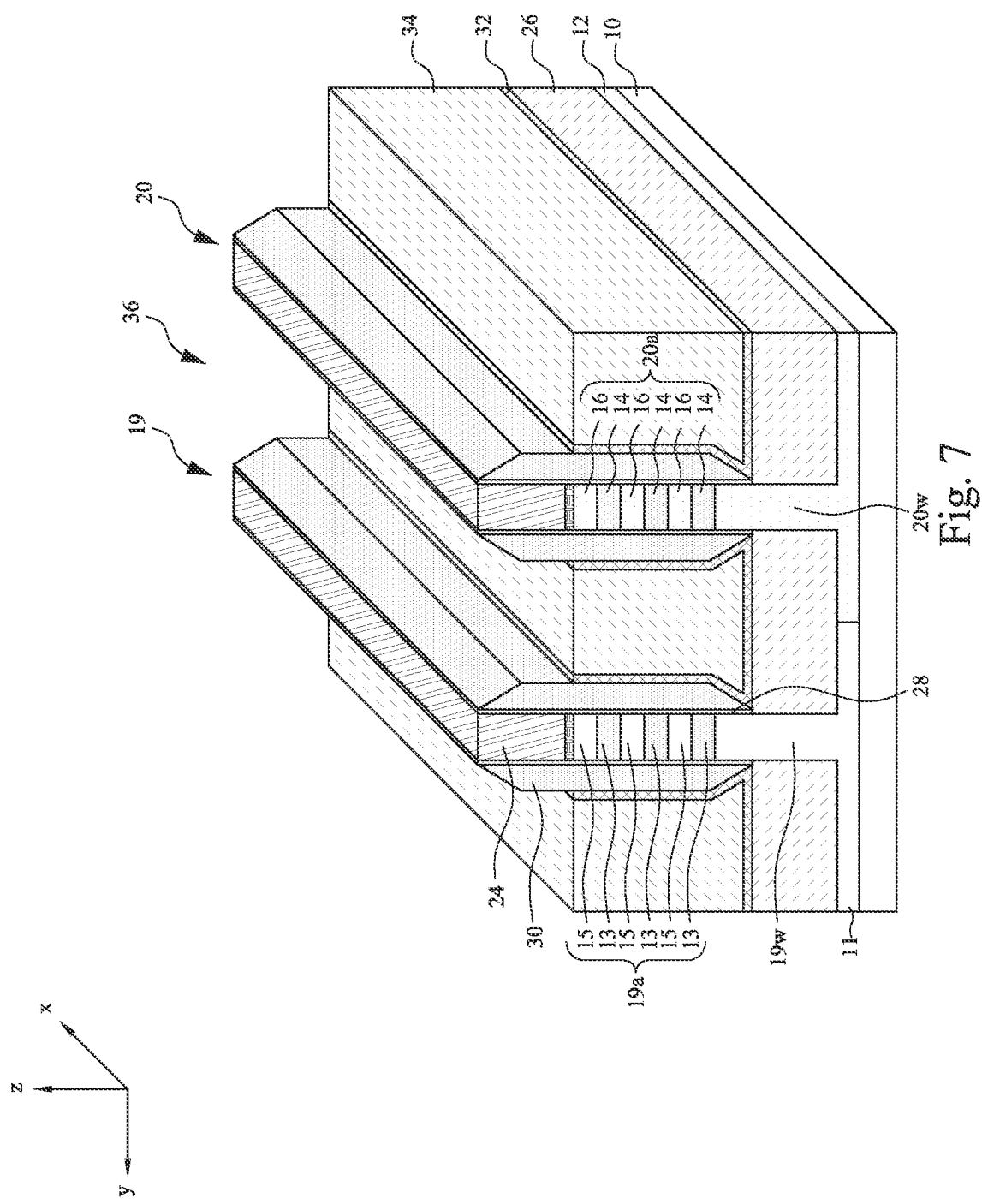

In operation 112, the hybrid fins 36 are recess etched as shown in FIG. 7. The recess may be performed by any suitable process, such as dry etch, wet etch, or a combination thereof. The etch process may be a selective etch process that does not remove the semiconductor material of the cladding layer 30. The recess process may be controlled so that the dielectric liner layer 32 and the dielectric filling layer 34 are substantially at the same level as a top surface of the topmost second semiconductor layer 15 and the fourth semiconductor layer 16. As a result of the recess etch, recesses are formed on the hybrid fins 36.

Figure 8:
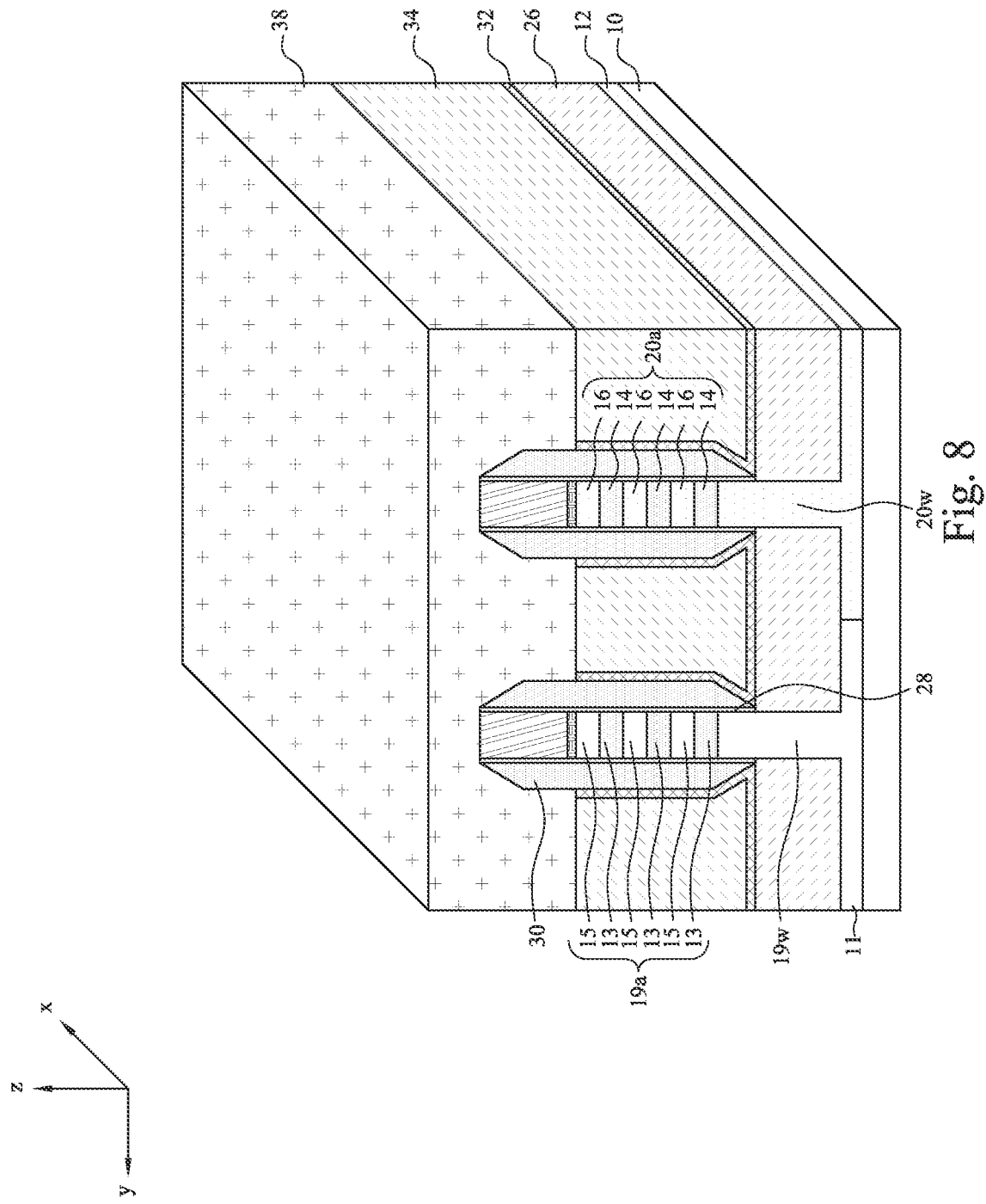
Figure 9:
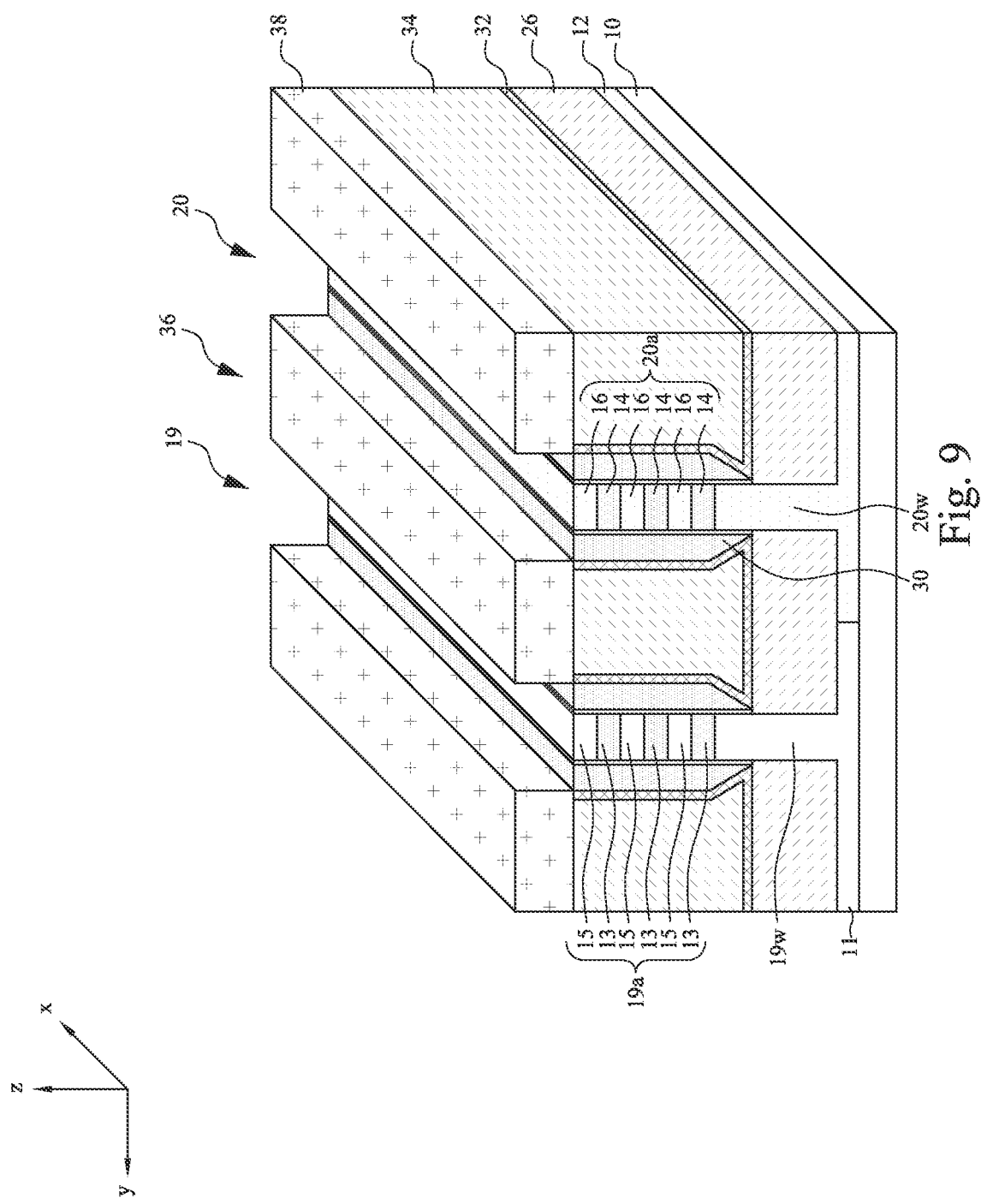

In operation 114, high-k dielectric features 38 are formed in the recesses over the hybrid fins 36, as shown in FIGS. 8-9. In some embodiments, the high-k dielectric features 38 are formed by a blanket deposition followed by a planarization process. The high-k dielectric features 38 may include a material having a k value greater than 7, such as $HfO_2$, $ZrO_2$, HfAlOx, HfSiOx, or $Al_2O_3$. Any suitable deposition process, such as a CVD, PECVD, FCVD, or ALD process, may be used to deposit the high-k dielectric material. In some embodiments, the planarization may be performed to remove the sloped sidewall 30t of the cladding layer 30 so that the high-k dielectric features 38 have substantially vertical sidewalls. After formation of the high-k dielectric features 38, the cladding layer 30 may be recessed to level with the hybrid fins 36. The pad layer 22 and the hard mask 24 are subsequently removed exposing the topmost second semiconductor layer 15 and the fourth semiconductor layer 16. The high-k dielectric features 38 protrude over the semiconductor fins 19, 20 and the hybrid fins 36 and may function to separate gate structures formed over the semiconductor fins 19, 20.

Figure 10:
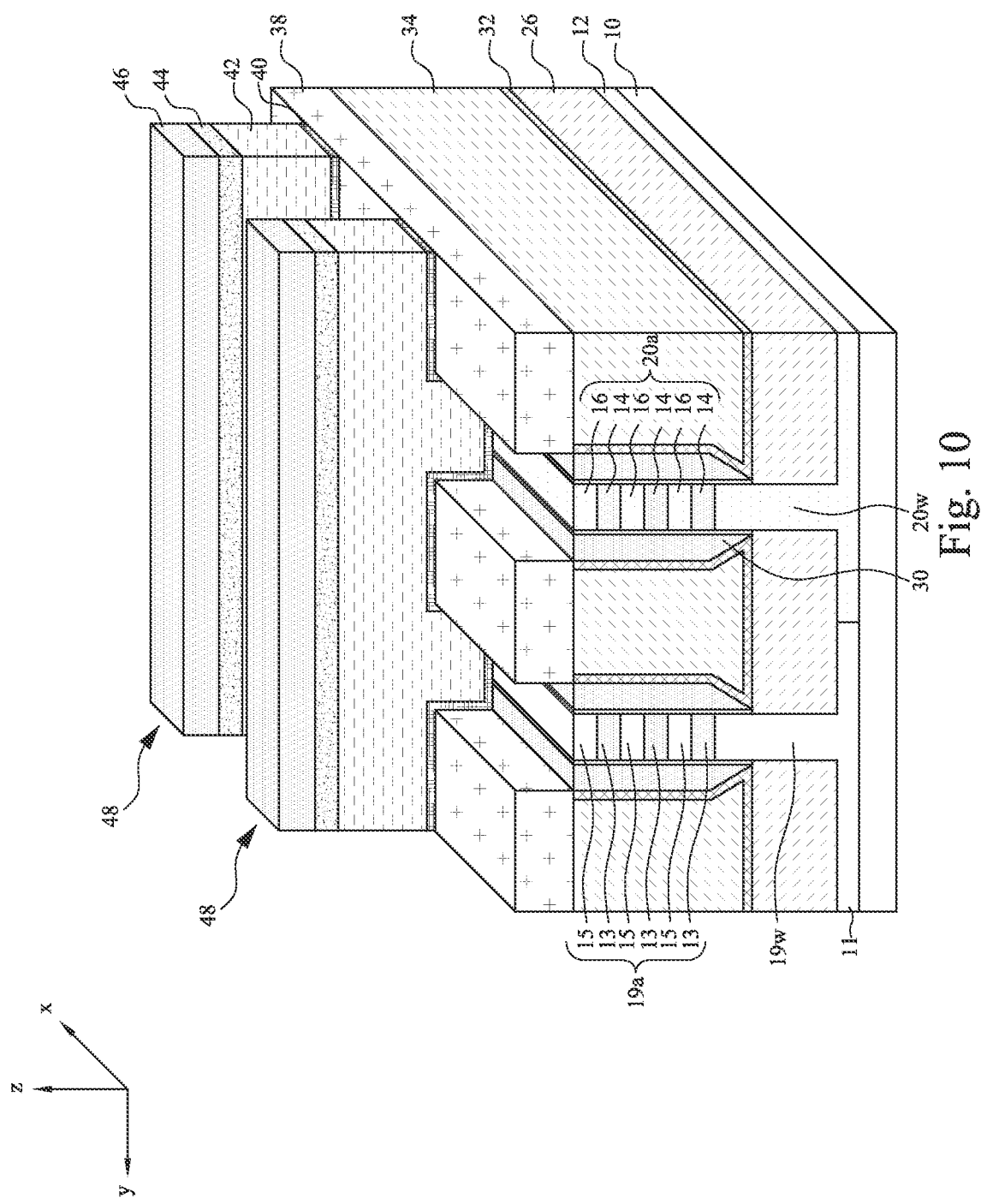

In operation 116, sacrificial gate structures 48 are formed as shown in FIG. 10. The sacrificial gate structures 48 are formed over the semiconductor fins 19, 20 and the hybrid fins 36. The sacrificial gate structure 48 is formed over a portion of the semiconductor fins 19, 20 which is to be a channel region. The sacrificial gate structure 48 may include a sacrificial gate dielectric layer 40, a sacrificial gate electrode layer 42, a pad layer 44, and a mask layer 46.

The sacrificial gate dielectric layer 40 may be formed conformally over the semiconductor fins 19, 20, the high-k dielectric features 38. In some embodiments, the sacrificial gate dielectric layer 40 may be deposited by a CVD process, a sub-atmospheric CVD (SACVD) process, a FCVD process, an ALD process, a PVD process, or other suitable process. The sacrificial gate dielectric layer 40 may include one or more layers of dielectric material, such as $SiO_2$, SiN, a high-k dielectric material, and/or other suitable dielectric material. In some embodiments, the sacrificial gate dielectric layer 40 includes a material different than that of the high-k dielectric features 38.

The sacrificial gate electrode layer 42 may be blanket deposited on the over the sacrificial gate dielectric layer 40. The sacrificial gate electrode layer 42 includes silicon such as polycrystalline silicon or amorphous silicon. The thickness of the sacrificial gate electrode layer is in a range between about 70 nm and about 200 nm. In some embodiments, the sacrificial gate electrode layer 42 is subjected to a planarization operation. The sacrificial gate electrode layer 42 may be deposited using CVD, including LPCVD and PECVD, PVD, ALD, or other suitable process.

Subsequently, the pad layer 44 and the mask layer 46 are formed over the sacrificial gate electrode layer 42. The pad layer 44 may include silicon nitride. The mask layer 46 may include silicon oxide. Next, a patterning operation is performed on the mask layer 46, the pad layer 44, the sacrificial gate electrode layer 42 and the sacrificial gate dielectric layer 40 to form the sacrificial gate structure 48.

Figure 11:
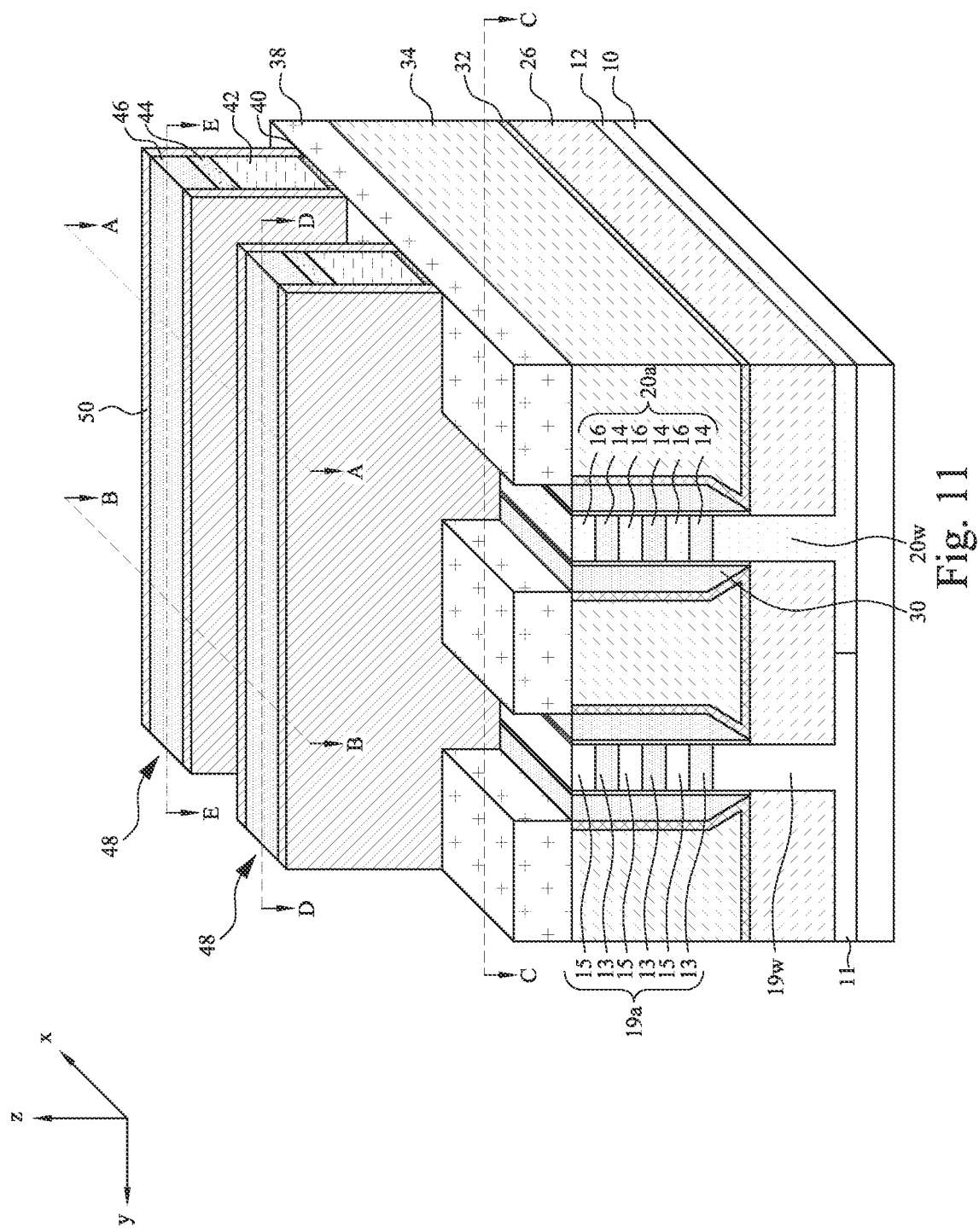

In operation 118, sidewall spacers 50 are formed on sidewalls of each sacrificial gate structure 48, as shown in FIG. 11. After the sacrificial gate structure 48 is formed, the sidewall spacers 50 are formed by a blanket deposition of an insulating material followed by anisotropic etch to remove insulating material from horizontal surfaces. The sidewall spacers 50 may have a thickness in a range between about 4 nm and about 7 nm. In some embodiments, the insulating material of the sidewall spacers 50 is a silicon nitride-based material, such as SiN, SiON, SiOCN or SiCN and combinations thereof.

Lines A-A, B-B, C-C, D-D, and E-E in FIG. 11 indicate cut lines of various views in FIGS. 12A-E to FIGS. 28A-E described below. Particularly, FIGS. 12A-28A are schematic cross-sectional views along lines A-A in FIG. 11, FIGS. 12B-28B are schematic cross-sectional views along lines B-B in FIG. 11, FIGS. 12C-28C are schematic cross-sectional views along lines C-C in FIG. 11, FIGS. 12D-28D are schematic cross-sectional views along lines D-D in FIG. 11, and FIGS. 12E-28E are schematic cross-sectional views along lines E-E in FIG. 11.

Figure 12D:
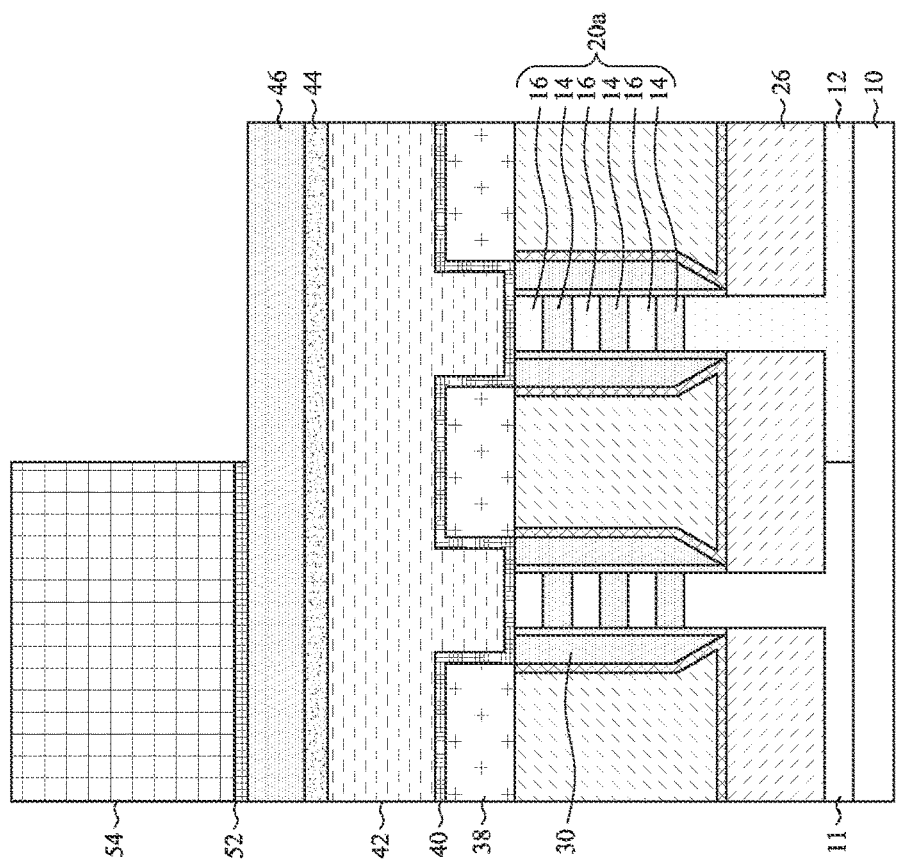
Figure 12C:
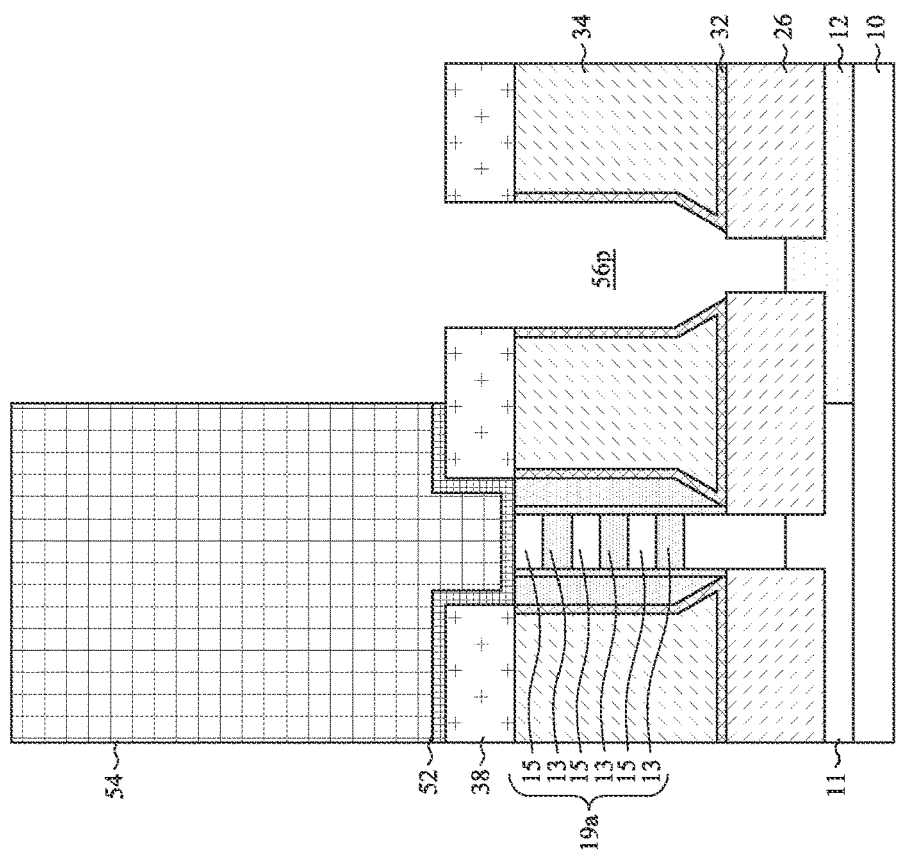

In operation 120, source/drain recesses 56p are formed over the n-well 12, on which p-type devices are to be formed, as shown in FIG. 12A-12F. A sacrificial liner 52 and a photoresist layer 54 are formed and patterned to expose regions over the n-well 12 for processing. The sacrificial liner 52 may be a dielectric layer used to protect regions not being processed. In some embodiment, the sacrificial liner 52 includes silicon nitride. The semiconductor fin 20 on opposite sides of the sacrificial gate structure 48 and the cladding layer 30 on the semiconductor fin 20 are etched forming source/drain recesses 56p between the neighboring hybrid fins 36 on either side of the sacrificial gate structure 48 as shown in FIGS. 12A and 12C. The cladding layer 30, the third semiconductor layers 14 and the fourth semiconductor layers 16 in the semiconductor fin 20 are etched down on both sides of the sacrificial gate structure 48 using etching operations. In some embodiments, suitable dry etching and/ or wet etching may be used to remove the third semiconductor layers 14, the fourth semiconductor layer 16, and the n-well 12, together or separately.

In some embodiments, all layers in the active portion 20a of the semiconductor fins 20 and part of the well portion 20w of the semiconductor fin 20 are removed to form the source/drain recesses 56p. The well-portion 20w of the semiconductor fin 20 is partially etched so that the source/ drain recesses 56p extend into the isolation layer 26, as shown in FIG. 12C. Two source/drain recesses 56p are formed on opposite ends of the remaining well portion 20w and active portion 20a of the semiconductor fin 20. Source/ drain features are to be formed in the source/drain recesses 56p, forming a p-type device with the semiconductor material in the remaining well portion 20w and active portion 20a of the semiconductor fin 20 as channel regions.

Figure 12F:
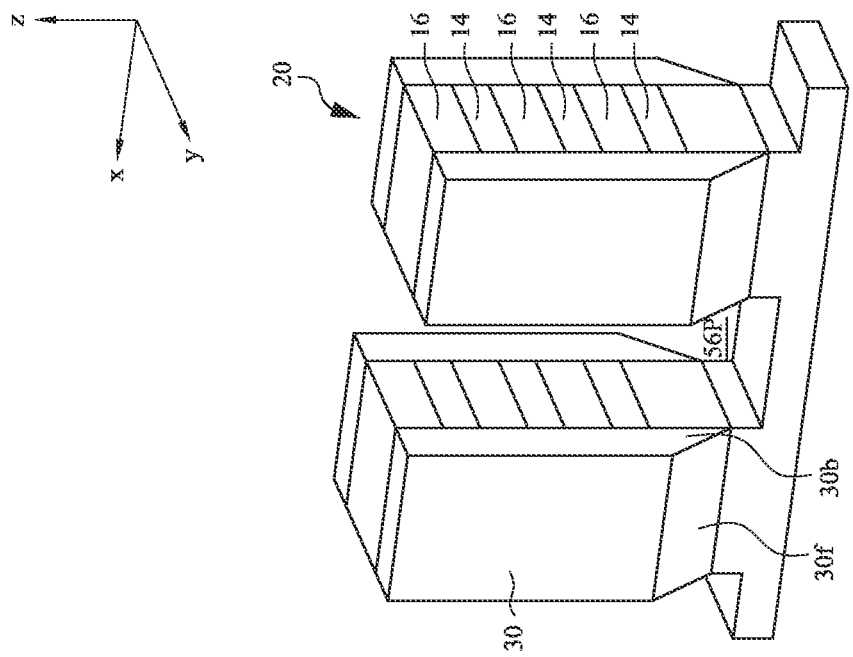
Figure 12E:
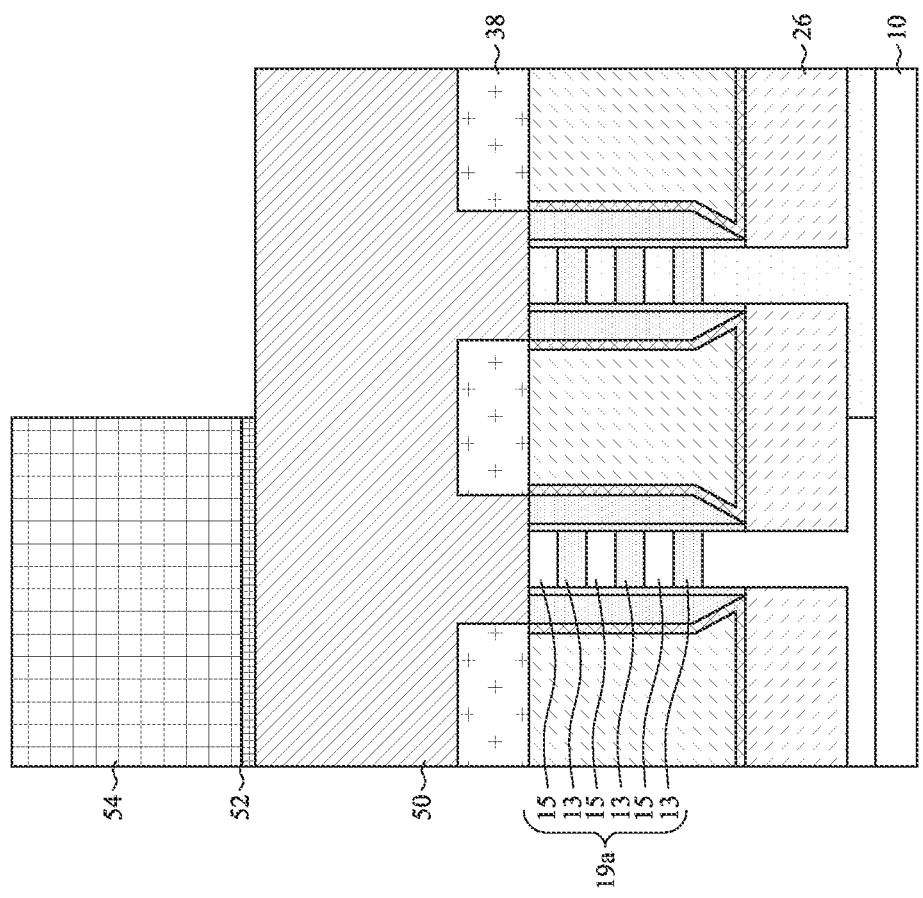

FIG. 12F is a partial perspective view of the semiconductor fin 20 and the cladding layer 30 after formation of the source/drain recesses 56p. The source/drain recess 56p extends beyond the cladding layer 30. The sloped sidewall 30f defines a facet region 30b at a lower end of the cladding layer 30 with gradually reduced thickness.

In operation 122, exposed ends of the third semiconductor layers 14 and the cladding layers 30 are etched to form spacer cavities 58c for inner spacers as shown in FIGS. 13A-13F. Prior to forming the spacer cavities 58c, the photoresist layer 54 may be removed exposing the patterned sacrificial liner 52 to protect regions over the p-well 11.

The first semiconductor layers 14 and cladding layer 30 exposed to the source/drain recesses 56p are first etched horizontally along the X direction to form cavities. In some embodiments, the first semiconductor layers 14 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, an etching thickness T2 of the third semiconductor layer 14 and the cladding layer 30 is in a range between about 2 nm and about 10 nm along the X direction.

Figure 13B:
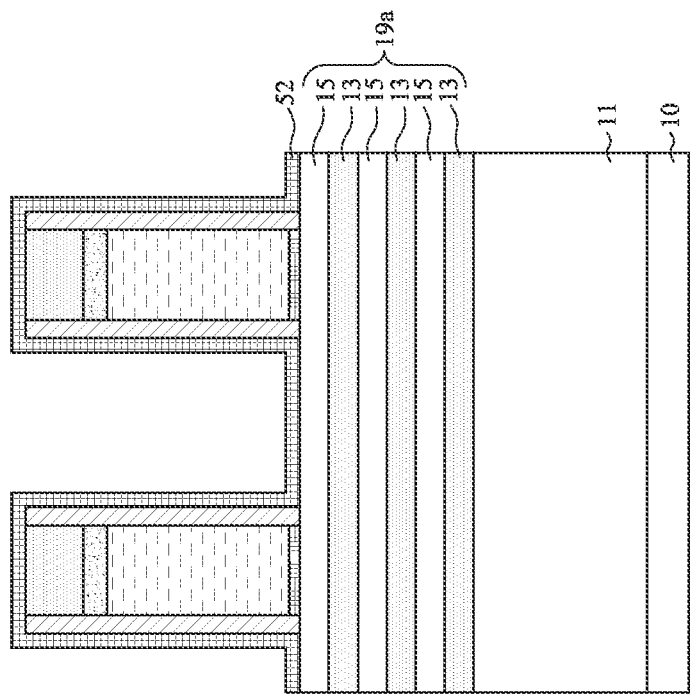
Figure 13A:
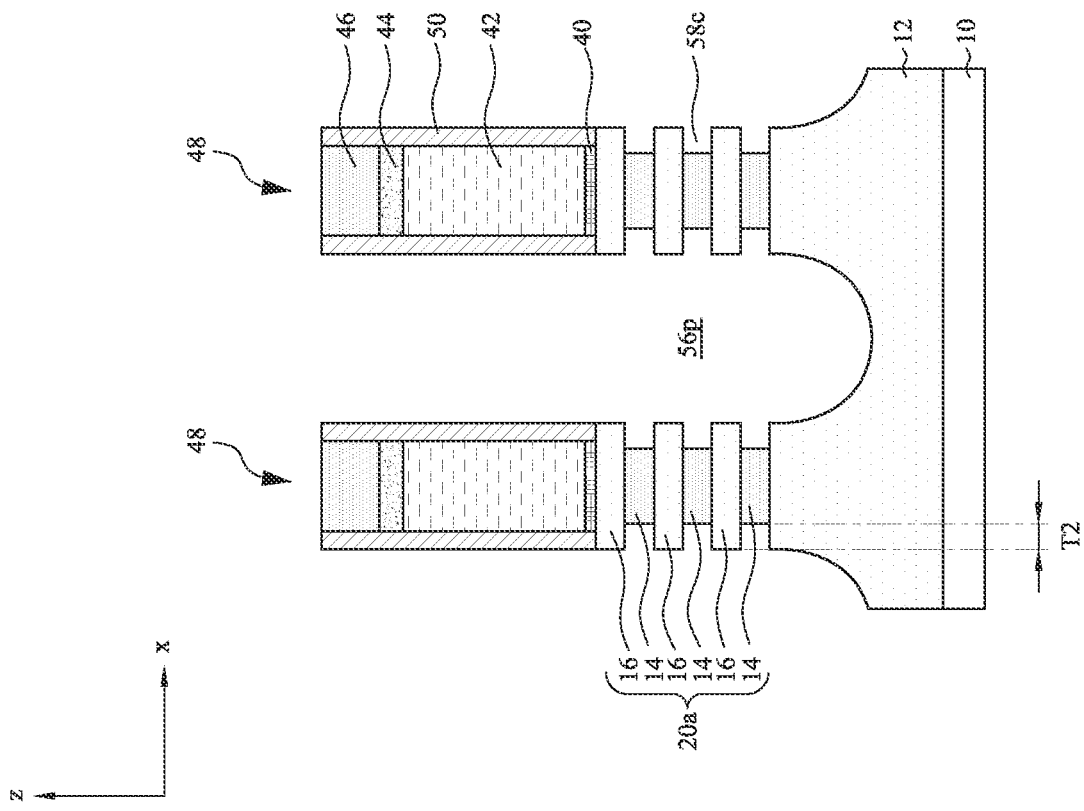
Figure 13D:
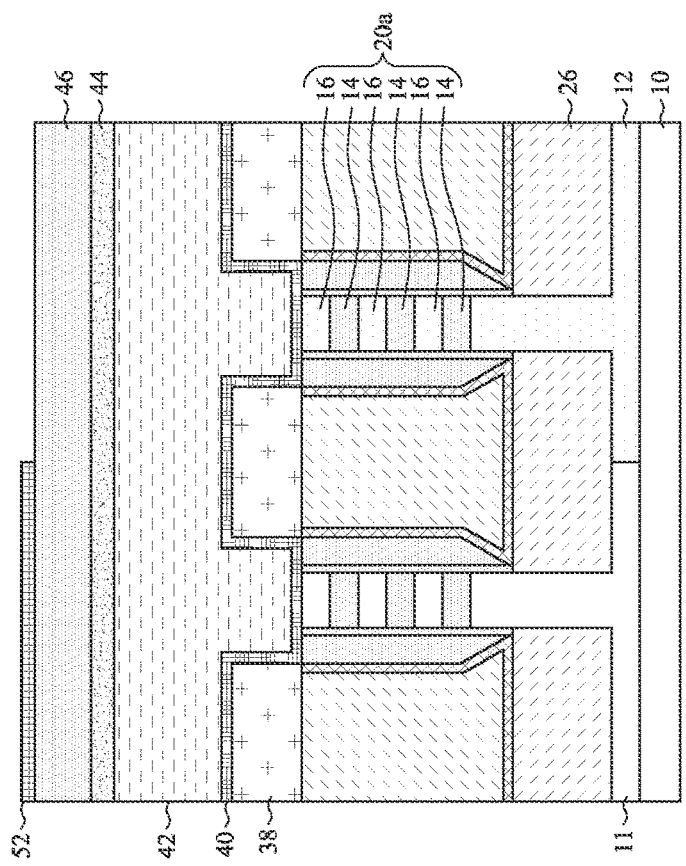
Figure 13C:
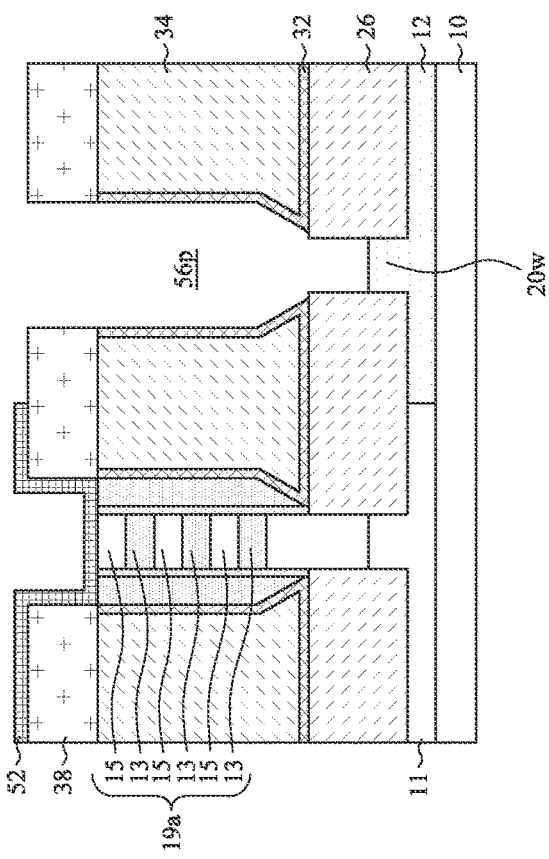
Figure 13F:
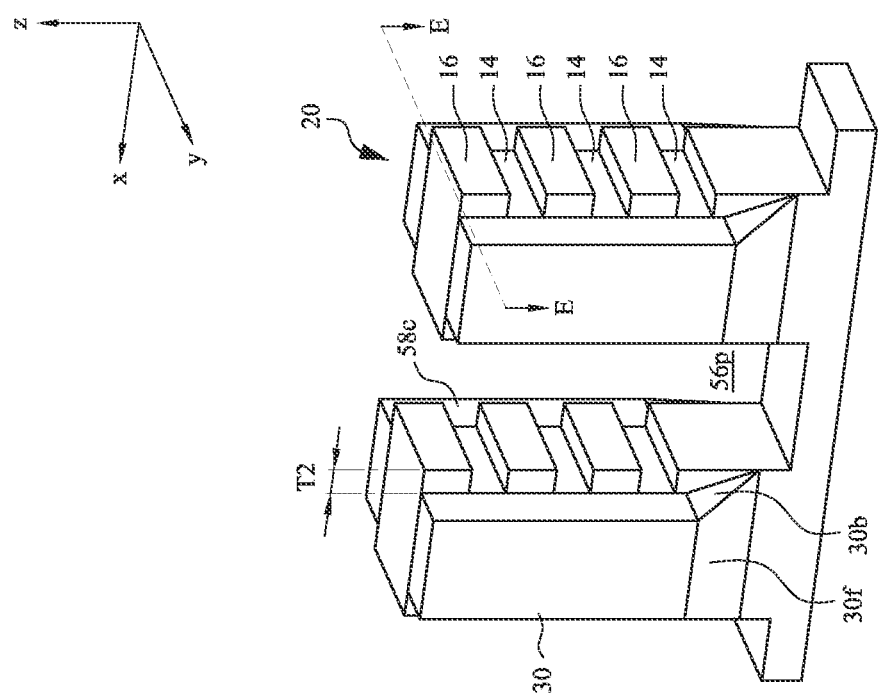
Figure 13E:
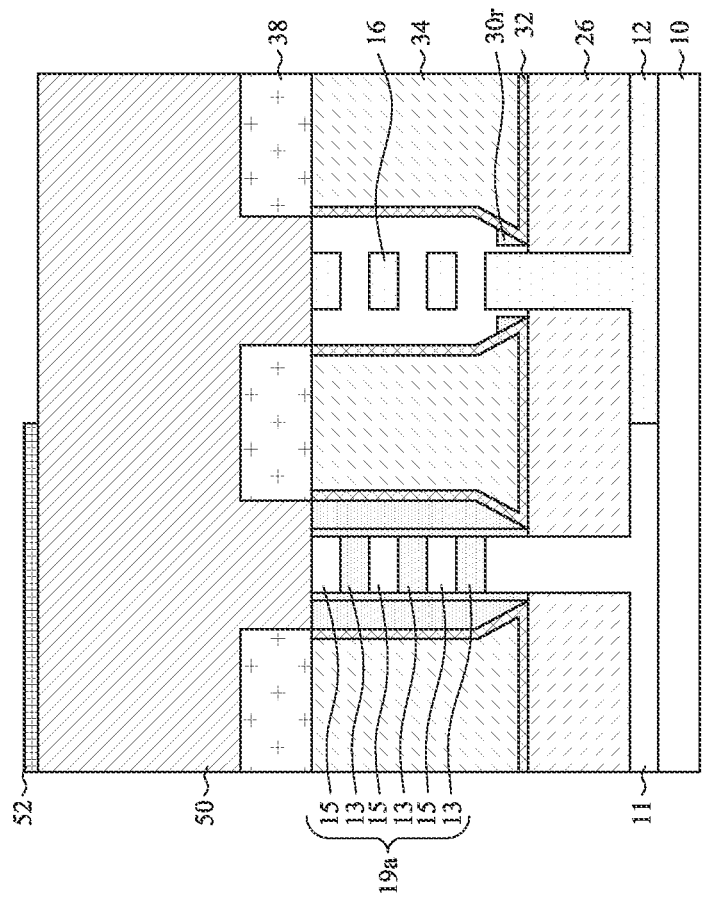
Figure 14B:
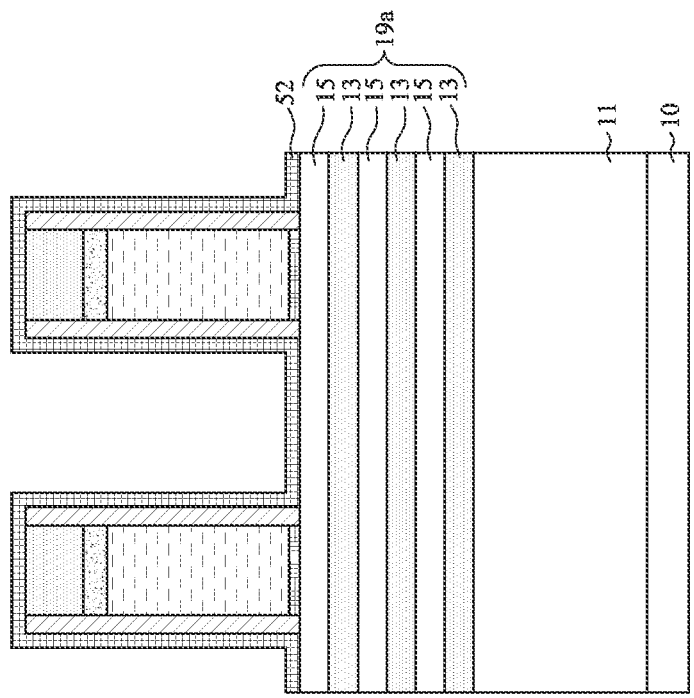
Figure 14A:
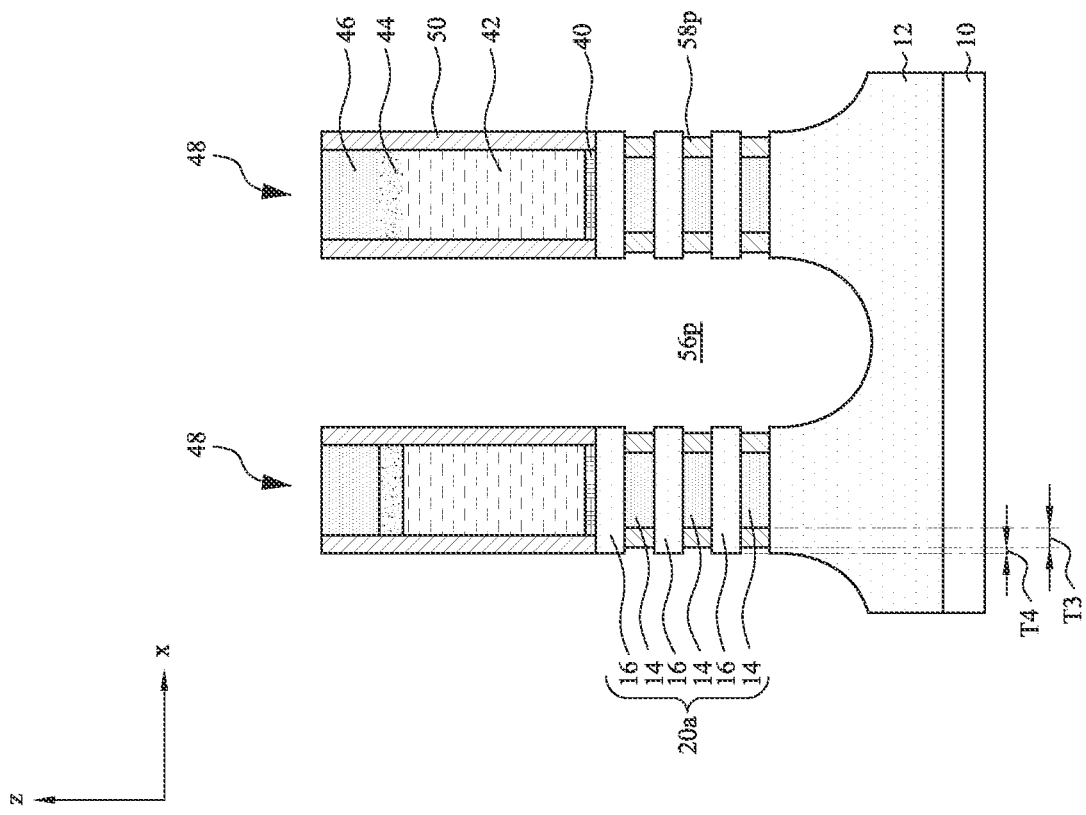
Figure 14C:
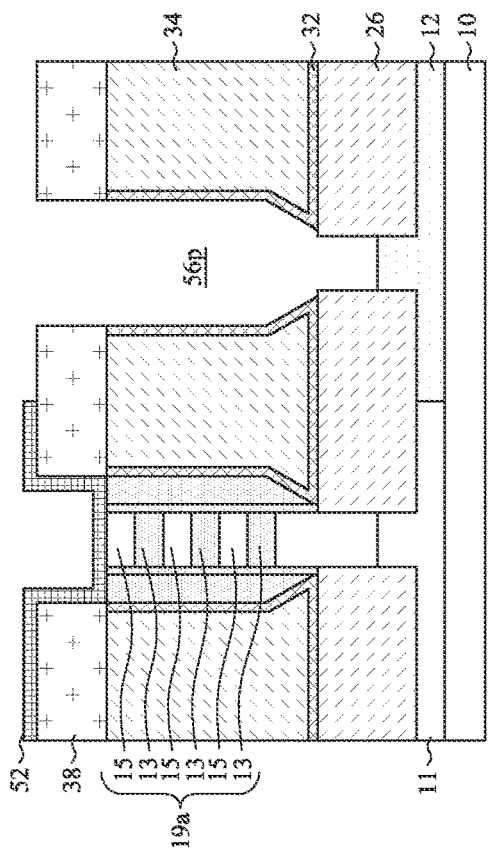
Figure 14D:
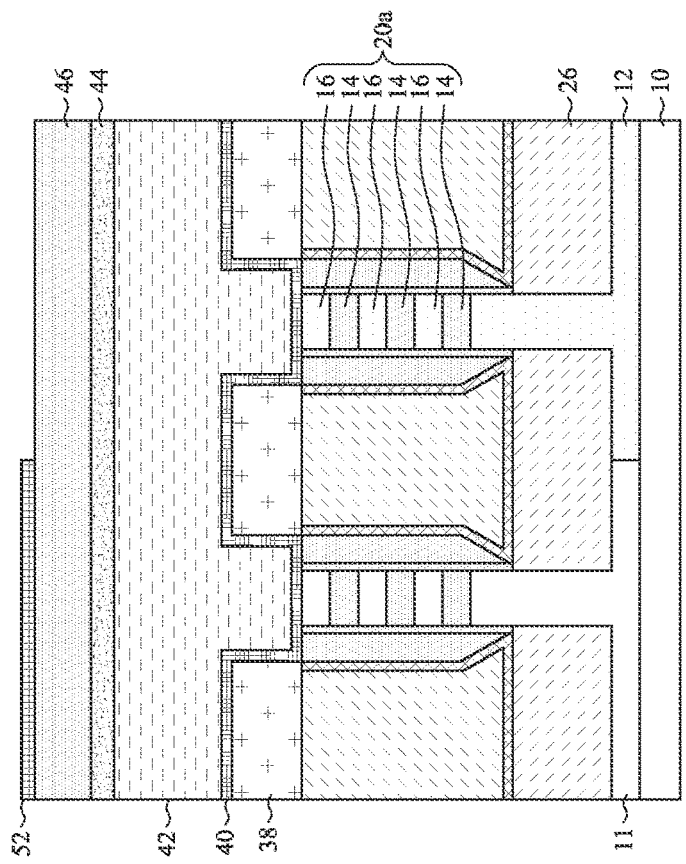
Figure 14E:
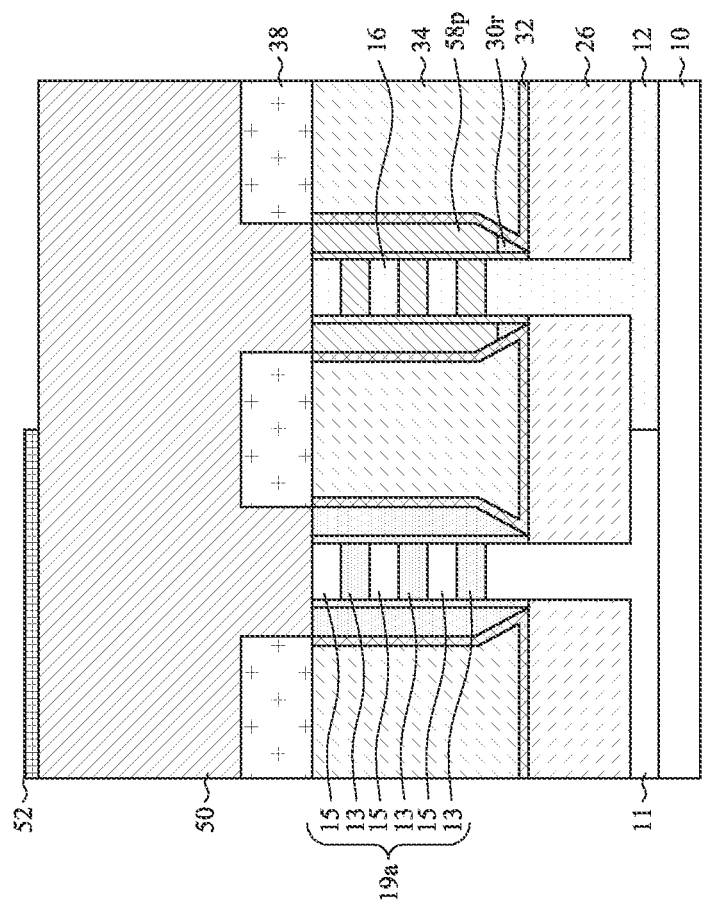
Figure 15D:
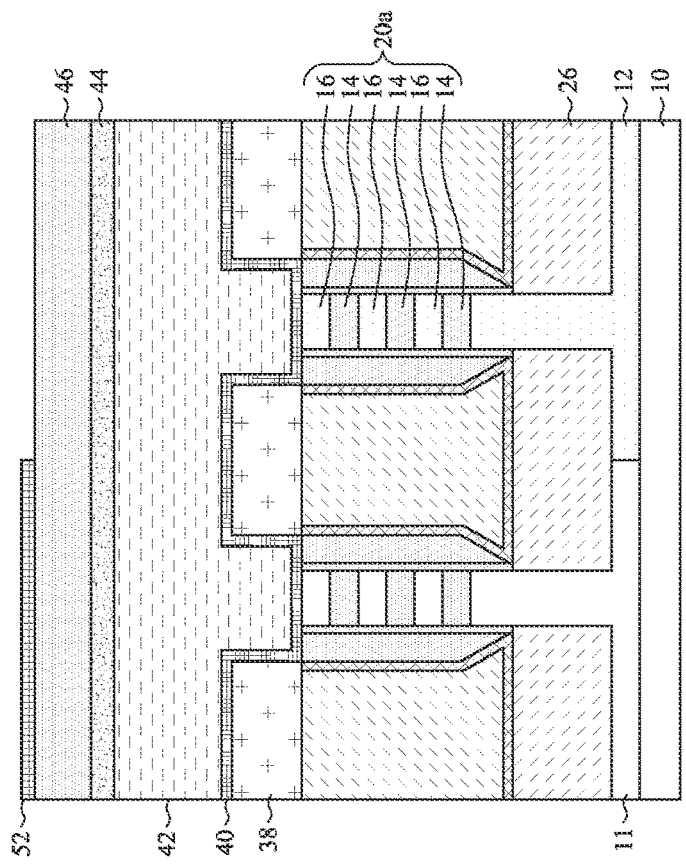
Figure 15C:
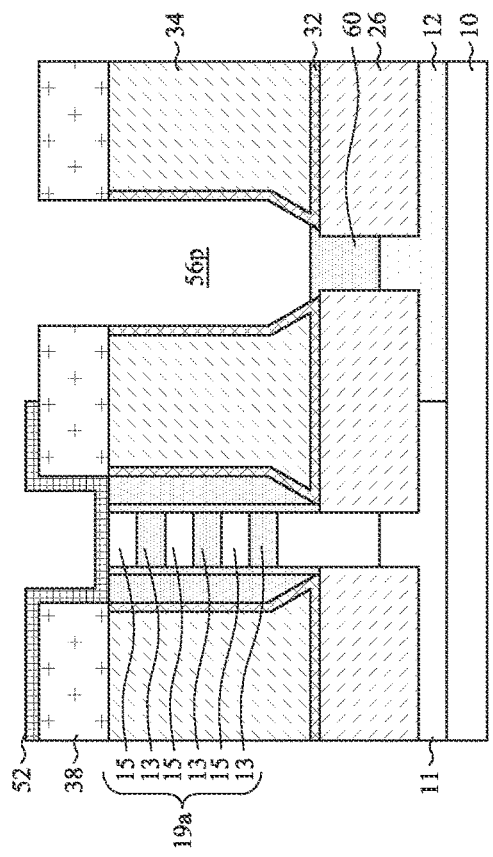
Figure 15E:
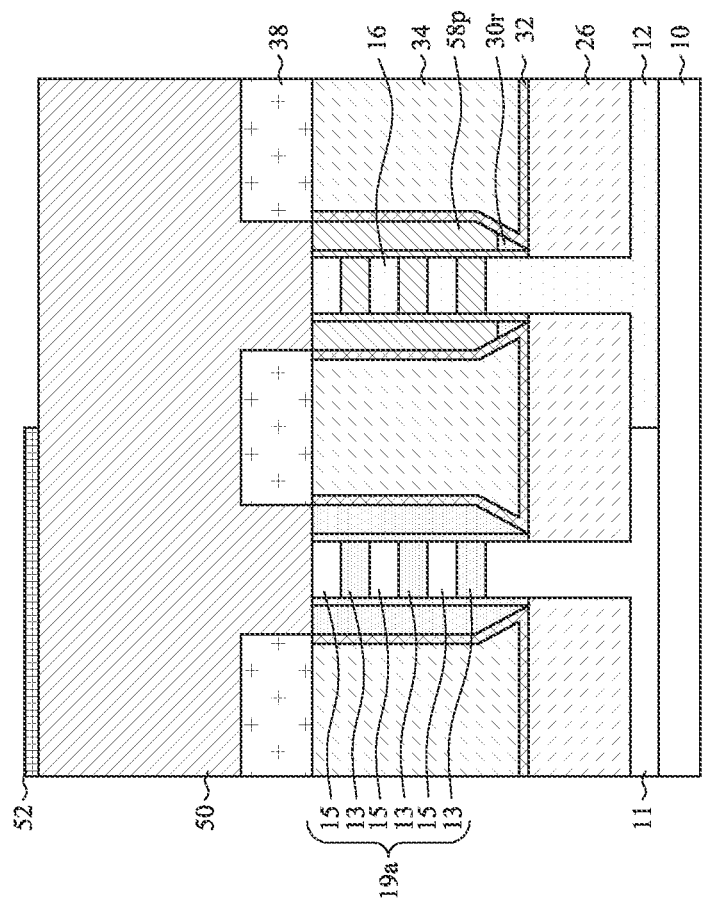
Figure 16B:
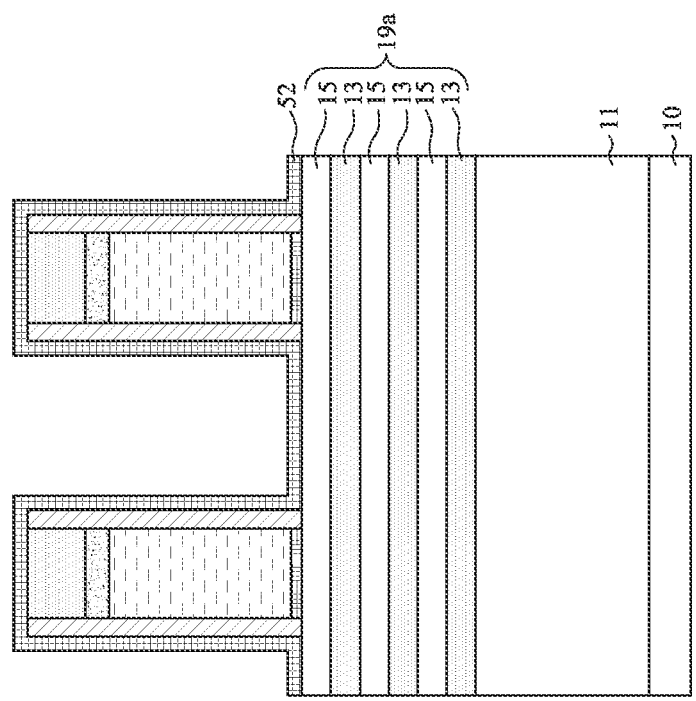
Figure 16A:
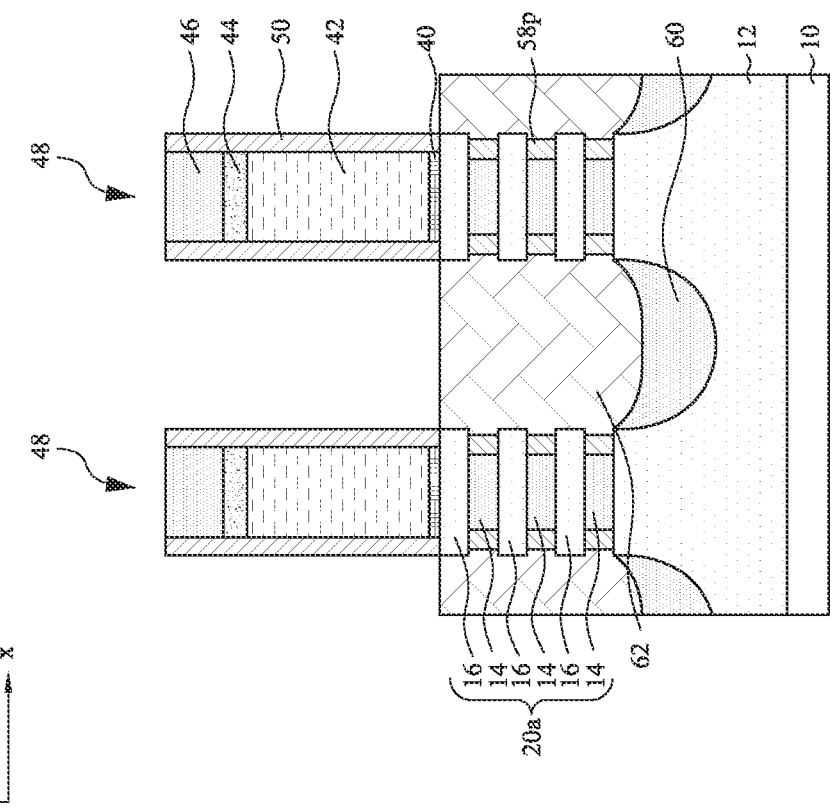
Figure 16D:
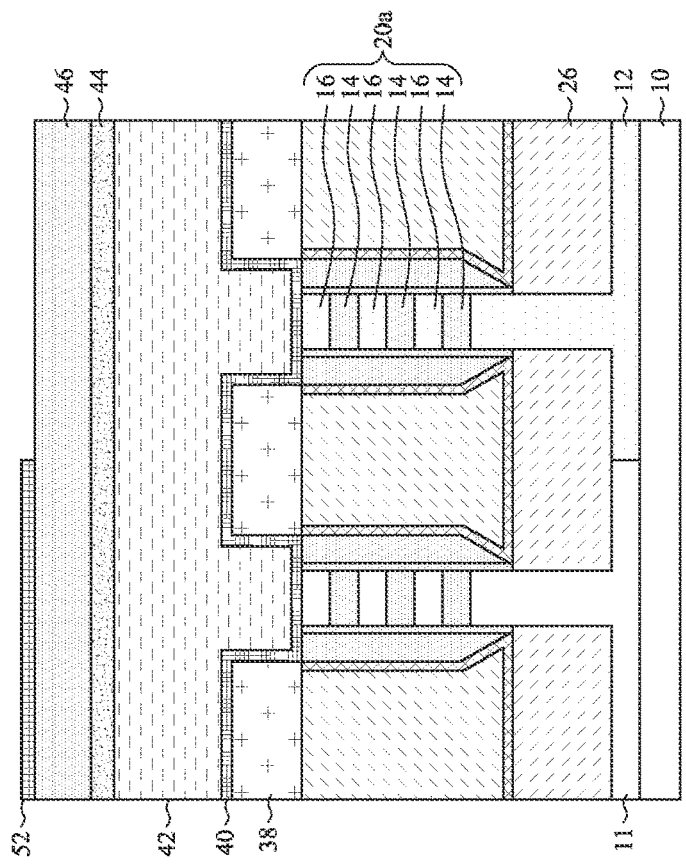
Figure 16C:
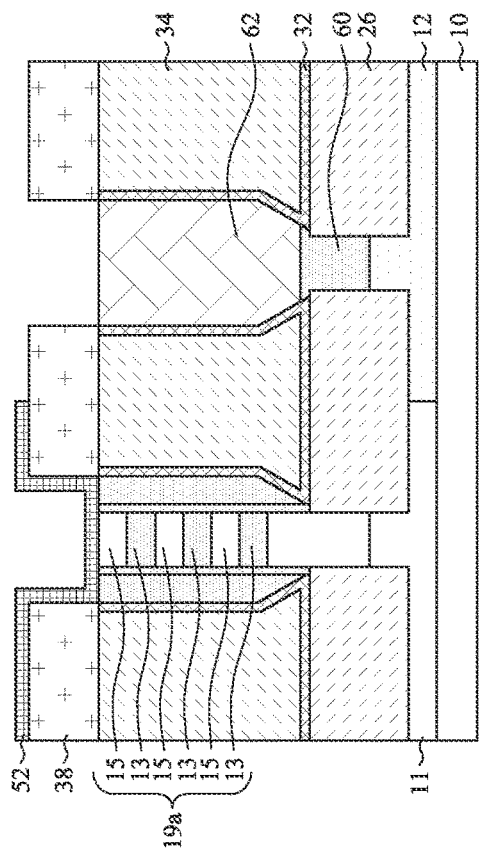
Figure 16E:
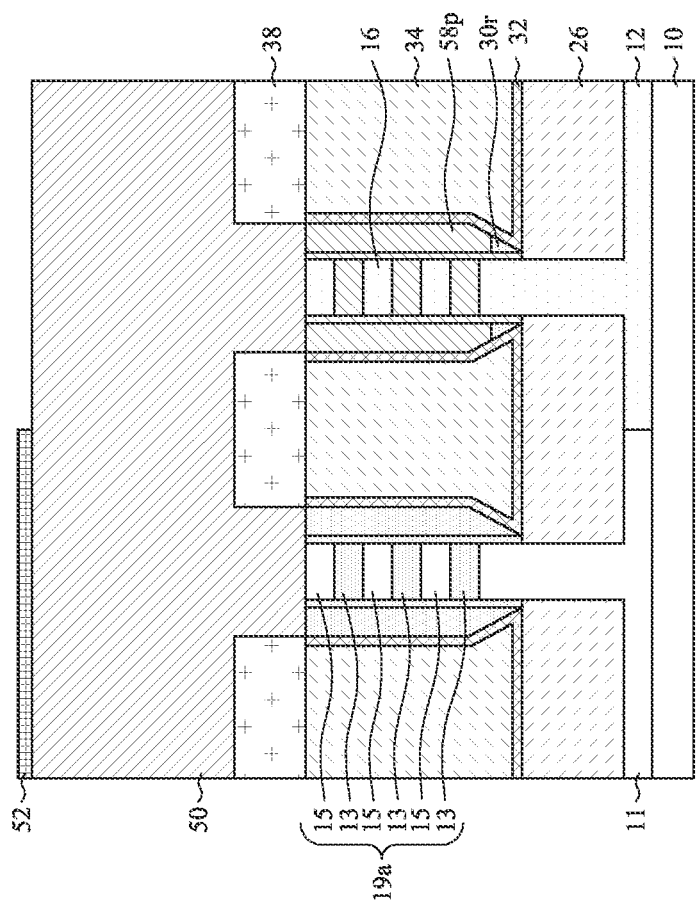
Figure 17B:
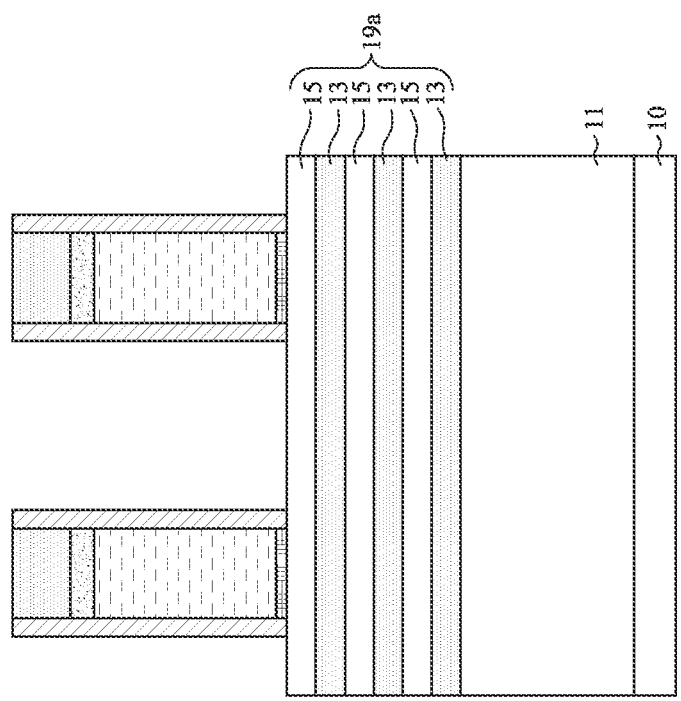
Figure 17A:
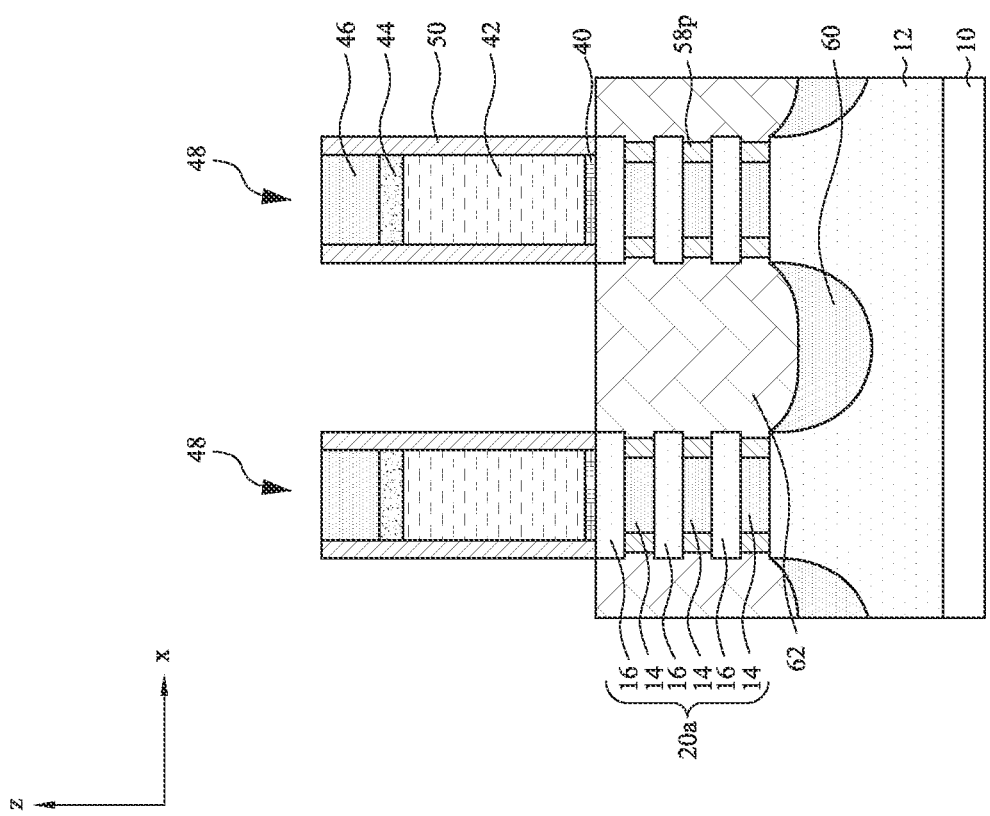
Figure 17D:
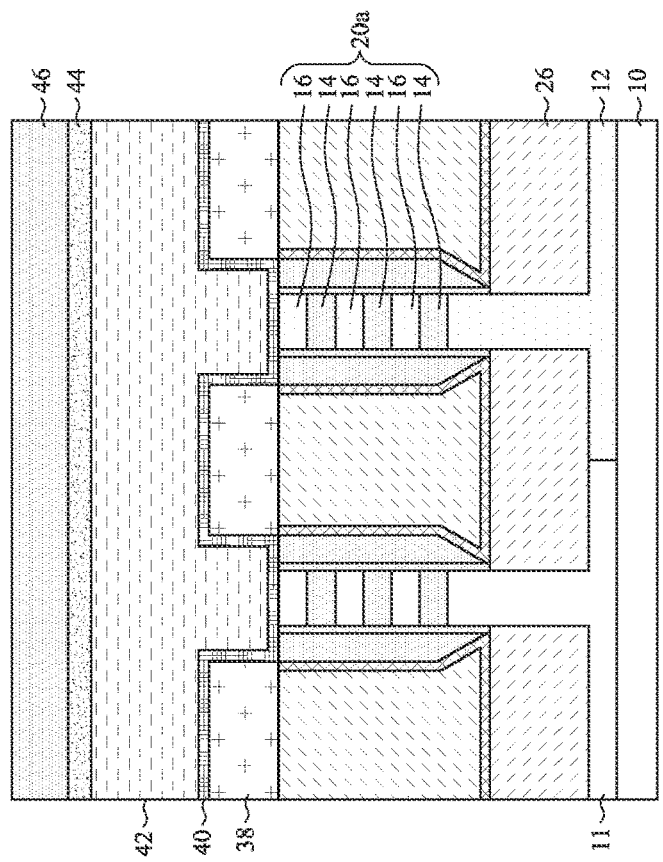
Figure 17C:
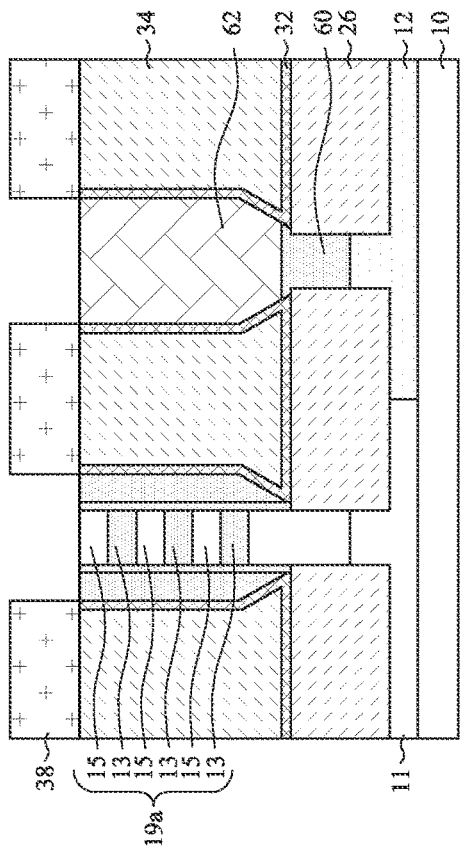
Figure 17E:
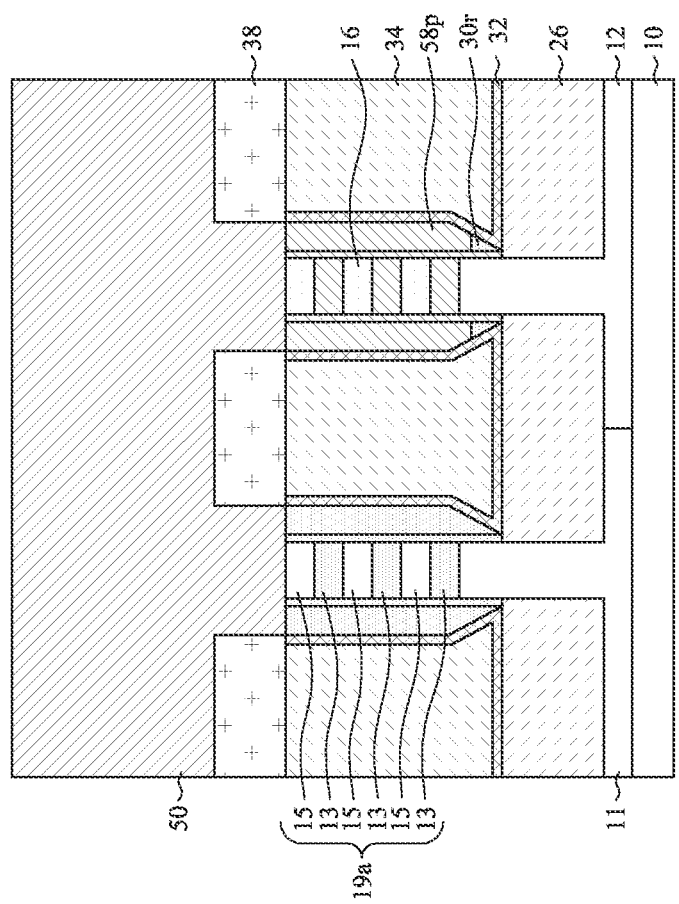

FIG. 13F is a partial perspective view of the semiconductor fin 20 and the cladding layer 30 after formation of spacer cavities 58c. As shown in FIG. 13F, the thickness of the facet region 30b of the cladding layer 30 gradually decreases along the Z direction. As a result of the gradually decreased thickness, the exposure of the cladding layer 30 in the facet region 30b also gradually reduces causing a gradually reduced etch rate along the Z direction. The etching thickness of the cladding layer 30 at the facet region 30b gradually decrease from T2 to 0. A residual portion 30r of the cladding layer 30 remains near the facet region 30b as shown in FIG. 13E.

In operation 124, inner spacers 58p are formed in the spacer cavities 58c, as shown in FIGS. 14A-14E. After forming the spacer cavities 58c by etching the third semiconductor layers 14 and the cladding layer 30, the inner spacers 58p are formed in the spacer cavities 58c by conformally deposit and then partially remove an insulating layer.

The insulating layer can be formed by ALD or any other suitable method. The subsequent etch process removes most of the insulating layer except inside the cavities, resulting in the inner spacers 58p. In some embodiments, the fourth semiconductor layer 16 may extend from the inner spacers 58p. In some embodiments, the inner spacers 58p may include one of silicon nitride (SiN) and silicon oxide ($SiO_2$), SiONC, or a combination thereof.

The inner spacers 58p have a thickness T3 along the X direction. In some embodiments, the thickness T3 of the inner spacers 58p is in a range from about 4 nm to about 7 nm. If the thickness T3 of the inner spacers 58p is thinner than 4 nm, the inner spacers 58p are not thick enough to insulate the source/drain features from the gate structure to be formed on either sides of the inner spacers 58p. If the thickness T3 of the inner spacers 58p is greater than 7 nm, the inner spacers 58p would take up too much channel length without provide additional advantages. In some embodiments, the fourth semiconductor layer 16 may extend from the inner spacers 58p at a length T4, as show in FIG. 14A. In some embodiments, the length T4 may be in a range between 0 nm and about 3 nm.

As shown in FIG. 13F, depth of the spacer cavities 58c near the facet region 30b gradually decrease from T2 to 0 along the Z direction. As a result, the thickness of the inner spacers 58p formed in the spacer cavities 58c near the facet region 30b also gradually decrease from T3 to 0 (as shown in FIG. 25F).

In operation 126, epitaxial features 60 are formed in the source/drain recesses 56p as shown in FIGS. 15A-15E. In some embodiments, the epitaxial features 60 are formed by epitaxially grown from the exposed well portion 20w of the semiconductor fin 20. The epitaxial feature 60 fills in the source/drain recess 56p in bottom up manner. An upper surface 60u of the epitaxial feature 60 reaches and in contact with the inner spacers 58p. In some embodiments, the upper surface 60u of the epitaxial feature 60 is at substantially the same level of an upper surface 12u of the n-well 12.

The epitaxial features 60 may be formed by CVD epitaxy, molecular beam epitaxy (MBE), or any suitable deposition technique. The epitaxial feature 60 may be formed from a semiconductor material with a different oxidation rate and/or a different etch rate than the cladding layer 30 and the third semiconductor layer 14 to allow the cladding layer 30 and the third semiconductor layer 14 to be selectively removed during replacement process. In some embodiments, the epitaxial features 60 include a un-doped or low doped epitaxial silicon. In other embodiments, the epitaxial features 60 are a undoped or substantially dopant-free silicon layer. For example, the epitaxial feature 60 is a undoped or substantially dopant-free silicon layer having an intrinsic dopant concentration in a range from about 0 atoms/$cm^3$ to about 1E17 atoms/$cm^3$.

In some embodiments, the epitaxial features 60 is a low doped epitaxial silicon with a p-type dopant at a dopant concentration lower than the corresponding epitaxial source/drain features. For example, the epitaxial features 60 has a p-type dopant at a dopant concentration in a range from 0 to about 5E17 atoms/$cm^3$. A dopant concentration greater than 5E17 atoms/$cm^3$ may induce current leakage in mesa devices.

In operation 128, epitaxial source/drain features 62 for p-type devices are formed in the source/drain recesses 56p, as shown in FIGS. 16A-16E. The epitaxial source/drain features 62 are formed over the epitaxial features 60 from the upper surface 60u of the epitaxial feature 60 and within the source/drain recesses 56p. The upper surface 60u of the epitaxial feature 60 becomes the interface between the epitaxial source/drain feature 62 and the epitaxial feature 60. The upper surface 60u is at a level that reaches at the inner spacers 58p. The upper surface 60u extends across the epitaxial source/drain feature 62 and intersects the inner spacers 58p. Thus, the epitaxial features 60 ensure lower ends of the epitaxial source/drain features 62 have the protection of the inner spacer 58p. The epitaxial source/drain features 62 are formed by an epitaxial growth method using CVD, ALD or molecular beam epitaxy (MBE). The epitaxial source/drain features 62 may include one or more layers of Si, SiGe, Ge for a p-type device, such as pFET. The epitaxial source/drain features 62 also include p-type dopants, such as boron (B). In some embodiments, the epitaxial source/drain features 62 may have a dopant concentration of between about 5E18 atoms*$cm^{-3}$ and about 1E20 atoms*$cm^{-3}$. After formation of the p-type epitaxial source/drain features 62, the sacrificial liner 52 is removed for n-type device processing, as shown in FIGS. 17A-17E.

Figure 18B:
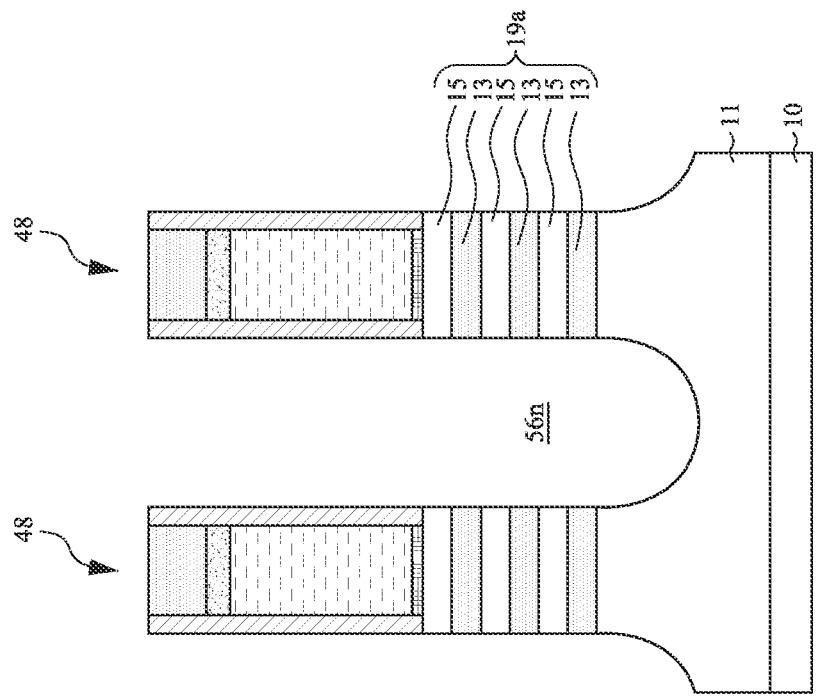
Figure 18A:
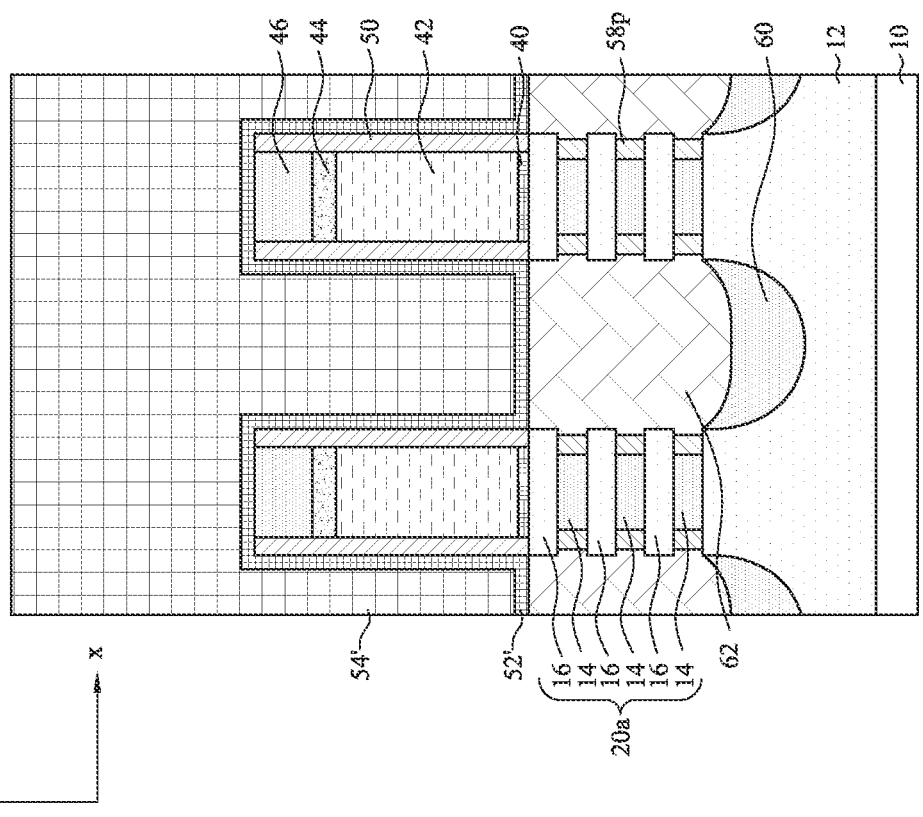
Figure 18D:
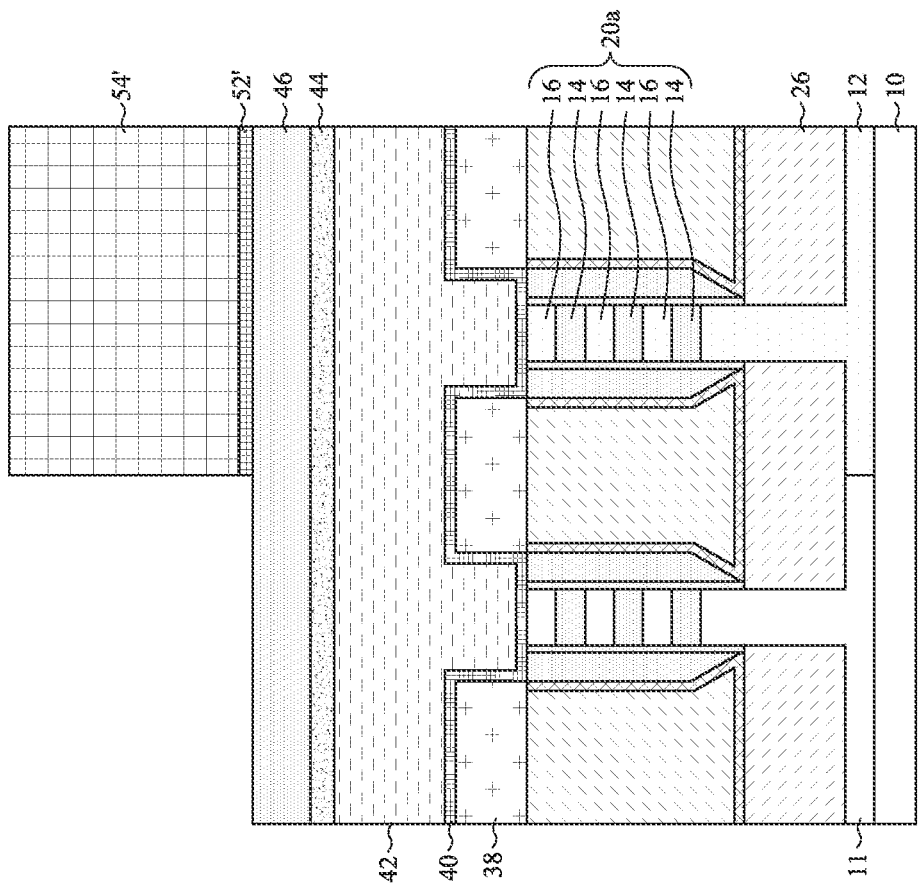
Figure 18C:
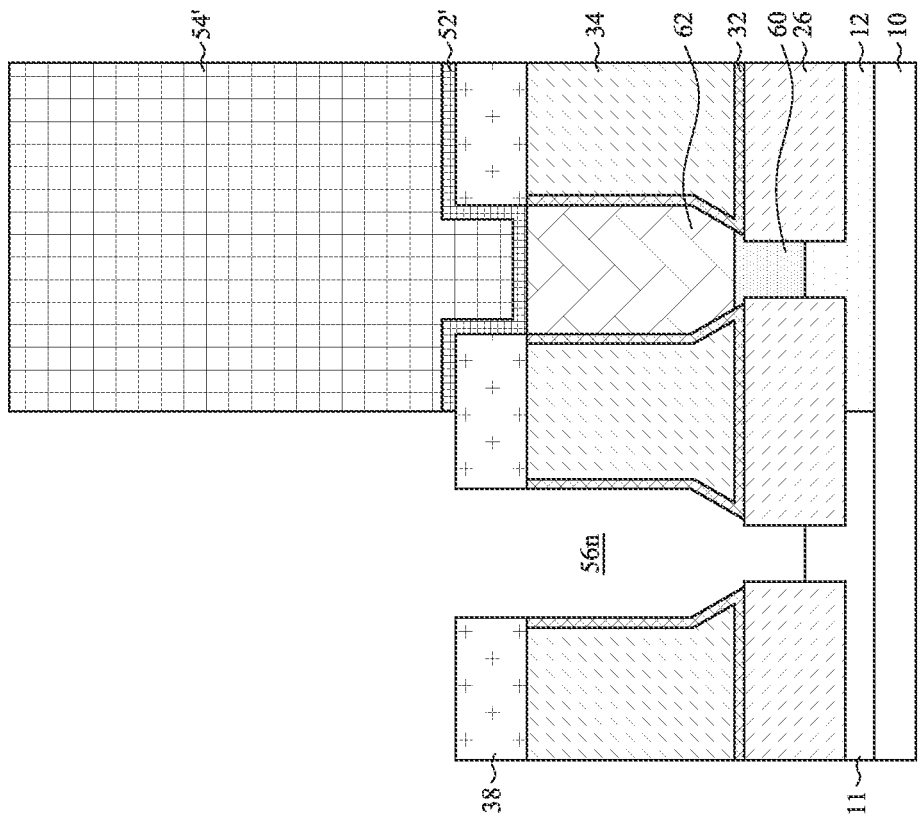
Figure 18E:
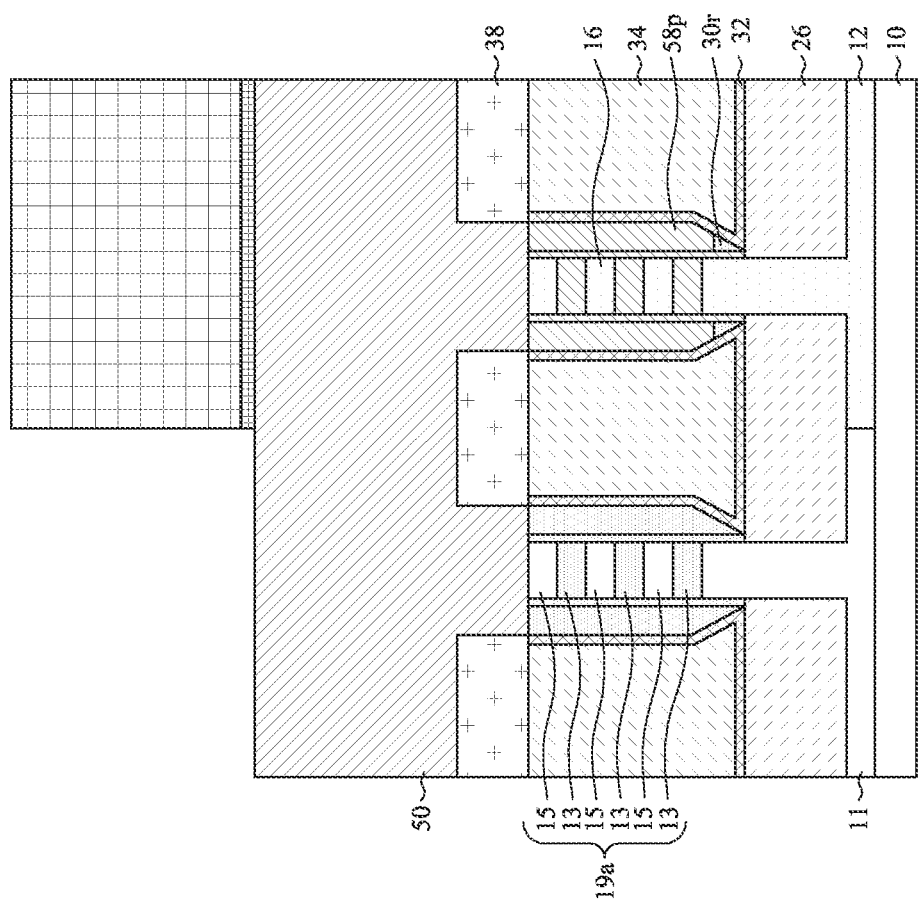
Figure 19A:
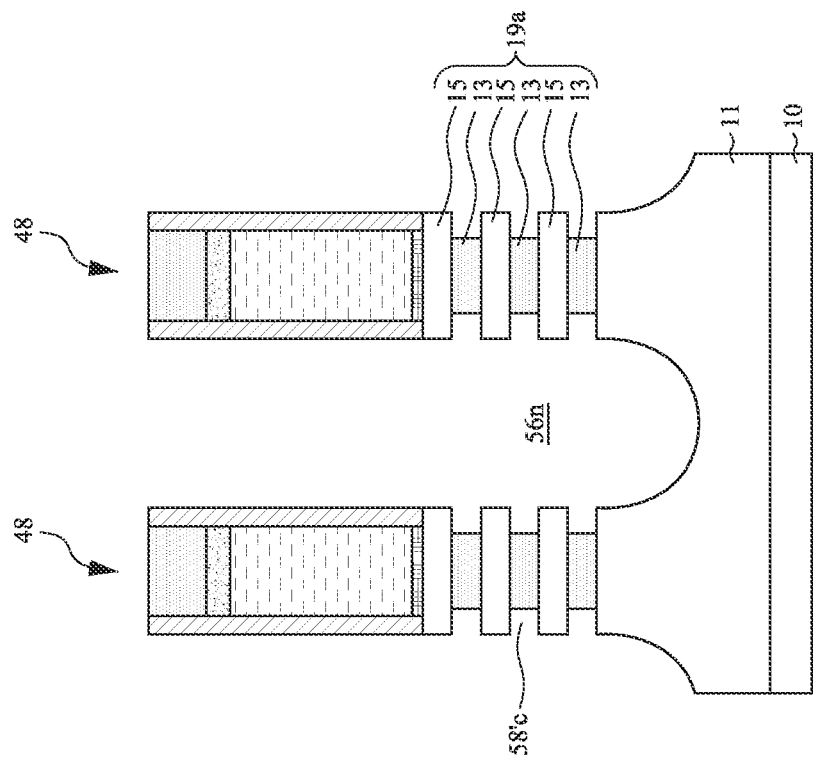
Figure 19B:
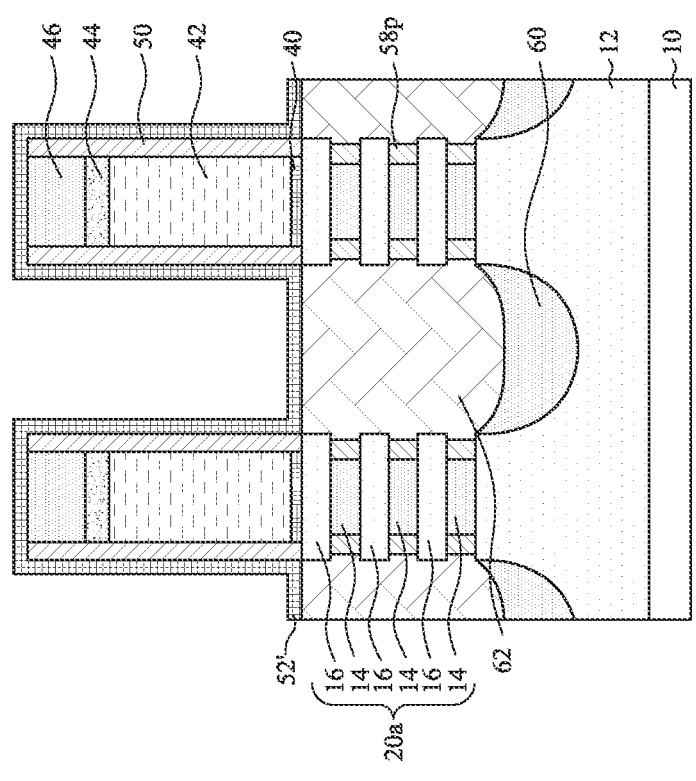
Figure 19D:
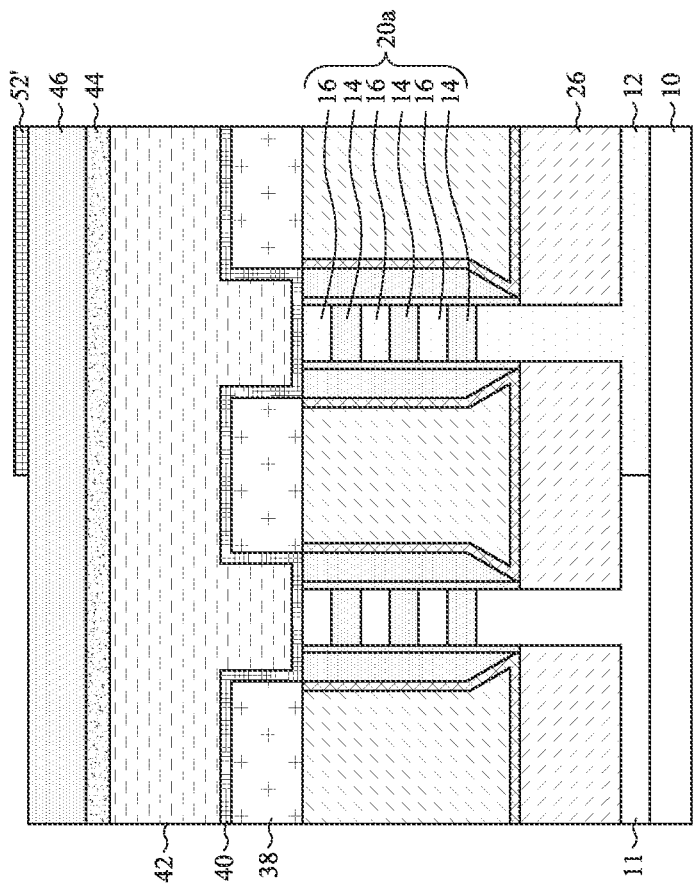
Figure 19C:
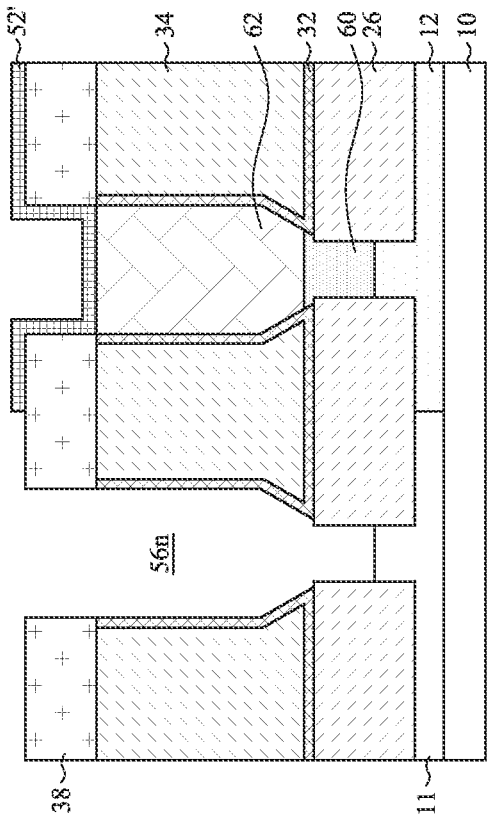
Figure 19E:
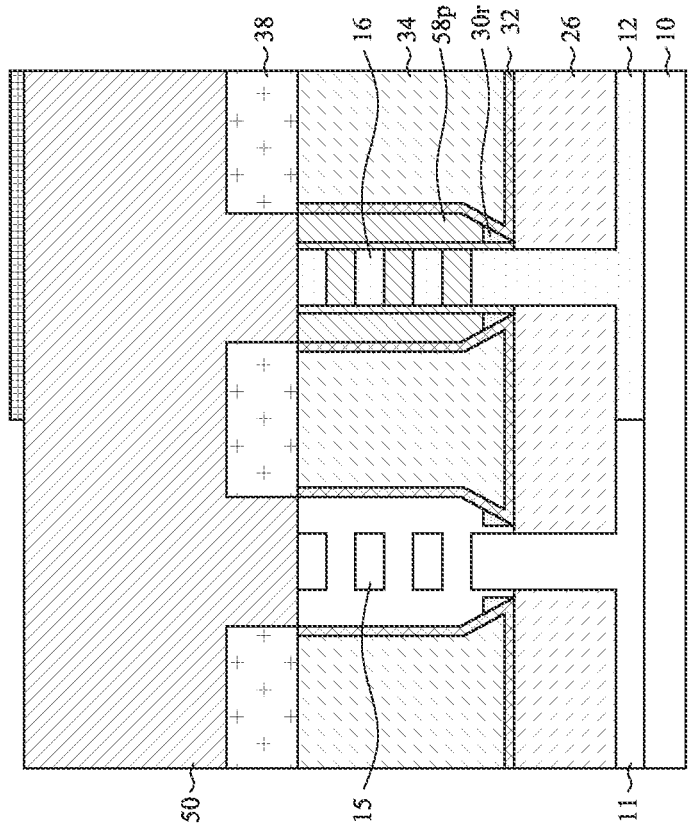
Figure 20B:
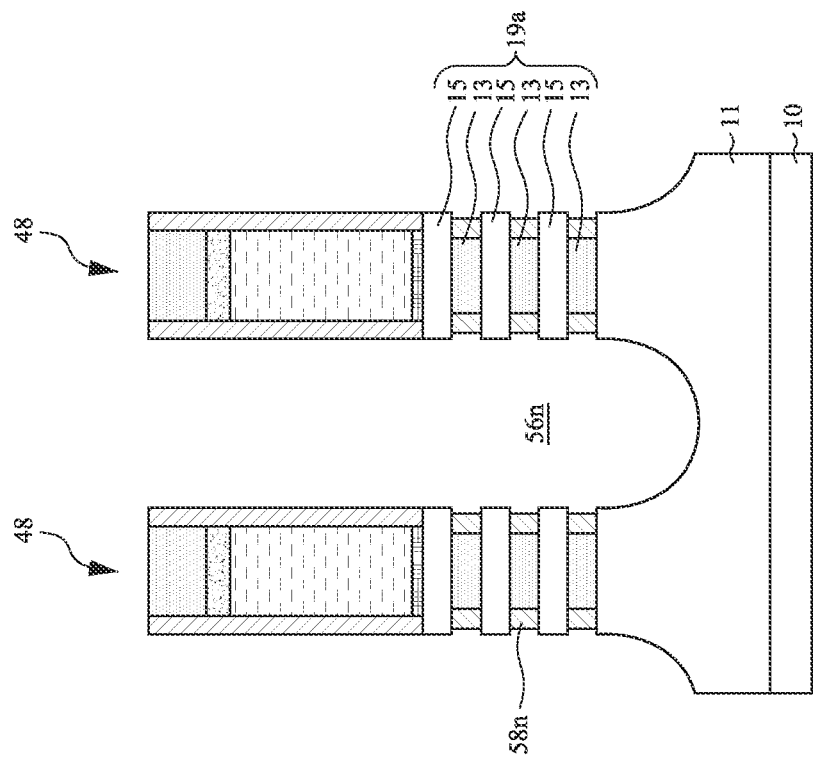
Figure 20A:
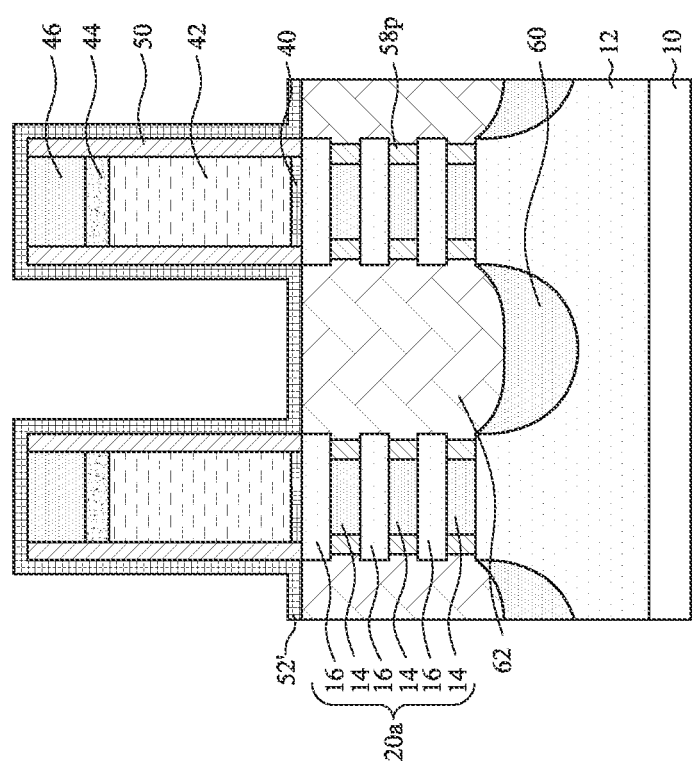
Figure 20D:
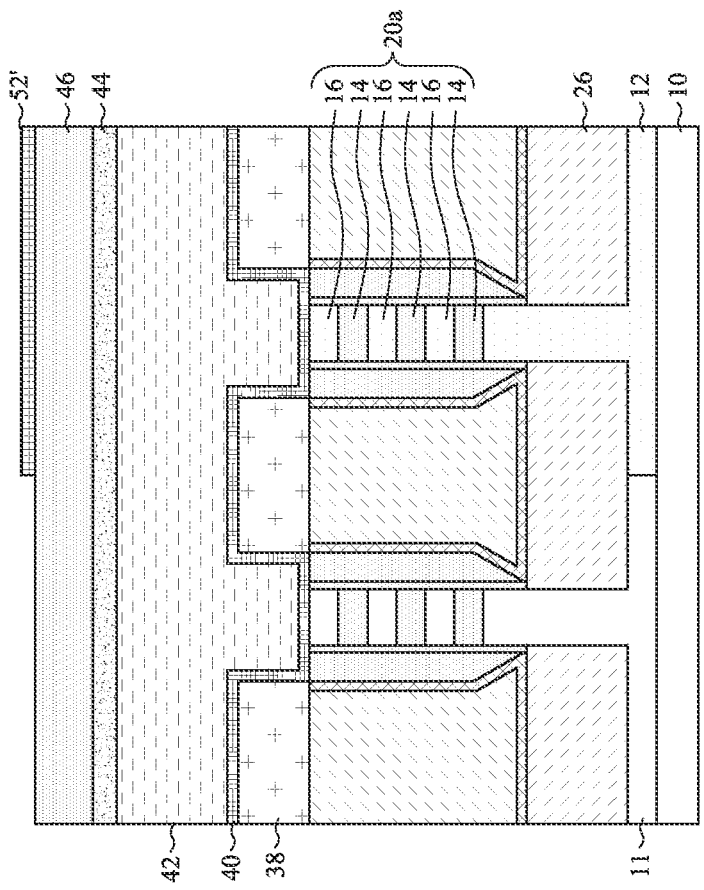
Figure 20C:
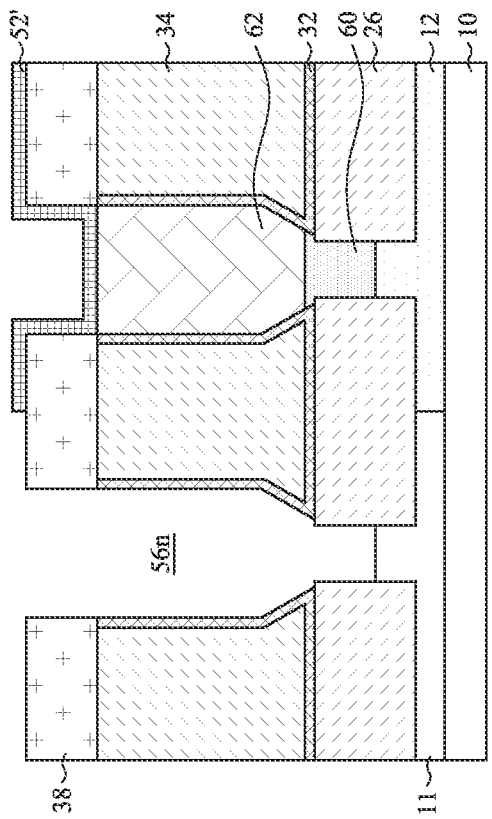
Figure 20E:
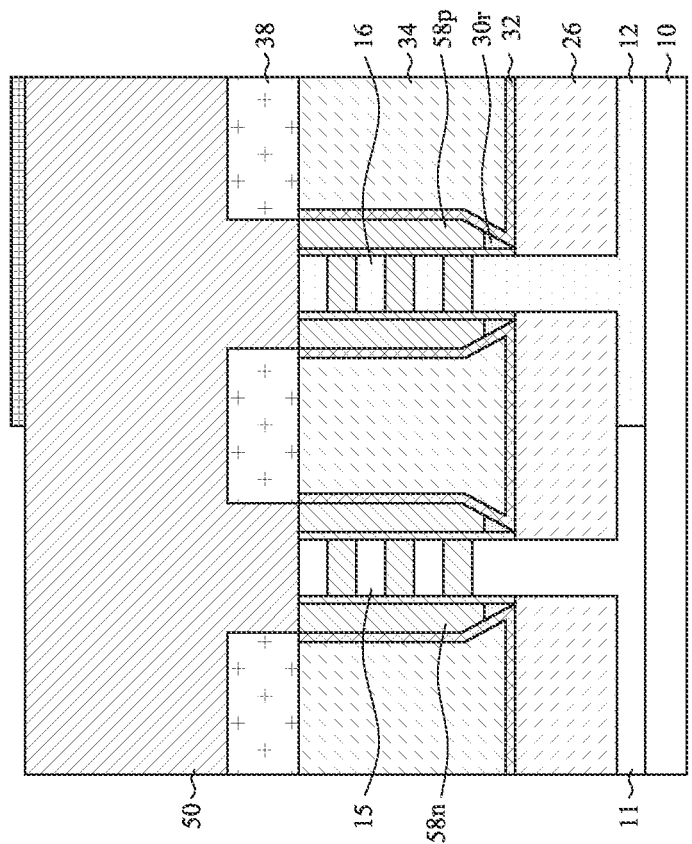
Figure 21B:
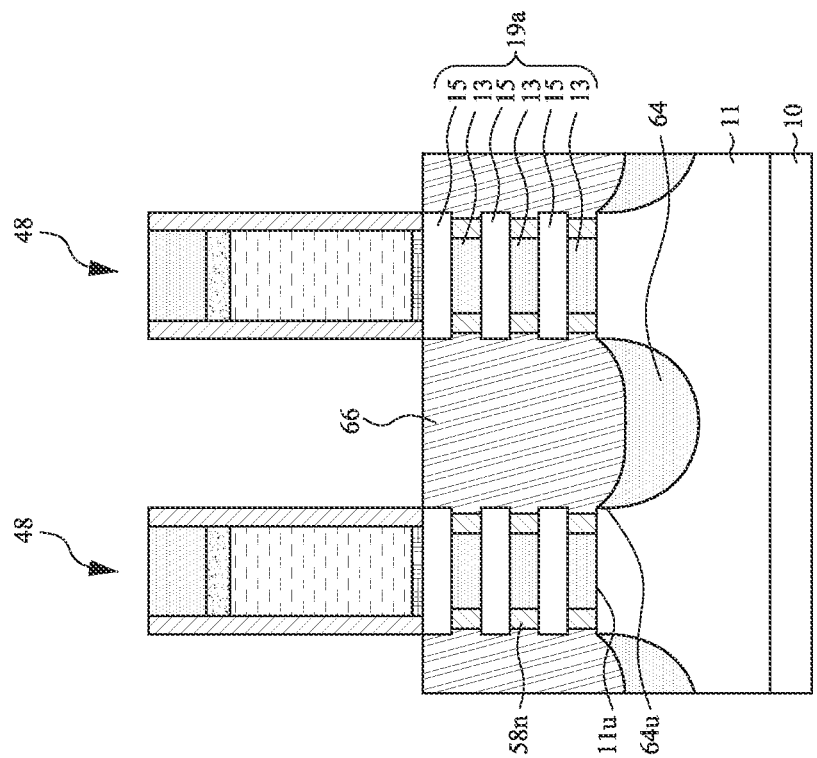
Figure 21A:
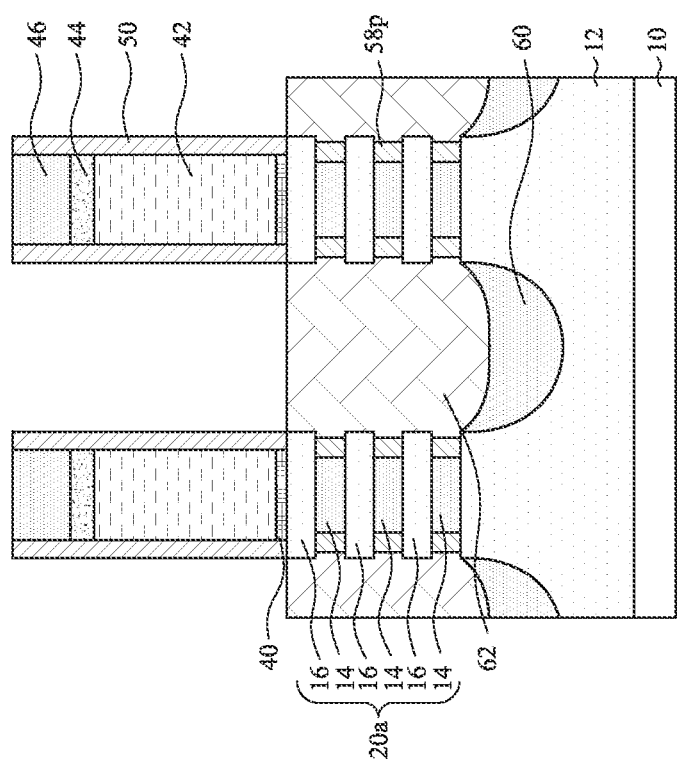
Figure 21D:
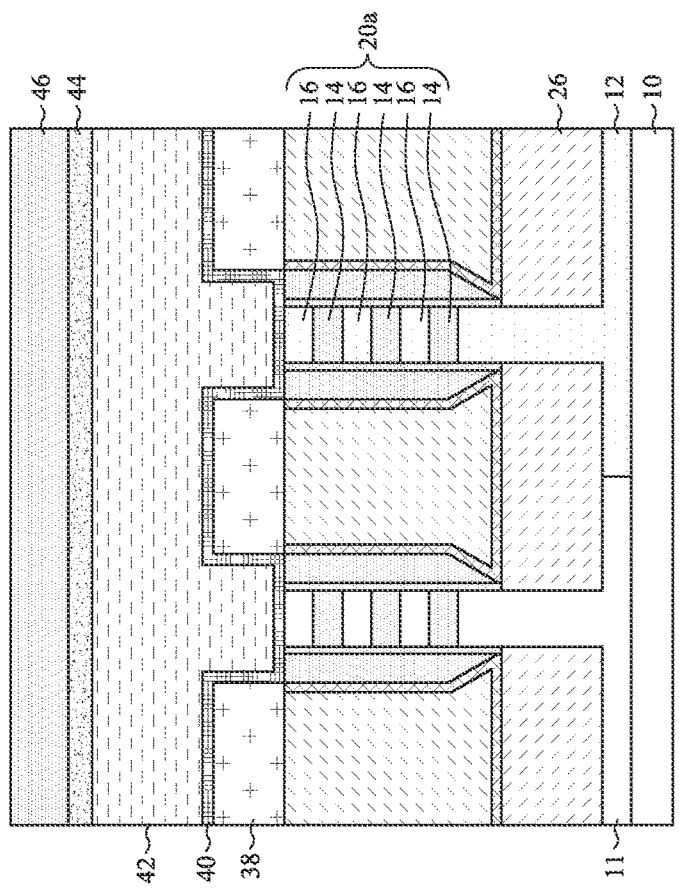
Figure 21C:
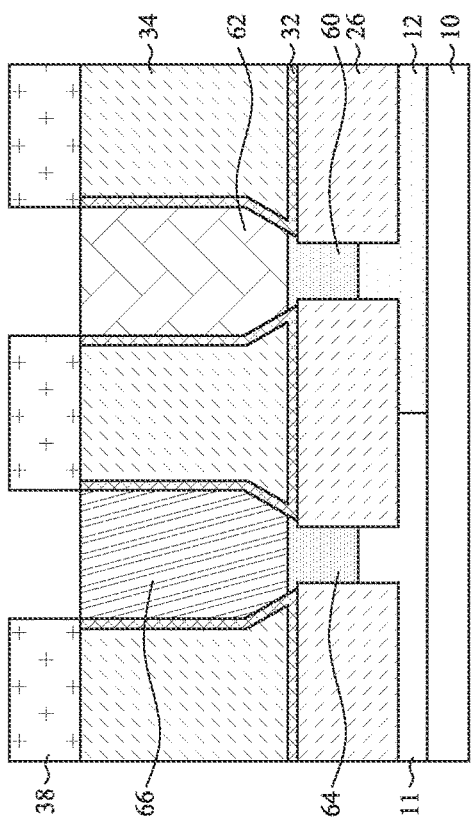
Figure 21E:
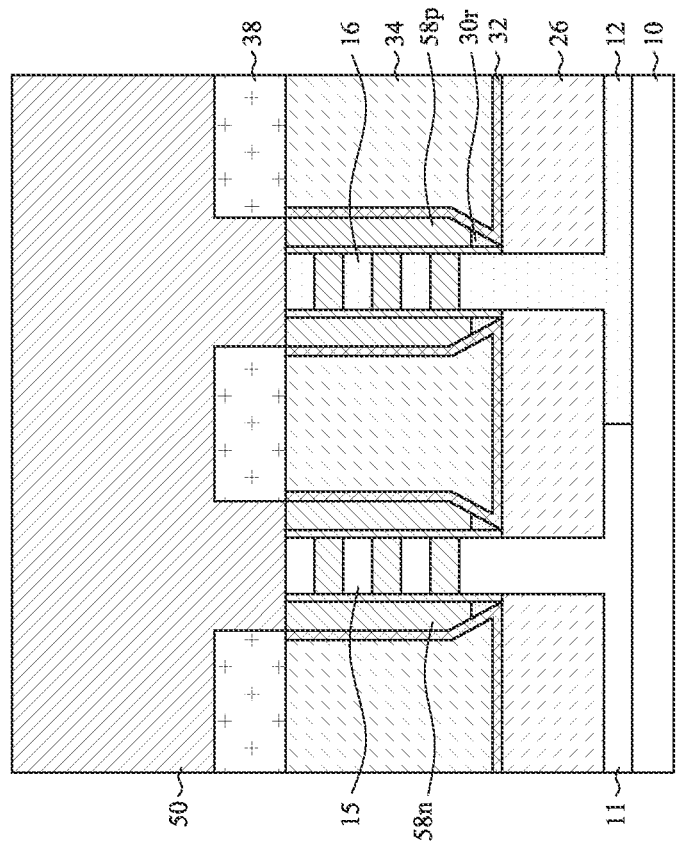
Figure 22B:
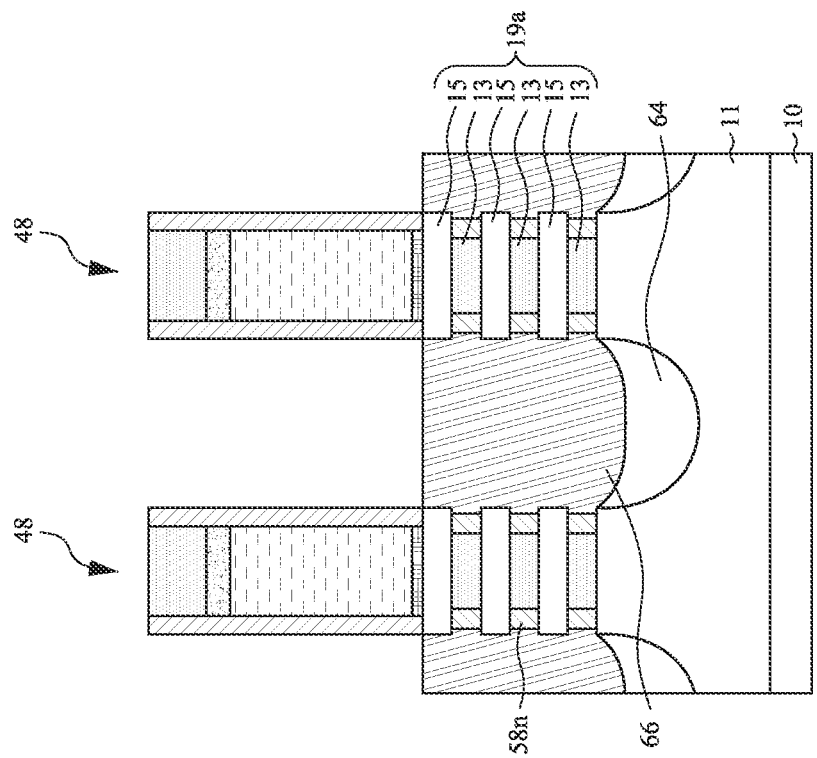
Figure 22A:
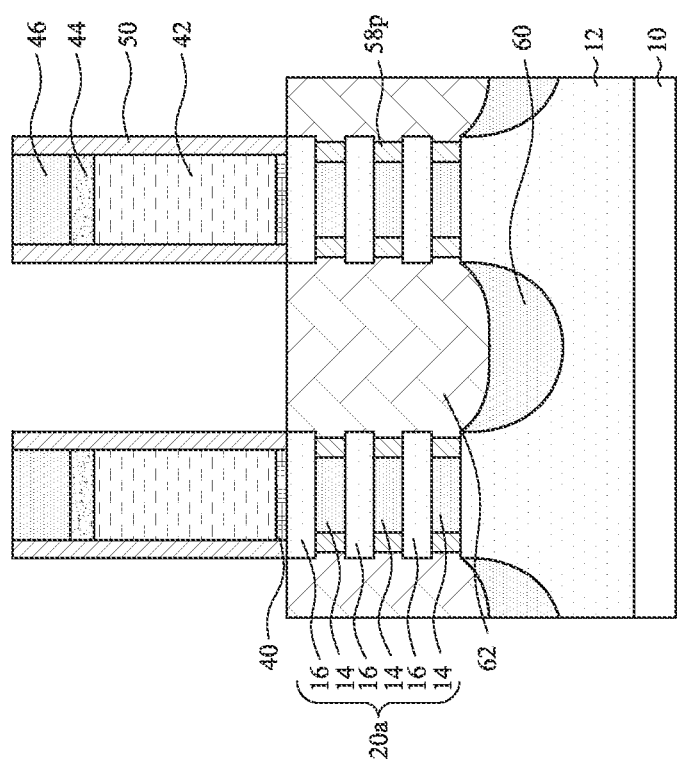
Figure 22C:
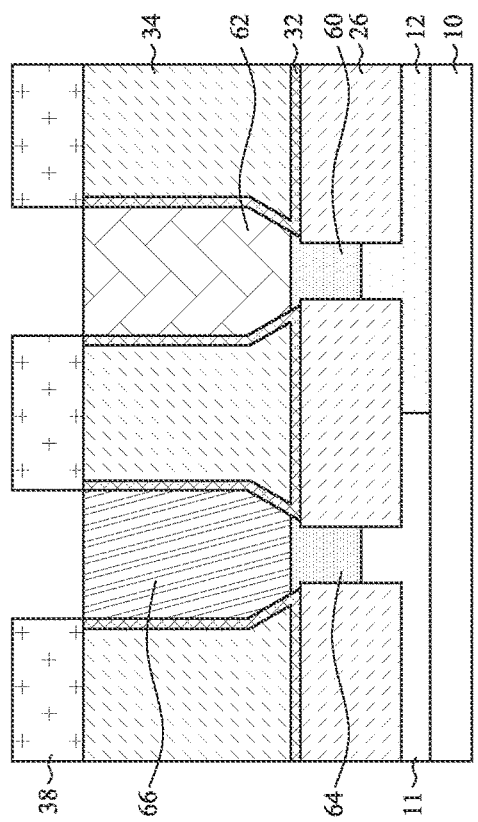
Figure 22D:
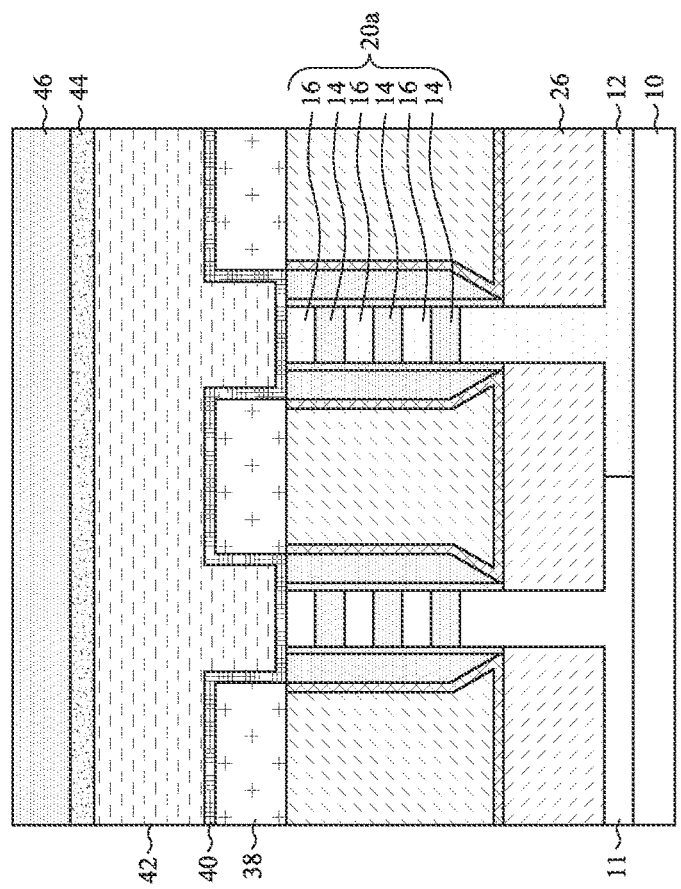
Figure 22E:
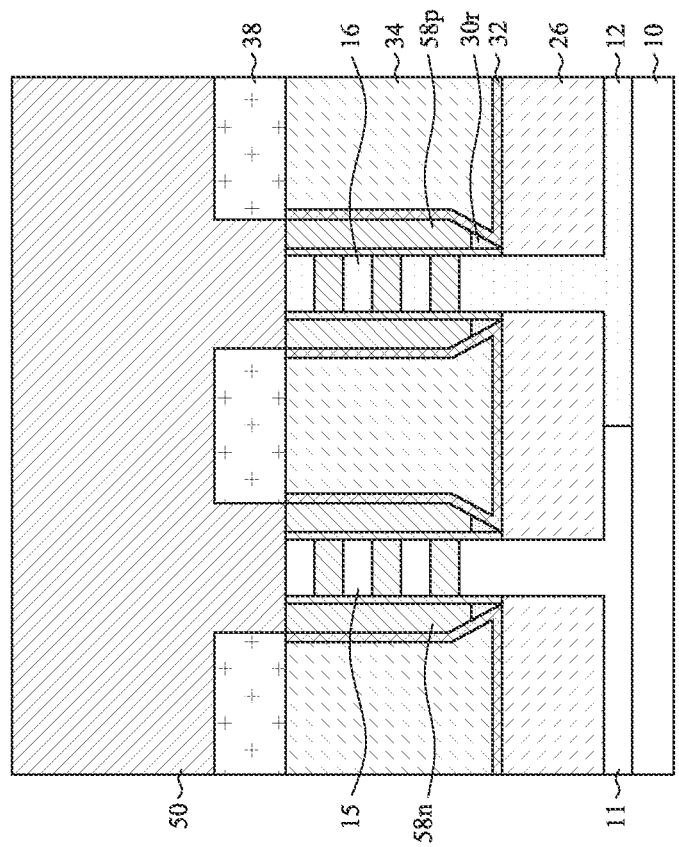
Figure 23A:
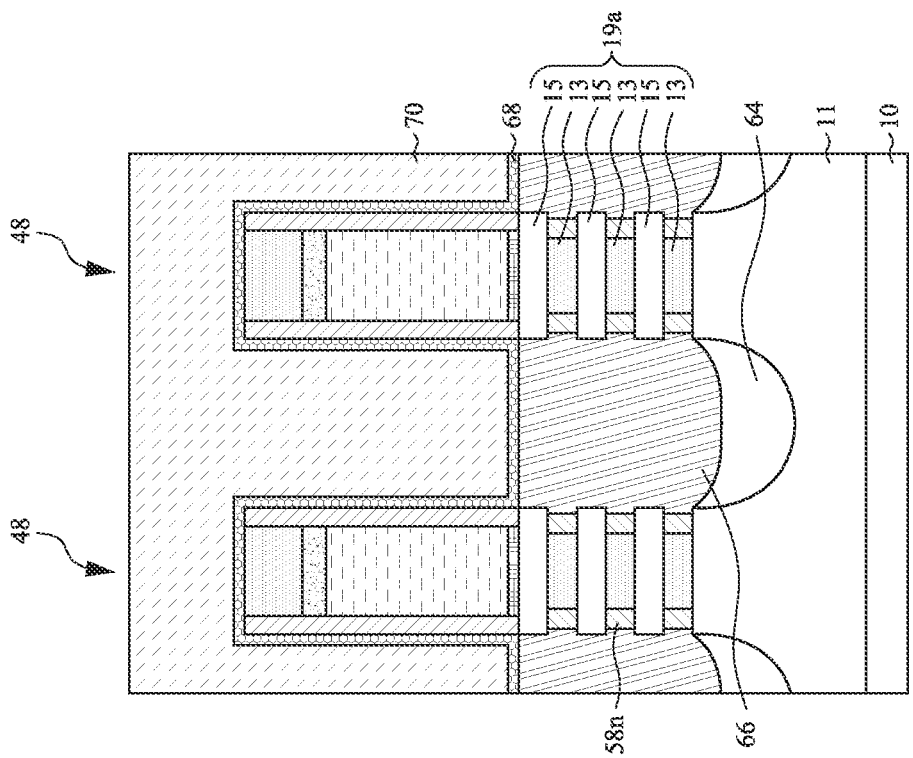
Figure 23B:
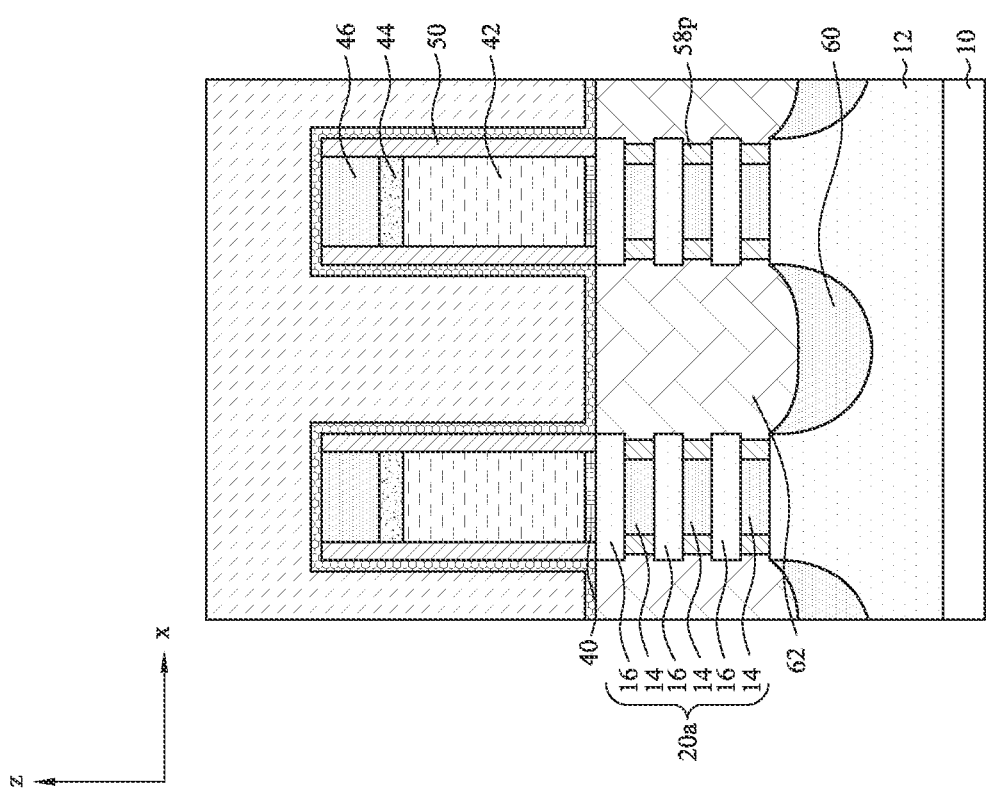
Figure 23D:
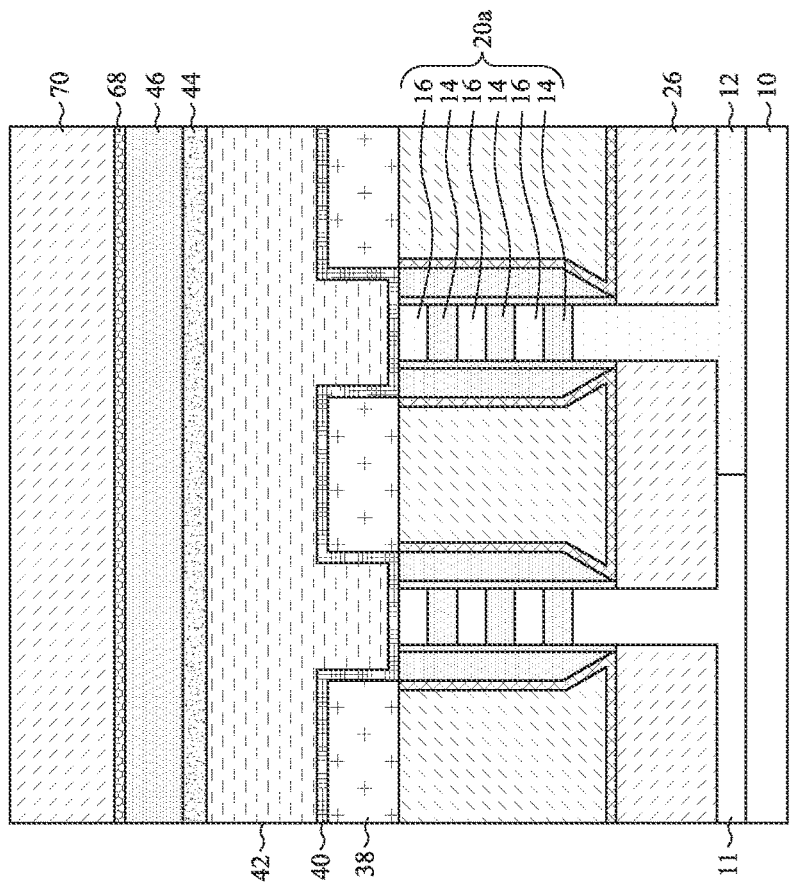
Figure 23C:
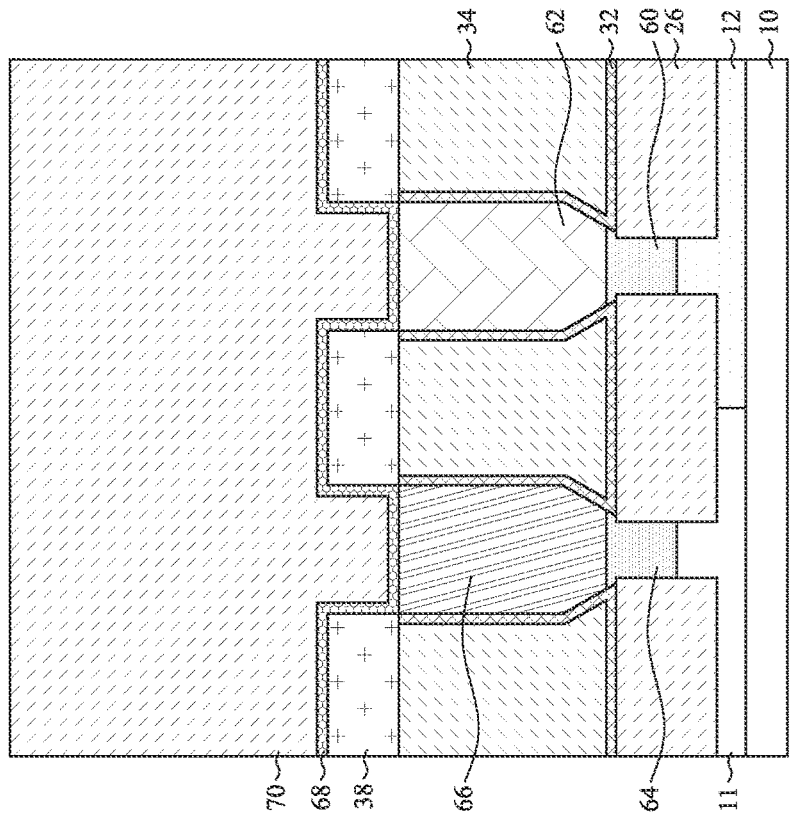
Figure 23E:
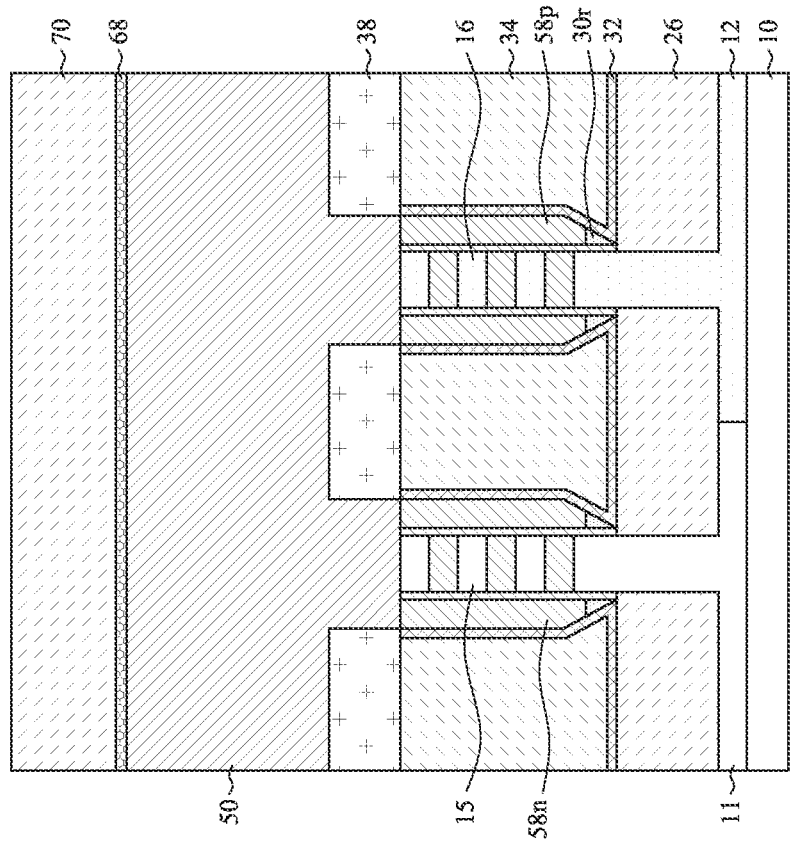
Figure 24D:
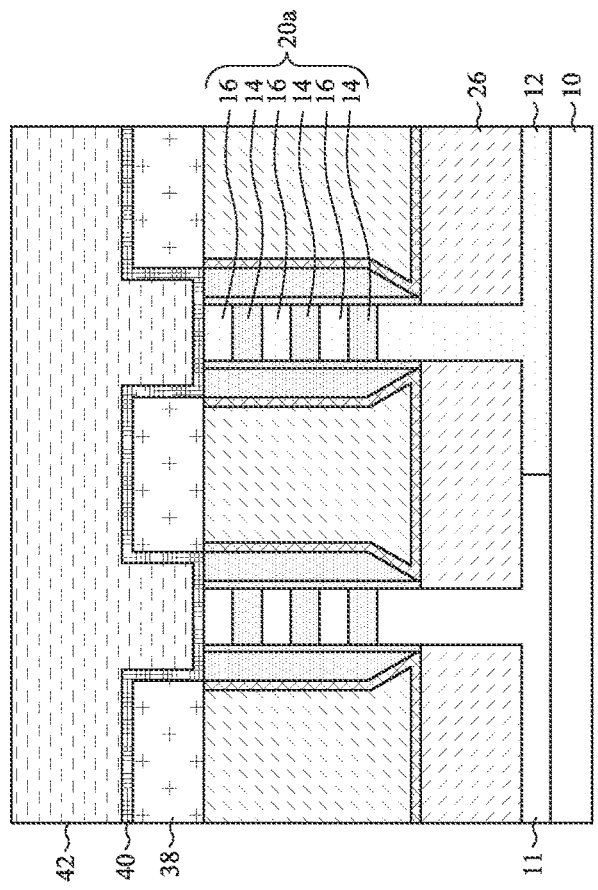
Figure 24C:
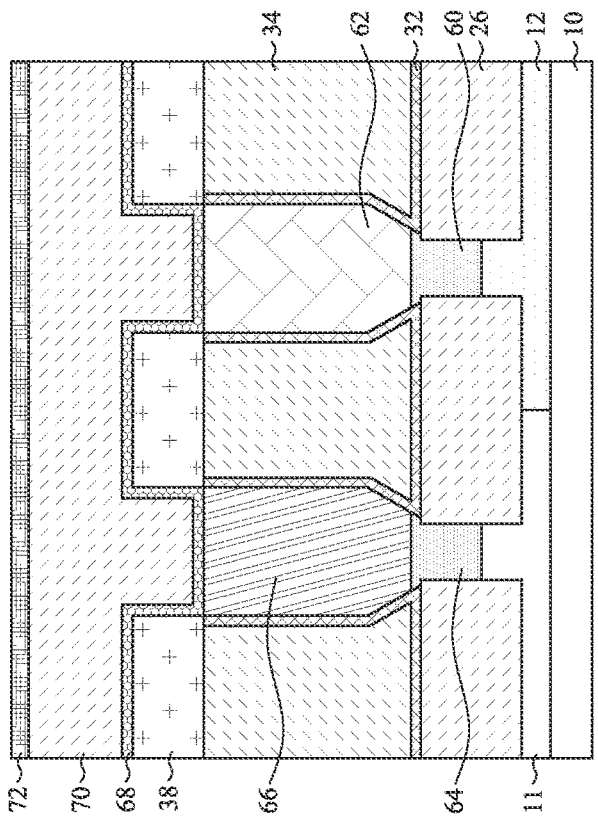
Figure 24E:
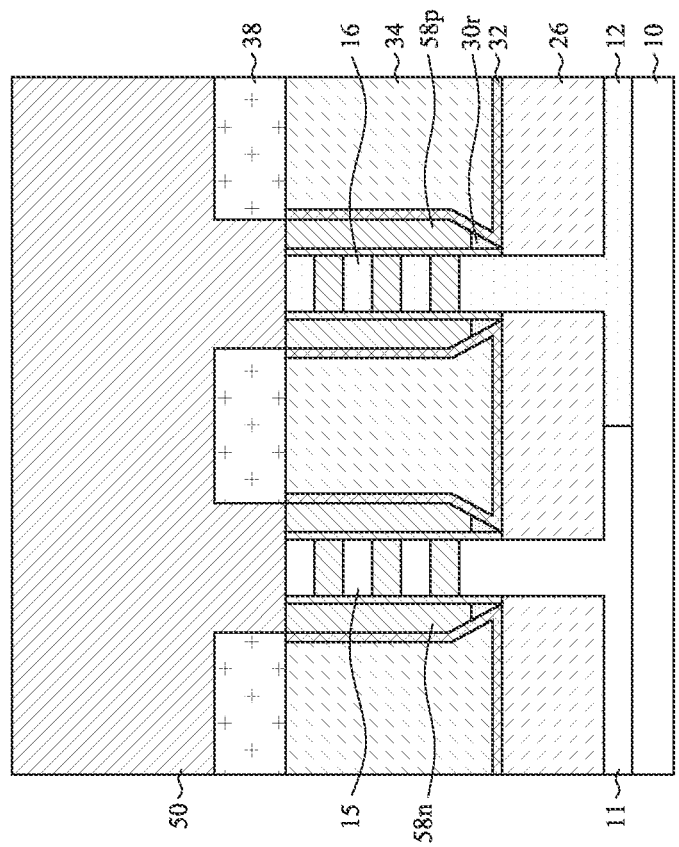
Figure 25B:
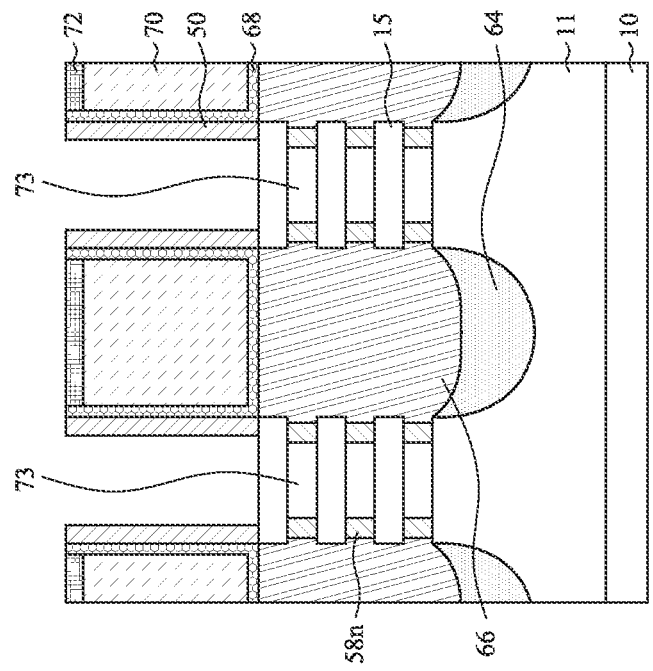
Figure 25A:
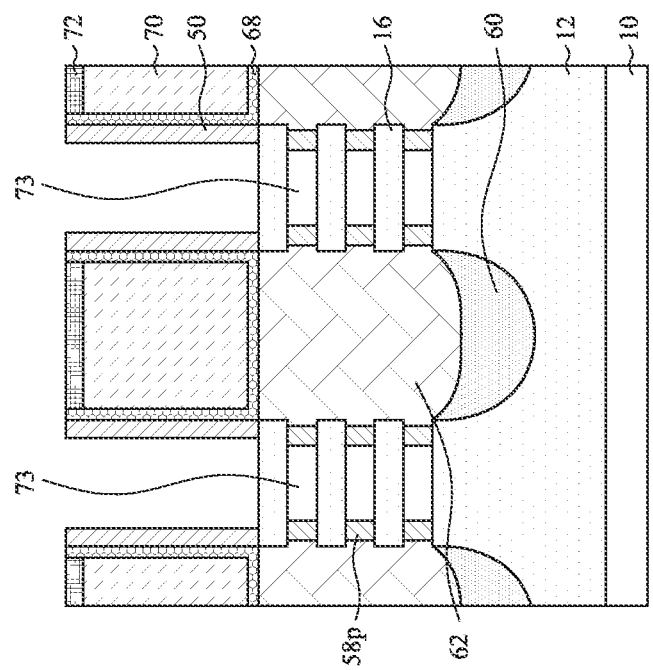
Figure 25C:
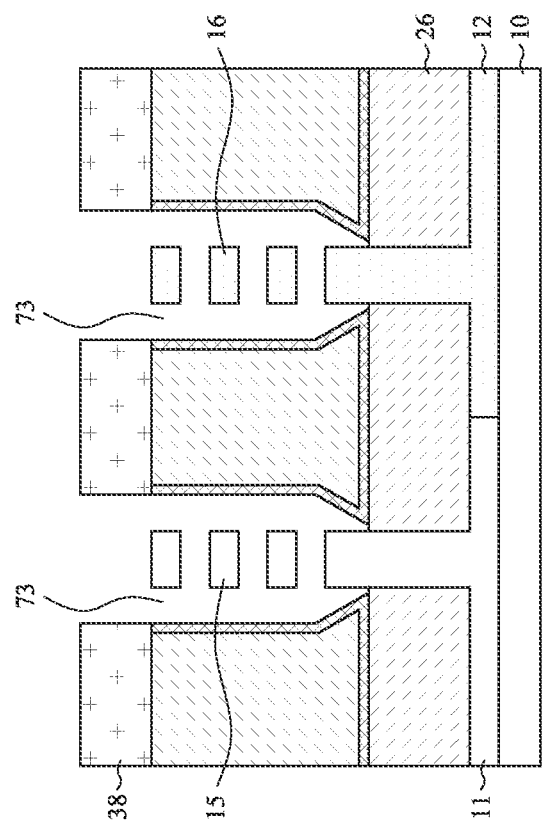
Figure 25D:
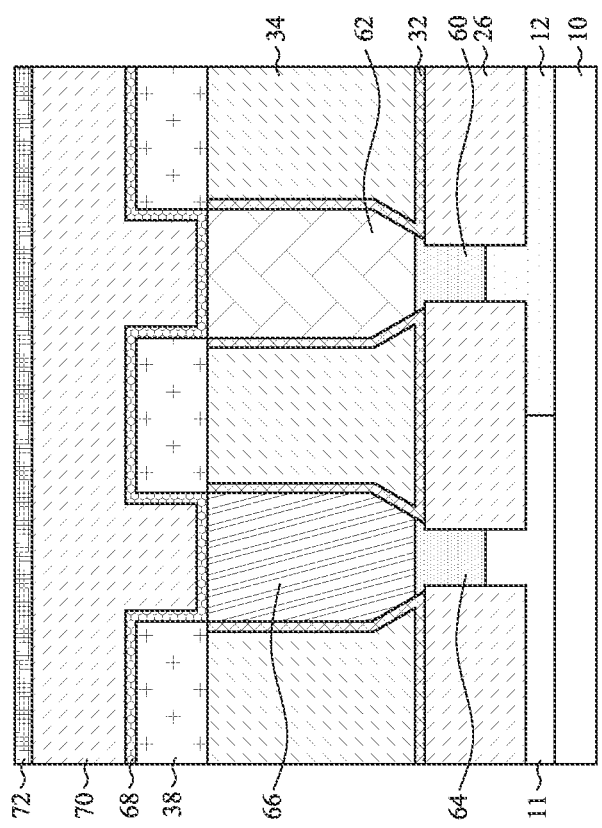
Figure 26B:
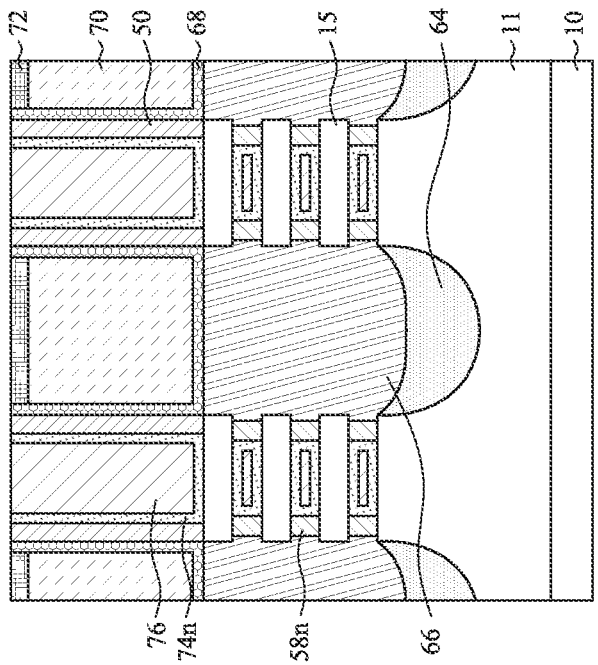
Figure 26A:
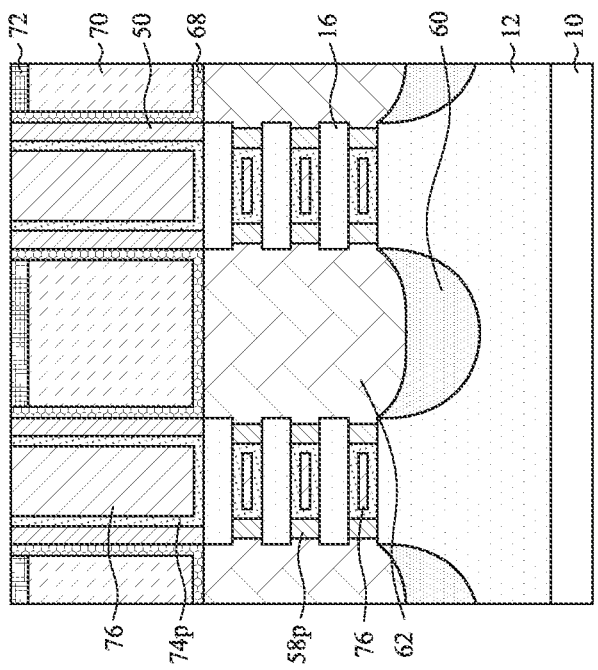
Figure 26D:
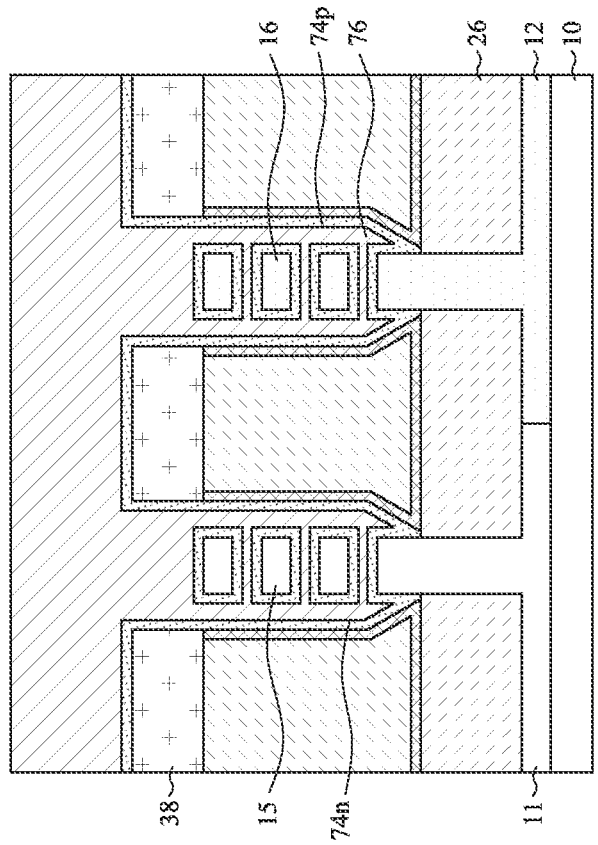
Figure 26C:
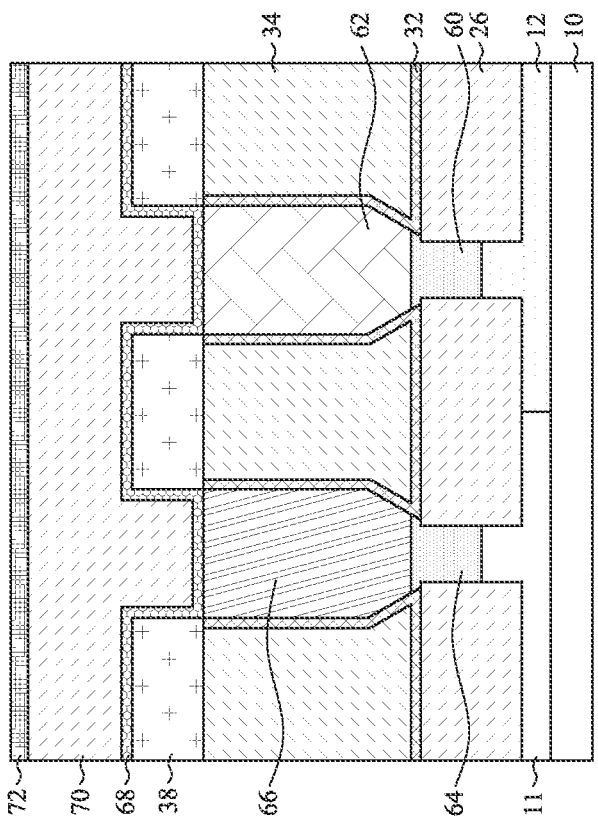

In operation 130, source/drain recesses 56n are formed over the p-well 11, on which n-type devices are to be formed, as shown in FIG. 18A-18E. A sacrificial liner 52' and a photoresist layer 54' are formed and patterned to expose regions over the p-well 11 for processing. The sacrificial liner 52' may be a dielectric layer used to protect regions not being processed. In some embodiment, the sacrificial liner 52' includes silicon nitride. The semiconductor fin 19 on opposite sides of the sacrificial gate structure 48 and the cladding layer 30 on the semiconductor fin 19 are etched forming source/drain recesses 56n between the neighboring hybrid fins 36 on either side of the sacrificial gate structure 48 as shown in FIGS. 18B and 18C. The cladding layer 30, the first semiconductor layers 13 and the second semiconductor layers 15 in the semiconductor fin 19 are etched down on both sides of the sacrificial gate structure 48 using etching operations. In some embodiments, suitable dry etching and/or wet etching may be used to remove the first semiconductor layers 13, the second semiconductor layer 15, and the p-well 11, together or separately.

In some embodiments, all layers in the active portion 19a of the semiconductor fins 19 and part of the well portion 19w of the semiconductor fin 19 are removed to form the source/drain recesses 56n. The well portion 19w of the semiconductor fin 19 is partially etched so that the source/ drain recesses 56n extend into the isolation layer 26, as shown in FIG. 18C. The source/drain recess 56n extends beyond the cladding layer 30.

In operation 132, exposed ends of the first semiconductor layers 13 and the cladding layers 30 are etched to form spacer cavities 58'c for inner spacers as shown in FIGS. 19A-19E. Prior to forming the spacer cavities 58'c, the photoresist layer 54' may be removed exposing the patterned sacrificial liner 52' to protect regions over the n-well 12.

The first semiconductor layers 13 and cladding layer 30 exposed to the source/drain recesses 56n are first etched horizontally along the X direction to form cavities. In some embodiments, the first semiconductor layers 13 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In some embodiments, the spacer cavities 58'c have dimensions similar to the dimensions of the spacer cavities 58c for the p-type device. The first semiconductor layer 13 and the cladding layer 30 are etched in a range between about 2 nm and about 10 nm along the X direction. The etching thickness of the cladding layer 30 at the facet region 30b gradually decreases.

In operation 134, inner spacers 58n are formed in the spacer cavities 58'c, as shown in FIGS. 20A-20E. After forming the spacer cavities 58'c by etching the first semiconductor layers 13 and the cladding layer 30, the inner spacers 58n are formed in the spacer cavities 58'c by conformally deposit and then partially remove an insulating layer.

The insulating layer can be formed by ALD or any other suitable method. The subsequent etch process removes most of the insulating layer except inside the cavities, resulting in the inner spacers 58n. In some embodiments, the second semiconductor layer 15 may extend from the inner spacers 58n. In some embodiments, the inner spacers 58n may include one of silicon nitride (SiN) and silicon oxide ($SiO_2$), SiONC, or a combination thereof.

The inner spacers 58n have dimensions similar to the inner spacers 58p for the p-type device. In some embodiments, the thickness of the inner spacers 58n in a range from about 4 nm to about 7 nm. In some embodiments, the second semiconductor layer 15 may extend from the inner spacers 58n in a range between 0 nm and about 3 nm. The thickness of the inner spacers 58n formed in the spacer cavities 58'c near the facet region 30b also gradually decreases to 0, similar to the inner spacers 58p shown in FIG. 25F.

In operation 136, epitaxial features 64 are formed in the source/drain recesses 56n as shown in FIGS. 21A-21E. In some embodiments, the epitaxial features 64 are formed by epitaxially grown from the exposed the well portion 19w of the semiconductor fin 19. The epitaxial feature 64 fills in the source/drain recess 56n in bottom up manner. An upper surface 64u of the epitaxial feature 64 reaches and in contact with the inner spacers 58n. In some embodiments, the upper surface 64u of the epitaxial feature 64 is at substantially the same level of an upper surface 11u of the p-well 11.

The epitaxial features 64 may be formed by CVD epitaxy, molecular beam epitaxy (MBE), or any suitable deposition technique. The epitaxial feature 64 may be formed from a semiconductor material with a different oxidation rate and/or a different etch rate than the cladding layer 30 and the first semiconductor layer 13 to allow the cladding layer 30 and the first semiconductor layer 13 to be selectively removed during replacement process. In some embodiments, the epitaxial features 64 include a un-doped or low doped epitaxial silicon. In other embodiments, the epitaxial features 64 are a undoped or substantially dopant-free silicon layer. In some embodiments, the epitaxial features 64 is a low doped epitaxial silicon with an n-type dopant at a dopant concentration in a range from 0 to about 5E17 atoms/$cm^3$. A dopant concentration greater than 5E17 atoms/$cm^3$ may induce current leakage in mesa devices.

In operation 138, epitaxial source/drain features 66 for p-type devices are formed in the source/drain recesses 56p, as shown in FIGS. 21A-21E. The epitaxial source/drain features 66 are formed over the epitaxial features 64 within the source/drain recesses 56n. The epitaxial source/drain features 66 are formed by an epitaxial growth method using CVD, ALD or molecular beam epitaxy (MBE). The epitaxial source/drain features 66 may include one or more layers of Si, SiP, SiC and SiCP for a n-type device, such as nFET. The epitaxial source/drain features 66 also include n-type dopants, such as phosphorus (P), arsenic (As), etc. In some embodiments, the epitaxial source/drain features 66 may have a dopant concentration of between about 5E18 atoms/$cm^3$ and about 1E20 atoms/$cm^3$.

After formation of the p-type epitaxial source/drain features 66, the sacrificial liner 52' is removed for replacement gate processing, as shown in FIGS. 22A-22E.

In operation 140, a contact etch stop layer (CESL) 68 and an interlayer dielectric (ILD) layer 70 are formed over the exposed surfaces as shown in FIGS. 23A-23E. The CESL 68 is formed on the epitaxial source/drain features 62, 66, the sidewall spacers 50, and the high-k features 38. In some embodiments, the CESL 68 has a thickness in a range between about 4 nm and about 7 nm. The CESL 68 may include $Si_3N_4$, SiON, SiCN or any other suitable material, and may be formed by CVD, PVD, or ALD.

The interlayer dielectric (ILD) layer 70 is formed over the contract etch stop layer (CESL) 68. The materials for the ILD layer 70 include compounds comprising Si, O, C, and/or H, such as silicon oxide, SiCOH and SiOC. Organic materials, such as polymers, may be used for the ILD layer 70. The ILD layer 70 protects the epitaxial source/drain features 62, 66 during the removal of the sacrificial gate structures 48.

In operation 142, a planarization operation, such as CMP, is performed to expose the sacrificial gate electrode layer 42 for subsequent removal of the sacrificial gate structures 48 as shown in FIG. 24A-24E. The planarization process removes portions of the ILD layer 70 and the CESL 68, the hard mask 46 and the pad layer 48 to expose to the sacrificial gate electrode layer 42. In some embodiments, the ILD layer 70 is recessed to a level below the top of the sacrificial gate electrode layer 42, and a cap layer 72 is formed on the recessed ILD layer 70. The cap layer 72 may be a nitrogen-containing layer, such as a SiCN layer. The cap layer 72 is used to protect the ILD layer 70 during replacement gate processes.

In operation 144, the sacrificial gate dielectric layer 40 and the sacrificial gate electrode layer 42 are removed as shown in FIGS. 25A-25F. The sacrificial gate electrode layer 42 can be removed using plasma dry etching and/or wet etching. When the sacrificial gate electrode layer 42 is polysilicon, a wet etchant such as a Tetramethylammonium hydroxide (TMAH) solution can be used to selectively remove the sacrificial gate electrode layer 42 without removing the dielectric materials of the cap layer 72 and the CESL 68.

After removal of the sacrificial gate electrode layer 42, the sacrificial gate dielectric layer 40 is exposed. An etch process may be performed to selectively remove the sacrificial gate dielectric layer 40 exposing the high-k features 38, the cladding layers 30 including the residual portion 30r under the inner spacers 58p, 58n, and the top layer of the second semiconductor layers 15 and the fourth semiconductor layers 16.

A suitable etch process is then performed to selective remove the cladding layers 30. The cladding layer 30 can be removed using plasma dry etching and/or wet etching. In some embodiments, an isotropic plasma etching with an etchant comprising fluorocarbons is used. In other embodiments, a suitable wet etch can be used to remove the cladding layer 30.

After removal of the cladding layers 30, the first semiconductor layers 13 and the third semiconductor layers 14 are exposed and subsequently removed resulting in gate cavities 73 having nanosheets of the second semiconductor layers 15 and the fourth semiconductor layers 16. The gate cavity 73 includes a cavity 30c vacated by the residual portion 30r of the cladding layer 30 under the inner spacers 58n, 58p. Replacement gate structures are to be formed in the gate cavities 73. In some embodiments, the first semiconductor layers 13 and the third semiconductor layers 14 can be removed during the same etch process for removal of the cladding layers 30. In other embodiments, the first semiconductor layers 13 and the third semiconductor layers 14 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution.

During the etch processes to remove the cladding layers 30, the first semiconductor layers 13, and the third semiconductor layers 14, the epitaxial features 60 and 64 are disposed between the epitaxial source/drain features 62, 66 and the etchant in the gate cavities 73 preventing damage to the epitaxial source/drain features 62, 66 during the etch processes.

FIG. 25F is a partial perspective view of the semiconductor fin 20 after removal of the cladding layer 30 and the third semiconductor layers 14. As shown in FIG. 25F, the inner spacers 58p has a reduced thickness near the well portion 20w of the semiconductor fin 20. A portion of the epitaxial feature 60 is exposed to the gate cavity 73 through the cavity 30c without the barrier of the inner spacers 58. Source/drain features, such as the epitaxial source/drain features 62, 66, may be made of material susceptible to the etchant for removal of the cladding layer 30, the first semiconductor layers 13, and the third semiconductor layers 14, and may be damaged if formed in place of the epitaxial features 60.

Because the epitaxial feature 60 is formed from a material that has an etch selectivity relative to the materials of the cladding layer 30, the first semiconductor layer 13, and the third semiconductor layer 14, the epitaxial feature 60 remains intact during the removal process. The epitaxial features 60, 64, thus, provide protection to the epitaxial source/drain features 62, 66 during the etch process.

In operation 146, gate dielectric layers 74n, 74p, and gate electrode layer 76 are formed in the gate cavities 73 as shown in FIGS. 26A-26F. The gate dielectric layer 74 (74n, 74p) and the gate electrode layer 76 may be referred to as a replacement gate structure.

The gate dielectric layers 74n, 74p are formed on exposed surfaces in the gate cavities 73. The gate dielectric layers 74n, 74p may have different composition and dimensions. In some embodiments, the gate dielectric layers 74n and 74p include different materials and are formed separately using patterned mask layers and different deposition recipes.

FIG. 26F is a partial perspective view of the semiconductor fin 20 after deposition of the gate dielectric layers 74n, 74p, and the gate electrode layer 76. Because the reduced thickness of the inner spacers 58n, 58p near the well portions 20w, 19w may also cause the epitaxial features 64, 60 to be exposed to the gate cavities 73, gate dielectric layers 74n, 74p may also form on portions of the epitaxial features 64, 60 that is exposed to the gate cavities 73, as shown in FIG. 26F.

The gate dielectric layer 74p is formed on exposed surfaces of each nanosheet of the fourth semiconductor layer 16, exposed surfaces of the inner spacer 58p, exposed surfaces of the sidewall spacer 50, and exposed surfaces of the epitaxial feature 62. The gate dielectric layer 74p may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layer 74n is formed on exposed surfaces of each nanosheet of the second semiconductor layer 15, exposed surfaces of the inner spacer 58n, exposed surfaces of the sidewall spacer 50, and exposed surfaces of the epitaxial feature 64. The gate dielectric layer 74n may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate dielectric layers 74n, 74p may be formed by CVD, ALD or any suitable method. In one embodiment, the gate layers 74n, 74p are formed using a highly conformal deposition process such as ALD in order to ensure the formation of the gate dielectric layers 74n, 74p having a uniform thickness around each of the semiconductor layers 15, 16. In some embodiments, the thickness of the gate dielectric layers 74n, 74p is in a range between about 1 nm and about 6 nm.

In some embodiments, an interfacial layer (not shown) is formed between the semiconductor layers 15, 16 and the gate dielectric layers 74n, 74p, respectively. The gate electrode layer 76 is formed on the gate dielectric layers 74n, 74p to fill the gate cavities 73. The gate electrode layer 76 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 76 may be formed by CVD, ALD, electro-plating, or other suitable method. After the formation of the gate electrode layer 76, a planarization process, such as a CMP process, is performed to remove excess deposition of the gate electrode material and expose the top surface of the ILD layer 70.

FIG. 26F is a partial perspective view of the semiconductor fin 20 after removal of the cladding layer 30 and the third semiconductor layers 14. As discussed above, the gate dielectric layers 74p, 74n may be in contact with the epitaxial features 60, 64 because the reduced thickness of the inner spacers 58p, 58n near the well portions 19w, 20w of the semiconductor fins 19, 20. The well portions 19w, 20w, epitaxial source/drain features 62, 66 in contact with the well portions 19w, 20w, the gate dielectric layers 74p, 74n in contact with the portions 19w, 20w, and the gate electrode layer 76 form a transistor, commonly known as the mesa device. In the mesa device according to the present disclosure, the epitaxial features 60, 64 are positioned between the epitaxial source/drain features 62, 66 and the gate dielectric layers 74p, 74n in contact with the portions 19w, 20w, preventing direct contact from between the epitaxial source/drain features 62, 66 and the gate dielectric layers 74p, 74n, thus preventing current leakage in the mesa device.

Figure 27A:
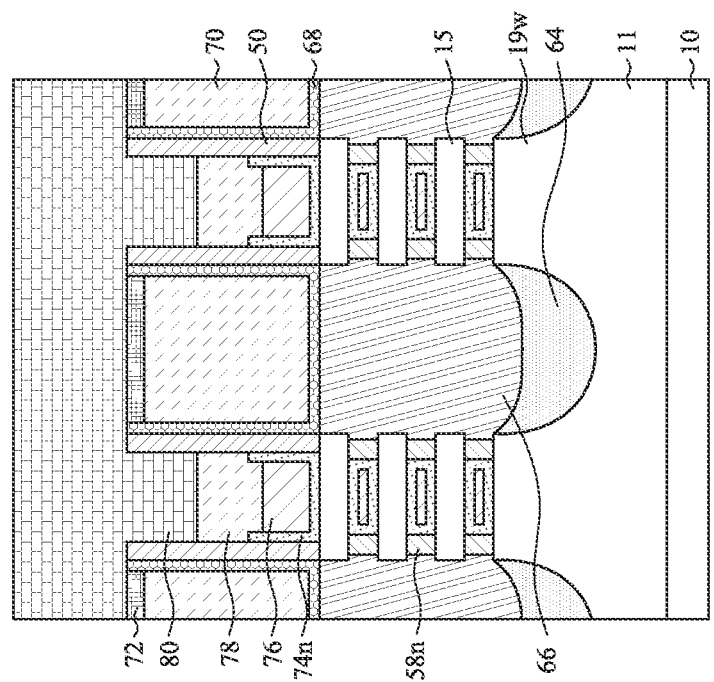
Figure 27B:
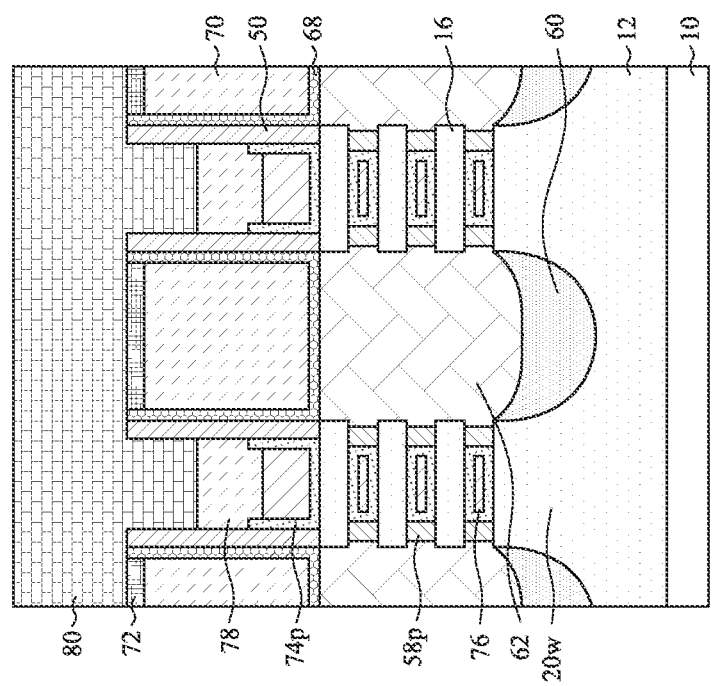
Figure 27D:
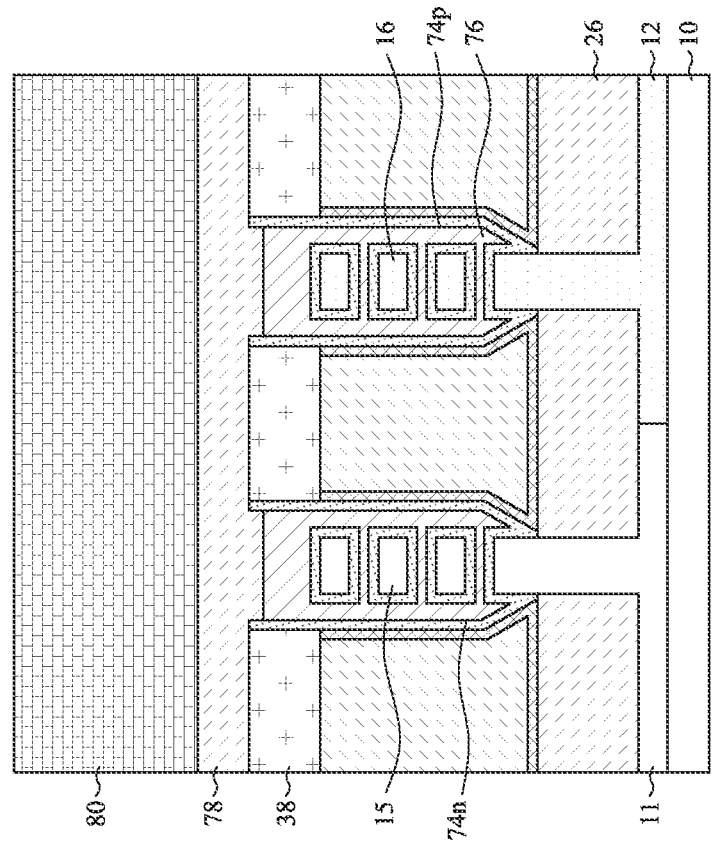
Figure 27C:
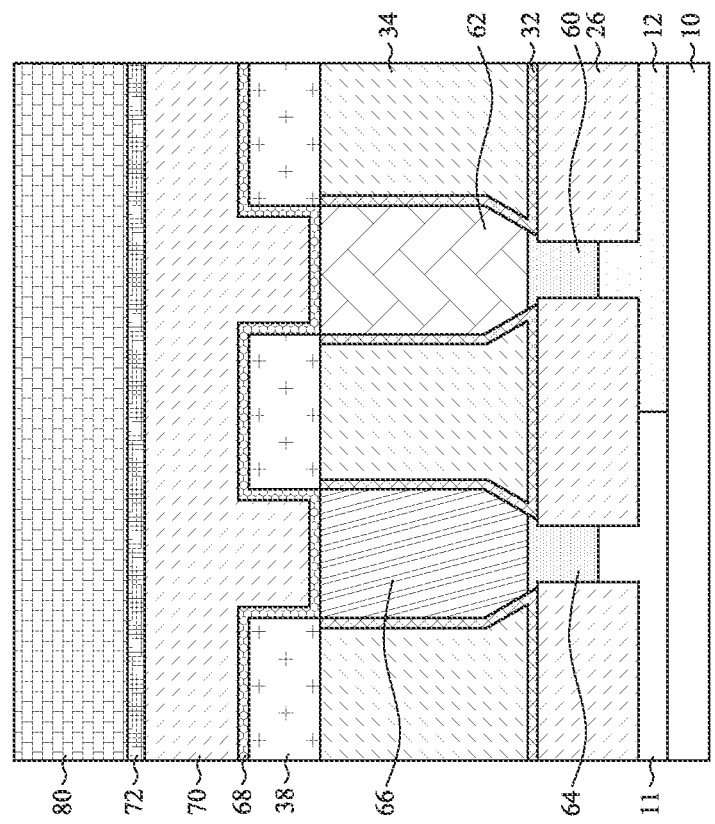
Figure 27E:
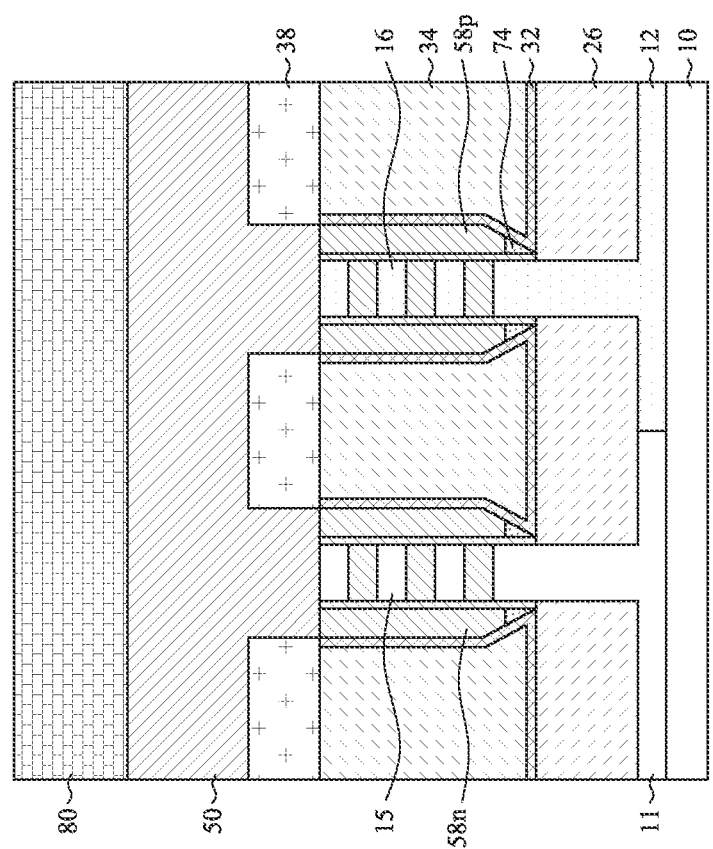
Figure 28A:
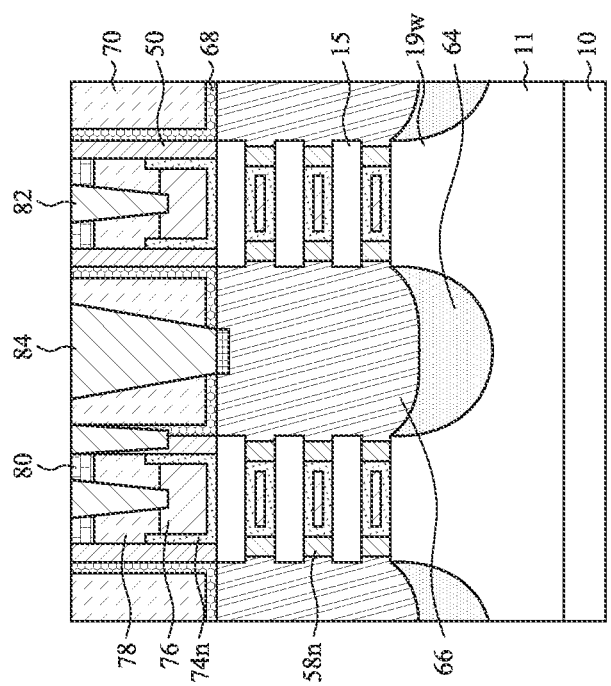
Figure 28B:
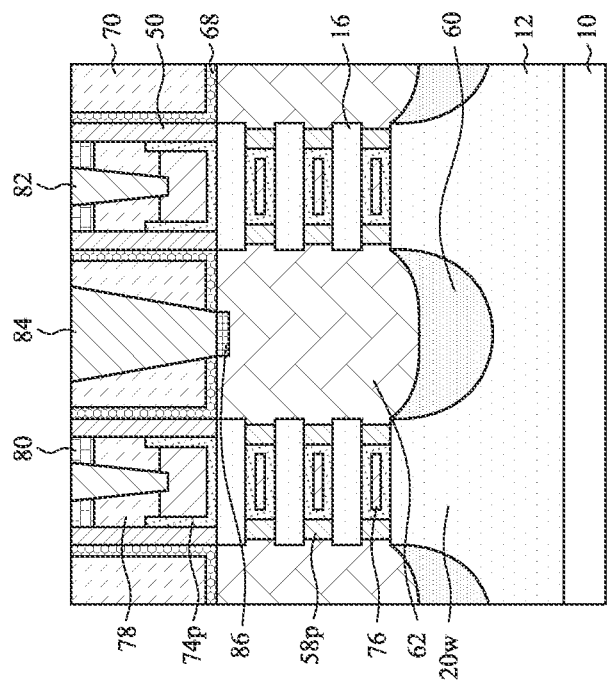
Figure 28C:
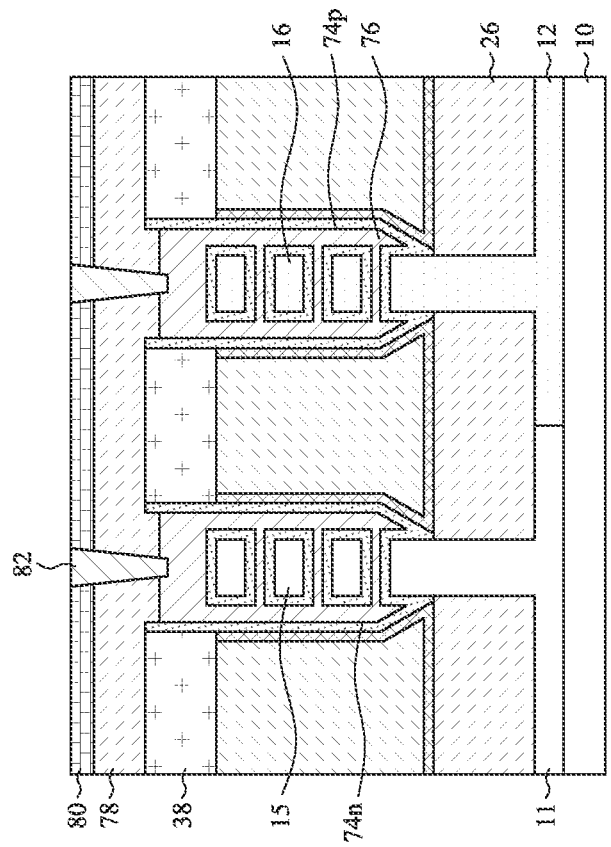
Figure 28D:
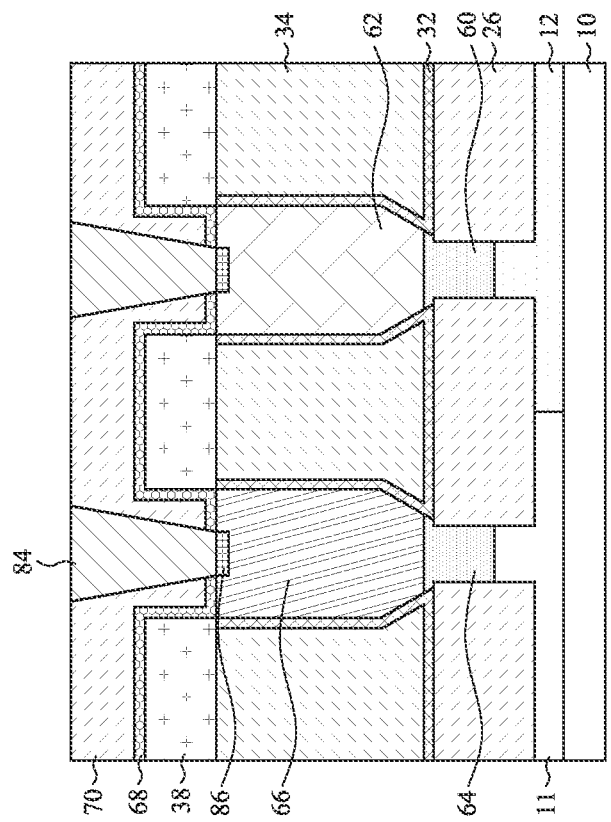
Figure 28E:
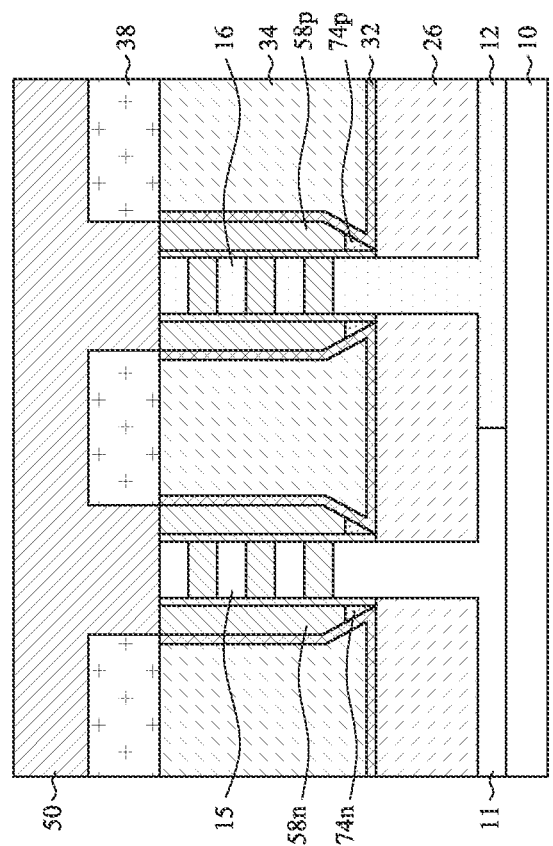

In operation 148, a self-aligned contact layer 78 and a hard mask layer 80 are formed over the gate electrode layer 76 as shown in FIGS. 27A-27E. After the CMP process in operation 146, the gate electrode layer 76 are recessed. In some embodiments, the gate electrode layer 76 is recessed to a level below a top surface the high-k features 38 as shown in FIG. 27D. The high-k features 38 divide the gate electrode layer 76 into segments connected to different transistors. The gate electrode layer 76 may be recessed using any suitable process, such as a dry etch, a wet etch, or a combination thereof. In some embodiments, the recess process may be a selective dry etch process that does not substantially affect the cap layer 72, the sidewall spacer 50, and the gate dielectric layers 74n, 74p.

After recess of the gate electrode layer 76, the self-aligned contact layer 78 is formed over the gate dielectric layers 74n, 74p, and the gate electrode layer 76 between the sidewall spacers 50. The self-aligned contact layer 78 may be formed by a blanket deposition process, followed by a CMP process to the level of the sidewall spacers 50 to remove excessive materials over the sidewall spacers 50, then selectively recessed to form trenches between the sidewall spacers 50 and above the self-aligned contact layer 78. The self-aligned contact layer 78 may be a dielectric material having an etch selectively relative to the sidewall spacers 50. In some embodiments, the self-aligned contact layer 78 includes silicon nitride. The self-aligned contact layer 78 can be used to define self-aligned contact region and thus referred to as SAC structures or a SAC layer.

The hard mask layer 80 is then formed over the dielectric cap layer 78. The hard mask layer 80 includes dielectric material such as, Si, SiO, SiN, AlO, or combinations thereof. The hard mask layer 80 may include a material which is different from the sidewall spacers 50, the CESL 68, the ILD layer 70, and/or the cap layer 72 to achieve etching selectivity during etching processes performed later. As shown in FIGS. 27A and 27B, the self-aligned contact layer 78 is in contact with the gate electrode layer 76, the gate dielectric layer 74n, 74p, and the hard mask layer 80 and between the sidewall spacers 50.

In operation 150, gate contacts 82 and source/drain contacts 84 are formed as shown in FIGS. 28A-28E. After formation of the hard mark layer 80, a planarization process is performed to polish back the hard mask layer 80 until the sidewall spacers 50, the CESL 68, and the ILD layer 70 are exposed. Contact hole may be formed by any suitable process in the hard mask layer 80 and the self-aligned contact layer 78. Subsequently, a conductive material layer fills in the contact holes to form the gate contacts 82. Similarly, contact holes may be formed through the ILD layer 70 and the CESL 68 and subsequently filled with a conductive material to form the source/drain contacts 84. Suitable photolithographic and etching techniques are used to form the contact holes through various layers.

After the formation of the contact holes, a silicide layer 86 is selectively formed over an exposed top surface of the epitaxial source/drain features 62, 66 exposed by the contact holes. The silicide layer 86 conductively couples the epitaxial source/drain features 62, 66 to the subsequently formed interconnect structures. The silicide layer 86 may be formed by depositing a metal source layer to cover exposed surfaces including the exposed surfaces of the epitaxial source/drain features 62, 66 and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed, for example, a rapid anneal a rapid anneal at a temperature between about 700° C. and about 900° C. During the rapid anneal process, the portion of the metal source layer over the epitaxial source/drain features 62, 66 reacts with silicon in the epitaxial source/drain features 62, 66 to form the silicide layer 86. Unreacted portion of the metal source layer is then removed. In some embodiments, the silicide layer 86 includes one or more of WSi, CoSi, NiSi, TiSi, MoSi, and TaSi. In some embodiments, the silicide layer 86 has a thickness in a range between about 3 nm and 10 nm.

After formation of the silicide layer 86, a conductive material is deposited to fill contact holes and form the gate contacts 82 and the source/drain contacts 84. In some embodiments, the conductive material layer for the gate contact may be formed by CVD, PVD, plating, ALD, or other suitable technique. In some embodiments, the conductive material for the gate contacts 82 and source/drain contacts 84 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the hard mask layer 80.

Various embodiments or examples described herein offer multiple advantages over the state-of-art technology. According to embodiments of the present disclosure, a non-doping or low-doping epitaxial layer is formed before forming the source/drain features. The non-doping or low-doping epitaxial layer protects the source/drain features from damage during replacement gate process, and also prevents leakage current in the mesa device.

It will be understood that not all advantages have been necessarily discussed herein, no particular advantage is required for all embodiments or examples, and other embodiments or examples may offer different advantages.

Some embodiments of the present provide a semiconductor device. The semiconductor device includes a first epitaxial feature, wherein the first epitaxial feature comprises a dopant of a first concentration, a first source/drain feature in contact with the first epitaxial feature, wherein the first source/drain feature comprises the dopant of a second concentration, and the second concentration is higher than the first concentration, a semiconductor channel in contact with the first source/drain feature and the first epitaxial feature, an inner spacer in contact with the first source/drain feature and the first epitaxial feature, and a gate structure, wherein the gate structure is in contact with the inner spacer and a portion of the first epitaxial feature.

Some embodiments of the present disclosure provide a semiconductor device. The semiconductor device includes a semiconductor fin extending from a substrate, one or more semiconductor channels disposed over the semiconductor fin, a gate dielectric layer formed over the semiconductor fin and around each of the one or more semiconductor channels, a first source/drain feature, a second source/drain feature, wherein the first and second source/drain features are connected to the one or more semiconductor channels on opposite ends of each of the one or more semiconductor channels, a first inner spacer formed between the gate dielectric layer and the first source/drain feature, a second inner spacer formed between the gate dielectric layer and the second source/drain feature, wherein the first and second inner spacers are formed against the gate dielectric layer, a first epitaxial feature, and a second epitaxial feature, wherein the first and second epitaxial features contact the semiconductor fin on opposite ends of semiconductor fin, the first epitaxial feature is in contact with the first source/drain feature and the first inner spacer, and the second epitaxial feature is in contact with the second source/drain feature and the second inner spacer.

Some embodiments of the present disclosure provide a method for forming a semiconductor device. The method includes forming a semiconductor fin, forming cladding layers on sides of the semiconductor fin, forming a sacrificial gate structure over the semiconductor fin, etching the semiconductor fin to form two source/drain recesses on opposite sides of the sacrificial gate structure, forming inner spacers over exposed surfaces of the semiconductor fin under the sacrificial gate structure, forming an epitaxial feature in each of the source/drain recesses, wherein an upper surface of the epitaxial feature contacts the inner spacer in the corresponding source/drain recess, and forming a source/drain feature on the epitaxial feature in the corresponding source/drain recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
forming a semiconductor fin;
forming a shallow trench isolation layer on a lower portion of the semiconductor fin;
forming cladding layers on sides of the semiconductor fin above the shallow trench isolation layer;
forming a sacrificial gate structure over the semiconductor fin;
etching the semiconductor fin to form two source/drain recesses on opposite sides of the sacrificial gate structure;
forming inner spacers over exposed surfaces of the semiconductor fin under the sacrificial gate structure;
forming an epitaxial feature in each of the source/drain recesses, wherein an upper surface of the epitaxial feature contacts the inner spacer in the corresponding source/drain recess; and
forming a source/drain feature on the epitaxial feature in the corresponding source/drain recess.

2. The method of claim 1, wherein forming the epitaxial feature comprises epitaxially forming a silicon layer in a bottom up manner.

3. The method of claim 2, wherein forming the epitaxial feature further comprises doping the silicon layer with a dopant at a first concentration.

4. The method of claim 3, wherein forming the source/drain feature comprises doping the source/drain feature with the dopant of a second concentration, and the second concentration is higher than the first concentration.

5. The method of claim 1, further comprising etching a portion of the cladding layer under the sacrificial gate structure to form spacer cavities for the inner spacers, and the inner spacers are formed in the spacer cavities.

6. The method of claim 5, further comprising:
removing cladding layer under the sacrificial gate structure to form a gate cavity; and
forming a gate dielectric layer on surfaces exposed to the gate cavity.

7. The method of claim 6, wherein the gate dielectric layer is in contact with the inner spacer and a portion of the first epitaxial feature.

8. The method of claim 1, wherein a thickness of the inner spacers gradually decreases.

9. The method of claim 4, wherein the first concentration is an intrinsic concentration of the dopant.

10. A method for forming a semiconductor device, comprising:
forming a semiconductor fin;
forming cladding layers on sides of the semiconductor fin;
forming a sacrificial gate structure over the semiconductor fin;
etching the semiconductor fin to form two source/drain recesses on opposite sides of the sacrificial gate structure;
selectively etching back the cladding layers to form spacer cavities from the two source/drain recesses;
forming inner spacers in the spacer cavities, wherein a thickness of the inner spacers gradually decreases;
forming an epitaxial feature in each of the source/drain recesses, wherein an upper surface of the epitaxial feature contacts the inner spacer in the corresponding source/drain recess; and
forming a source/drain feature on the epitaxial feature in the corresponding source/drain recess.

11. The method of claim 10, wherein forming the epitaxial feature further comprises doping a silicon layer with a dopant at a first concentration, and forming the source/drain feature comprises doping the source/drain feature with the dopant of a second concentration, and the second concentration is higher than the first concentration.

12. The method for claim 10, wherein forming the semiconductor fin comprises:
forming a semiconductor stack on a substrate by alternately depositing two or more first semiconductor layers and two or more semiconductor layers over the substrate; and
etching the semiconductor stack and the substrate to form the semiconductor fin.

13. The method of claim 12, wherein forming the spacer cavities comprises etching back the first semiconductor layers, and the inner spacers surrounds end portions of the second semiconductor layers.

14. The method of claim 13, wherein the upper surface of the epitaxial feature is below a lower most of the second semiconductor layers.

15. A method for forming a semiconductor device, comprising:
- forming a semiconductor fin extending from a substrate, wherein the semiconductor fin comprises a well portion extending from the substrate, and one or more semiconductor channels and one or more sacrificial semiconductor layers disposed over the well portion;
- forming cladding layers on sides of the semiconductor fin;
- forming a sacrificial gate structure over the semiconductor fin and the cladding layers;
- etching back the semiconductor fin and the cladding layers to form a source/drain recess;
- selectively etching back the cladding layers and the one or more sacrificial semiconductor layers from the source/drain recess to form a spacer cavity;
- forming an inner spacer in the spacer cavity over exposed surfaces of the cladding layers and the one or more sacrificial semiconductor layers, wherein a thickness of the inner spacer gradually decreases near the well portion;
- forming an epitaxial feature in the source/drain recess, wherein an upper surface of the epitaxial feature is at substantially the same level of an upper surface of the well portion; and
- forming a source/drain feature on the epitaxial feature in the corresponding source/drain recess.

16. The method of claim 15, further comprising:
- removing the sacrificial gate structure, the cladding layers and two or more sacrificial semiconductor layers;
- depositing a gate dielectric layer over the well portion and around each of the one or more semiconductor channels, wherein the gate dielectric layer is in contact with a portion of the epitaxial feature.

17. The method of claim 16, wherein the first epitaxial feature comprises an epitaxially formed silicon layer having a first dopant at a first concentration.

18. The method of claim 17, wherein the source/drain feature comprises a second dopant at a second concentration.

19. The method of claim 18, wherein the first and second dopants are of the same type, and the second concentration is higher than the first concentration.

20. The method of claim 16, wherein an interface between the epitaxial feature and the source/drain feature extends across the source/drain feature and intersects the inner spacer.

* * * * *